(12) United States Patent
Yamazaki et al.

(10) Patent No.: US 9,705,005 B2
(45) Date of Patent: Jul. 11, 2017

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Jun Koyama, Sagamihara (JP); Kiyoshi Kato, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/828,669

(22) Filed: Aug. 18, 2015

(65) Prior Publication Data
US 2015/0364606 A1  Dec. 17, 2015

Related U.S. Application Data

(63) Continuation of application No. 14/451,671, filed on Aug. 5, 2014, now Pat. No. 9,135,958, which is a
(Continued)

(30) Foreign Application Priority Data

Nov. 20, 2009 (JP) ................................. 2009-264623

(51) Int. Cl.
*H01L 29/66* (2006.01)
*H01L 29/786* (2006.01)
(Continued)

(52) U.S. Cl.
CPC ............ *H01L 29/7869* (2013.01); *G11C 5/06* (2013.01); *G11C 5/147* (2013.01); *G11C 7/12* (2013.01);
(Continued)

(58) Field of Classification Search
CPC ......... H01L 21/02565; H01L 21/02554; H01L 29/7869; H01L 27/1156; H01L 27/11551
(Continued)

(56) References Cited

U.S. PATENT DOCUMENTS 4,466,081 A  8/1984  Masuoka
5,349,366 A  9/1994  Yamazaki et al.
(Continued)

FOREIGN PATENT DOCUMENTS

EP  0663697 A  7/1995
EP  0686982 A  12/1995
(Continued)

OTHER PUBLICATIONS

Atwood .B et al., "SESO Memory: A CMOS compatible high density embedded memory technology for mobile applications", 2002 Symposium on VLSI Circuits Digest of Technical Papers, Jun. 13, 2002, pp. 154-155.
(Continued)

*Primary Examiner* — Long K Tran
(74) *Attorney, Agent, or Firm* — Robinson Intellectual Property Law Office; Eric J. Robinson

(57) ABSTRACT

An object of the present invention is to provide a semiconductor device combining transistors integrating on a same substrate transistors including an oxide semiconductor in their channel formation region and transistors including non-oxide semiconductor in their channel formation region. An application of the present invention is to realize substantially non-volatile semiconductor memories which do not require specific erasing operation and do not suffer from damages due to repeated writing operation. Furthermore, the semiconductor device is well adapted to store multivalued (Continued)

data. Manufacturing methods, application circuits and driving/reading methods are explained in details in the description.

31 Claims, 37 Drawing Sheets

Related U.S. Application Data continuation of application No. 14/059,475, filed on Oct. 22, 2013, now Pat. No. 8,804,396, which is a continuation of application No. 13/680,378, filed on Nov. 19, 2012, now Pat. No. 8,619,454, which is a continuation of application No. 12/947,846, filed on Nov. 17, 2010, now Pat. No. 8,339,828.

(51) Int. Cl.
| | | |
|---|---|---|
| G11C 16/04 | (2006.01) | |
| G11C 16/28 | (2006.01) | |
| H01L 21/02 | (2006.01) | |
| H01L 27/06 | (2006.01) | |
| H01L 27/105 | (2006.01) | |
| H01L 27/108 | (2006.01) | |
| H01L 27/11551 | (2017.01) | |
| H01L 27/1156 | (2017.01) | |
| H01L 27/12 | (2006.01) | |
| G11C 11/24 | (2006.01) | |
| H01L 29/26 | (2006.01) | |
| H01L 29/22 | (2006.01) | |
| G11C 5/06 | (2006.01) | |
| G11C 5/14 | (2006.01) | |
| G11C 7/12 | (2006.01) | |
| H01L 23/528 | (2006.01) | |
| H01L 29/24 | (2006.01) | |
| H01L 29/78 | (2006.01) | |
| H01L 27/115 | (2017.01) | |
| G11C 7/18 | (2006.01) | |
| G11C 11/4097 | (2006.01) | |

(52) U.S. Cl.
CPC .......... *G11C 11/24* (2013.01); *G11C 16/0433* (2013.01); *G11C 16/28* (2013.01); *H01L 21/02554* (2013.01); *H01L 21/02565* (2013.01); *H01L 21/02631* (2013.01); *H01L 23/528* (2013.01); *H01L 27/0688* (2013.01); *H01L 27/105* (2013.01); *H01L 27/108* (2013.01); *H01L 27/1156* (2013.01); *H01L 27/11551* (2013.01); *H01L 27/1207* (2013.01); *H01L 27/1225* (2013.01); *H01L 29/22* (2013.01); *H01L 29/24* (2013.01); *H01L 29/26* (2013.01); *H01L 29/78* (2013.01); *H01L 29/78603* (2013.01); *G11C 7/18* (2013.01); *G11C 11/4097* (2013.01); *H01L 27/115* (2013.01); *H01L 2924/0002* (2013.01)

(58) Field of Classification Search
USPC .......... 257/59, 365, 206, 274, 338, 351, 369
See application file for complete search history.

(56) References Cited

U.S. PATENT DOCUMENTS

| | | |
|---|---|---|
| 5,366,922 A | 11/1994 | Aoki et al. |
| 5,550,775 A | 8/1996 | Abe et al. |
| 5,622,653 A | 4/1997 | Orita et al. |
| 5,681,671 A | 10/1997 | Orita et al. |
| 5,731,856 A | 3/1998 | Kim et al. |
| 5,744,864 A | 4/1998 | Cillessen et al. |
| 5,796,650 A | 8/1998 | Wik et al. |
| 5,815,436 A | 9/1998 | Tanaka et al. |
| 5,843,341 A | 12/1998 | Orita et al. |
| 5,851,866 A | 12/1998 | Son |
| 5,936,881 A | 8/1999 | Kawashima et al. |
| 5,955,178 A | 9/1999 | Orita et al. |
| 6,127,702 A | 10/2000 | Yamazaki et al. |
| 6,180,957 B1 | 1/2001 | Miyasaka et al. |
| 6,266,269 B1 | 7/2001 | Karp et al. |
| 6,294,274 B1 | 9/2001 | Kawazoe et al. |
| 6,353,553 B1 | 3/2002 | Tamada et al. |
| 6,445,026 B1 | 9/2002 | Kubota et al. |
| 6,515,511 B2 | 2/2003 | Sugibayashi et al. |
| 6,563,174 B2 | 5/2003 | Kawasaki et al. |
| 6,570,206 B1 | 5/2003 | Sakata et al. |
| 6,577,530 B2 | 6/2003 | Muranaka et al. |
| 6,628,551 B2 | 9/2003 | Jain |
| 6,727,522 B1 | 4/2004 | Kawasaki et al. |
| 6,762,445 B2 | 7/2004 | Ogawa et al. |
| 6,765,825 B1 | 7/2004 | Scott |
| 6,808,965 B1 | 10/2004 | Miyasaka et al. |
| 6,808,971 B2 | 10/2004 | Bhattacharyya |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,071,910 B1 | 7/2006 | Takemura |
| 7,105,868 B2 | 9/2006 | Nause et al. |
| 7,139,214 B2 | 11/2006 | Atwood et al. |
| 7,211,825 B2 | 5/2007 | Shih et al. |
| 7,221,616 B2 | 5/2007 | Jeon |
| 7,230,601 B2 | 6/2007 | Yamazaki et al. |
| 7,282,782 B2 | 10/2007 | Hoffman et al. |
| 7,291,877 B2 | 11/2007 | Brederlow et al. |
| 7,297,977 B2 | 11/2007 | Hoffman et al. |
| 7,323,356 B2 | 1/2008 | Hosono et al. |
| 7,339,235 B1 | 3/2008 | Yamazaki et al. |
| 7,385,224 B2 | 6/2008 | Ishii et al. |
| 7,391,667 B2 | 6/2008 | Atwood et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,483,013 B2 | 1/2009 | Osame |
| 7,501,293 B2 | 3/2009 | Ito et al. |
| 7,573,083 B2 | 8/2009 | Kijima et al. |
| 7,601,984 B2 | 10/2009 | Sano et al. |
| 7,623,372 B2 | 11/2009 | Kouno |
| 7,674,650 B2 | 3/2010 | Akimoto et al. |
| 7,687,331 B2 | 3/2010 | Kim et al. |
| 7,732,819 B2 | 6/2010 | Akimoto et al. |
| 7,741,644 B2 | 6/2010 | Lyu et al. |
| 7,791,074 B2 | 9/2010 | Iwasaki |
| 7,820,505 B2 | 10/2010 | Brederlow et al. |
| 7,935,582 B2 | 5/2011 | Iwasaki |
| 7,956,361 B2 | 6/2011 | Iwasaki |
| 7,982,250 B2 | 7/2011 | Yamazaki et al. |
| 8,154,024 B2 | 4/2012 | Iwasaki |
| 8,212,248 B2 | 7/2012 | Itagaki et al. |
| 8,289,753 B2 | 10/2012 | Yamazaki et al. |
| 8,339,828 B2 | 12/2012 | Yamazaki et al. |
| 8,363,452 B2 | 1/2013 | Yamazaki et al. |
| 8,476,626 B2 | 7/2013 | Yamazaki et al. |
| 8,566,502 B2 | 10/2013 | Vaghani |
| 8,619,454 B2 | 12/2013 | Yamazaki et al. |
| 8,804,396 B2 | 8/2014 | Yamazaki et al. |
| 2001/0005020 A1* | 6/2001 | Jinno .................. G02F 1/13454 257/59 |
| 2001/0015450 A1 | 8/2001 | Sugibayashi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0158829 A1 | 10/2002 | Yamazaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |

(56) References Cited

U.S. PATENT DOCUMENTS

| | | |
|---|---|---|
| 2005/0017302 A1 | 1/2005 | Hoffman |
| 2005/0130439 A1* | 6/2005 | Goo ..................... H01L 21/316 438/763 |
| 2005/0185474 A1 | 8/2005 | Atwood et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0164876 A1 | 7/2006 | Barth et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0262483 A1 | 11/2006 | Osame |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0080905 A1 | 4/2007 | Takahara |
| 2007/0081380 A1 | 4/2007 | Atwood et al. |
| 2007/0090365 A1 | 4/2007 | Hayashi et al. |
| 2007/0108446 A1 | 5/2007 | Akimoto |
| 2007/0126042 A1 | 6/2007 | Kijima et al. |
| 2007/0152217 A1 | 7/2007 | Lai et al. |
| 2007/0172591 A1 | 7/2007 | Seo et al. |
| 2007/0181953 A1* | 8/2007 | Lyu ..................... H01L 21/8221 257/382 |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0149984 A1 | 6/2008 | Chang et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0315193 A1 | 12/2008 | Kim et al. |
| 2009/0002590 A1* | 1/2009 | Kimura ............... H01L 27/1214 349/43 |
| 2009/0008638 A1 | 1/2009 | Kang et al. |
| 2009/0020753 A1 | 1/2009 | Jeong et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0078970 A1* | 3/2009 | Yamazaki ........... H01L 21/8221 257/255 |
| 2009/0079000 A1* | 3/2009 | Yamazaki ............. H01L 23/433 257/351 |
| 2009/0084645 A1* | 4/2009 | Okabayashi .......... F16F 9/0218 188/266.6 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0189153 A1 | 7/2009 | Iwasaki et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0140614 A1 | 6/2010 | Uchiyama et al. |
| 2010/0148171 A1 | 6/2010 | Hayashi et al. |
| 2010/0193785 A1 | 8/2010 | Kimura |
| 2010/0203673 A1 | 8/2010 | Hayashi et al. |
| 2010/0276685 A1 | 11/2010 | Itagaki et al. |
| 2010/0276689 A1 | 11/2010 | Iwasaki |
| 2010/0279462 A1 | 11/2010 | Iwasaki |
| 2011/0089417 A1 | 4/2011 | Yamazaki et al. |
| 2011/0089419 A1 | 4/2011 | Yamazaki et al. |
| 2011/0101332 A1 | 5/2011 | Yamazaki et al. |
| 2011/0101334 A1 | 5/2011 | Yamazaki et al. |
| 2011/0101339 A1 | 5/2011 | Yamazaki et al. |
| 2011/0101351 A1 | 5/2011 | Yamazaki |
| 2011/0110145 A1 | 5/2011 | Yamazaki et al. |
| 2011/0121285 A1 | 5/2011 | Yamazaki et al. |
| 2011/0121286 A1 | 5/2011 | Yamazaki et al. |
| 2011/0122673 A1 | 5/2011 | Kamata et al. |
| 2011/0134683 A1 | 6/2011 | Yamazaki et al. |
| 2011/0156024 A1 | 6/2011 | Koyama et al. |
| 2012/0187502 A1* | 7/2012 | Gluschenkov .... H01L 21/82385 257/369 |
| 2012/0295399 A1 | 11/2012 | Kim et al. |

FOREIGN PATENT DOCUMENTS

| | | |
|---|---|---|
| EP | 0923138 A | 6/1999 |
| EP | 1134811 A | 9/2001 |
| EP | 1624435 A | 2/2006 |
| EP | 1737044 A | 12/2006 |
| EP | 1746659 A | 1/2007 |
| EP | 2017881 A | 1/2009 |
| EP | 2226847 A | 9/2010 |
| EP | 2339639 A | 6/2011 |
| EP | 2816607 A | 12/2014 |
| JP | 47-016085 A | 8/1972 |
| JP | 57-105889 A | 7/1982 |
| JP | 60-198861 A | 10/1985 |
| JP | 62-274773 A | 11/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-268184 A | 11/1988 |
| JP | 05-119298 A | 5/1993 |
| JP | 05-251705 A | 9/1993 |
| JP | 07-037393 A | 2/1995 |
| JP | 07-211084 A | 8/1995 |
| JP | 08-245220 A | 9/1996 |
| JP | 08-264794 A | 10/1996 |
| JP | 10-284696 A | 10/1998 |
| JP | 11-505377 | 5/1999 |
| JP | 11-233789 A | 8/1999 |
| JP | 2000-044236 A | 2/2000 |
| JP | 2000-150900 A | 5/2000 |
| JP | 2001-044297 A | 2/2001 |
| JP | 2001-230326 A | 8/2001 |
| JP | 2002-076356 A | 3/2002 |
| JP | 2002-093924 A | 3/2002 |
| JP | 2002-133876 A | 5/2002 |

(56) References Cited

FOREIGN PATENT DOCUMENTS

| | | |
|---|---|---|
| JP | 2002-289859 A | 10/2002 |
| JP | 2002-319682 A | 10/2002 |
| JP | 2002-328617 A | 11/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-265944 A | 9/2004 |
| JP | 2004-273614 A | 9/2004 |
| JP | 2004-273732 A | 9/2004 |
| JP | 2005-243059 A | 9/2005 |
| JP | 2006-165532 A | 6/2006 |
| JP | 2007-042172 A | 2/2007 |
| JP | 2007-103918 A | 4/2007 |
| JP | 2007-157982 A | 6/2007 |
| JP | 2007-189235 A | 7/2007 |
| JP | 2008-160125 A | 7/2008 |
| JP | 2009-004787 A | 1/2009 |
| JP | 2009-016844 A | 1/2009 |
| JP | 2009-021536 A | 1/2009 |
| JP | 2009-033145 A | 2/2009 |
| JP | 2009-094494 A | 4/2009 |
| JP | 2009-099953 A | 5/2009 |
| JP | 2009-135350 A | 6/2009 |
| JP | 2009-164393 A | 7/2009 |
| JP | 2009-182194 A | 8/2009 |
| KR | 10-0436654 | 6/2004 |
| KR | 2006-0018831 A | 3/2006 |
| KR | 2008-0053355 A | 6/2008 |
| TW | 468268 | 12/2001 |
| TW | 200529228 | 9/2005 |
| TW | 200945573 | 11/2009 |
| WO | WO-00/30183 | 5/2000 |
| WO | WO-2004/114391 | 12/2004 |
| WO | WO-2007/029844 | 3/2007 |
| WO | WO-2009/087943 | 7/2009 |

OTHER PUBLICATIONS

Kameshiro.N et al., "A Fully Logic-Process-Compatible, 3-Transistor, SESO-memory Cell Featuring 0.1-FIT/Mb Soft Error, 100-MHz Random Cycle, and 100-ms Retention", 2008 Sympotium on VLSI Circuits Digest of Technical Papers, Aug. 1, 2008, pp. 122-123.

International Search Report (Application No. PCT/JP2010/069546) Dated Feb. 15, 2011.

Written Opinion (Application No. PCT/JP2010/069546) Dated Feb. 15, 2011.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using a single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

(56) References Cited

OTHER PUBLICATIONS

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT"IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—An-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3-BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M at al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

(56) References Cited

OTHER PUBLICATIONS

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs ", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Kim.M et al., "High mobility bottom gate InGaZnO thin film transistors with SiOx etch stopper", Appl. Phys. Lett. (Applied Physics Letters), May 24, 2007, vol. 90, No. 21, pp. 212114-1-212114-3.

Korean Office Action (Application No. 2012-7015709) Dated Mar. 7, 2017.

\* cited by examiner

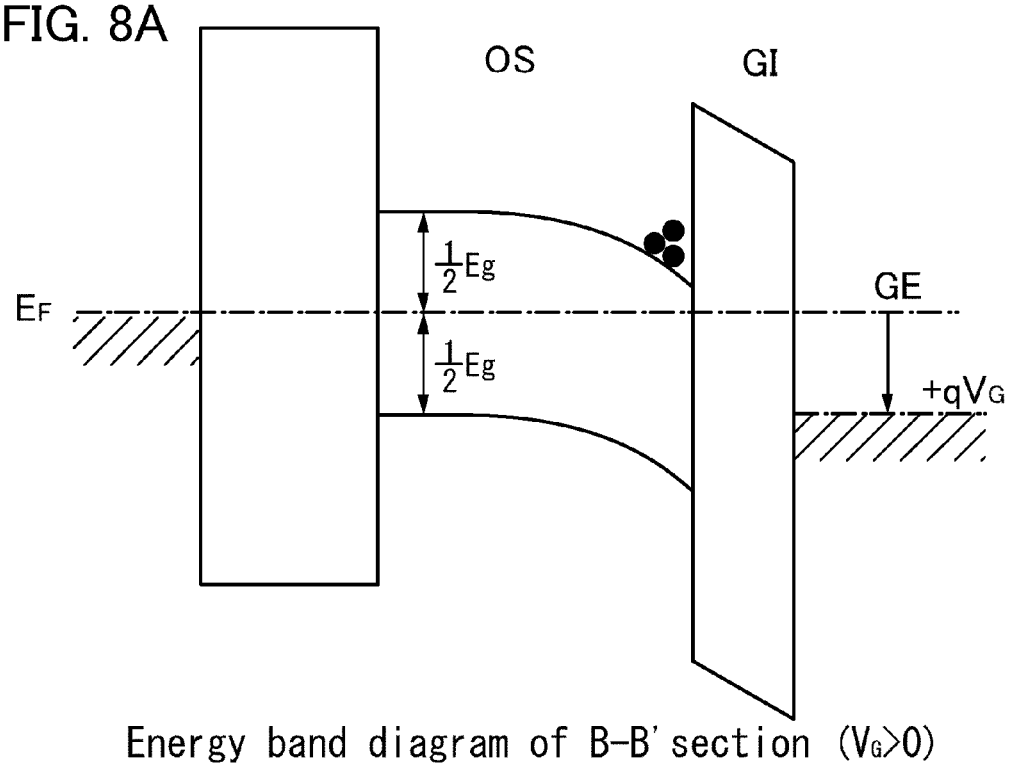
Energy band diagram of B-B' section ($V_G>0$)
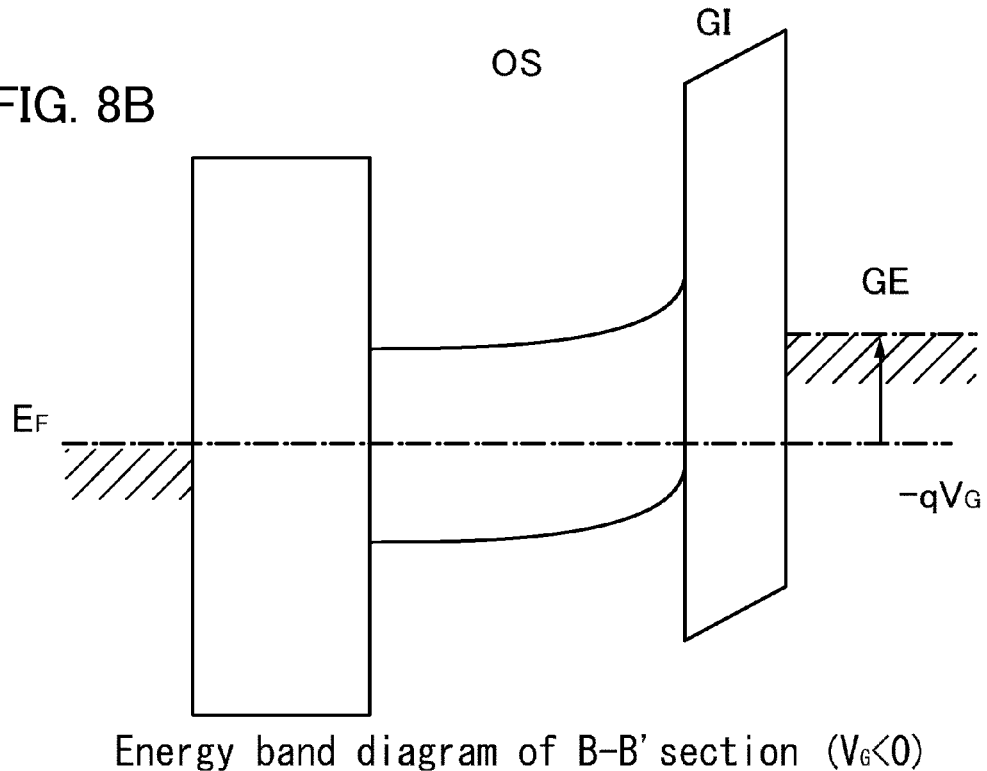
Energy band diagram of B-B' section ($V_G<0$)

SEMICONDUCTOR DEVICE

TECHNICAL FIELD

The present invention relates to a semiconductor device using semiconductor elements and a manufacturing method thereof.

BACKGROUND ART

Memory devices using semiconductor elements are roughly classified into volatile memory devices that lose their memory content when power supply is stopped and nonvolatile memory devices that can hold their memory content even when power supply is stopped.

As a typical example of a volatile memory device, a dynamic random access memory (DRAM) is given. In a DRAM, a transistor included in a memory element is selected and an electric charge is accumulated in a capacitor, so that information is memorized.

Owing to the above-described principle, a charge in a capacitor is lost when information data is read in a DRAM; thus, it is necessary to perform rewriting of the information data, so that information is memorized again after the information data reading. In addition, there is leakage of current in a transistor included in a memory element so that a charge accumulated at an electrode of the capacitor is lost or a charge flows into the capacitor, even if the transistor is not selected to perform any operation, whereby data holding period is short. Therefore, it is necessary to perform rewriting in a predetermined cycle (refresh operation) and it is difficult to reduce power consumption satisfactorily. Further, since memory content is lost when the power is not supplied to the DRAM, another memory device using a magnetic material or an optical material is needed to store information for a long period.

As another example of a volatile memory device, a static random access memory (SRAM) is given. In an SRAM, memory content is stored using a circuit such as a flip flop, so that refresh operation is not needed. In view of this point, SRAM is advantageous over a DRAM. However, an inconvenient in that a cost per storage capacity becomes high because a circuit such as a flip flop is used. Further, in view of the point that memory content is lost when the power is not supplied, an SRAM is not superior to a DRAM.

As a typical example of a nonvolatile memory device, flash memory is given. A flash memory includes a floating gate between a gate electrode and a channel formation region in a transistor. A flash memory stores memory content by storing a charge in the floating gate, so that a data holding period is extremely long (semi-permanent), and thus has an advantage that refresh operation which is necessary in a volatile memory device is not needed (for example, see Patent Document 1).

However, in flash memory, there is a problem in that a memory element does not function after performing writing operations a predetermined number of times because a gate insulating layer included in the memory element is deteriorated by a tunnel current occurring each time a writing operation is performed. In order to relieve an adverse effect of this phenomenon, a method consisting in equalizing the number of writing operations between the memory elements is employed, for example. However, a complicated peripheral circuit is needed to apply this method. Further, even if such a method is employed, the basic problem of lifetime is not resolved. That is, a flash memory is unsuitable for applications in which information is rewritten with high frequency.

Further, high voltage is required to store a charge in the floating gate or to remove a charge in the floating gate. Furthermore, a relatively long time is required for storing or removing a charge and the speed of writing and erasing cannot easily be increased.

REFERENCE

Patent Document

[Patent Document 1] Japanese Published Patent Application No. S57-105889

Disclosure of Invention

In view of the above problem, one object of one embodiment of the present invention is to provide a semiconductor device having a new structure, the semiconductor device being capable of holding memory content in the state where power is not supplied and having no limitation on the number of writing operations. Another object of one embodiment of the present invention is to provide a semiconductor having a structure allowing using easily multi-valued information.

One embodiment of the present invention is a semiconductor device having a stack of a transistor using an oxide semiconductor and a transistor using a material other than an oxide semiconductor. For example, the semiconductor device can employ the following structures.

One embodiment of the present invention is a semiconductor device including: a source line; a bit line; a first signal line; a plurality of second signal lines; a plurality of word lines; a plurality of memory cells connected in parallel between the source line and the bit line; a driver circuit for the second signal lines and the word lines to which an address signal is input and which drives the plurality of second signal lines and the plurality of word lines so that a memory cell specified by the address signal is selected from the plurality of memory cells; a driver circuit of the first signal line selecting and outputting any of a plurality of writing potentials to the first signal line; a reading circuit to which a potential of the bit line and a plurality of reference potentials are input and which read data by comparing the potential of the bit line and the plurality of reference potentials; a potential generating circuit generating and supplying the plurality of writing potentials and the plurality of reference potentials to the driver circuit of the first signal line and the reading circuit; and a boosting circuit supplying a potential to the potential generating circuit. One of the memory cells includes: a first transistor having a first gate electrode, a first source electrode, and a first drain electrode; a second transistor having a second gate electrode, a second source electrode, and a second drain electrode; and a third transistor having a third gate electrode, a third source electrode, and a third drain electrode. The first transistor is provided over a substrate containing a semiconductor material. The second transistor includes an oxide semiconductor layer. The first gate electrode and one of the second source electrode and the second drain electrode are electrically connected to each other. The source line and the first source electrode are electrically connected to each other. The first drain electrode and the third source electrode are electrically connected to each other. The bit line and the third drain electrode are electrically connected to each other. The first signal line and the other of the second source electrode and the second drain electrode are electrically connected to each other. One of the second signal lines and the second gate electrode are electrically connected to each other. One of the word lines and the third gate electrode are electrically connected to each other.

Additionally, in the above structure, the semiconductor device includes a capacitor electrically connected to the first gate electrode and one of the second source electrode and the second drain electrode.

Another embodiment of the present invention is a semiconductor device including: a source line; a bit line; a first signal line; a plurality of second signal lines; a plurality of word lines; a plurality of memory cells connected in parallel between the source line and the bit line; a driver circuit for the second signal lines and the word lines to which an address signal is input and which drives the plurality of second signal lines and the plurality of word lines so that a memory cell specified by the address signal is selected from the plurality of memory cells; a driver circuit of the first signal line selecting and outputting any of a plurality of writing potentials to the first signal line; a reading circuit to which a potential of the bit line and a plurality of reference potentials are input and which has a reference memory cell, and reads data by comparing conductance of the specified memory cell and conductance of the reference memory cell; a potential generating circuit generating and supplying the plurality of writing potentials and the plurality of reference potentials to the driver circuit of the first signal line and the reading circuit; and a boosting circuit supplying a potential to the potential generating circuit. One of the plurality of memory cells includes: a first transistor having a first gate electrode, a first source electrode, and a first drain electrode; a second transistor having a second gate electrode, a second source electrode, and a second drain electrode; and a third transistor having a third gate electrode, a third source electrode, and a third drain electrode. The first transistor is provided over a substrate containing a semiconductor material. The second transistor includes an oxide semiconductor layer. The first gate electrode and one of the second source electrode and the second drain electrode are electrically connected to each other. The source line and the first source electrode are electrically connected to each other. The first drain electrode and the third source electrode are electrically connected to each other. The bit line and the third drain electrode are electrically connected to each other. The first signal line and the other of the second source electrode and the second drain electrode are electrically connected to each other. One of the second signal lines and the second gate electrode are electrically connected to each other. One of the word lines and the third gate electrode are electrically connected to each other.

Another embodiment of the present invention is a semiconductor device including: a source line; a bit line; a first signal line; a plurality of second signal lines; a plurality of word lines; a plurality of memory cells connected in parallel between the source line and the bit line; a driver circuit of the second line and the word line to which an address signal and a plurality of reference potentials are input and which drives the plurality of second signal lines and the plurality of word lines so that a memory cell specified by the address signal is selected from the plurality of memory cells and which selects and outputs any of the plurality of reference potentials to one selected word line; a driver circuit of the first signal line selecting and outputting any of a plurality of writing potentials to the first signal line; a reading circuit to which the bit line is connected and which reads data by reading conductance of the specified memory cell to read data; a potential generating circuit generating and supplying the plurality of writing potentials and the plurality of reference potentials to the driver circuit of the first signal line and the reading circuit; and a boosting circuit supplying a potential to the potential generating circuit. One of the memory cells includes: a first transistor having a first gate electrode, a first source electrode, and a first drain electrode; a second transistor having a second gate electrode, a second source electrode, and a second drain electrode; and a capacitor. The first transistor is provided over a substrate containing a semiconductor material. The second transistor is includes an oxide semiconductor layer. The first gate electrode, one of the second source electrode and the second drain electrode, and one of electrodes of the capacitor are electrically connected to one another. The source line and the first source electrode are electrically connected to each other. The bit line and the first drain electrode are electrically connected to each other. The first signal line and the other of the second source electrode and the second drain electrode are electrically connected to each other. One of the second signal lines and the second gate electrode are electrically connected to each other. One of the word lines and the other of the electrodes of the capacitor are electrically connected to each other.

In the above structure, the first transistor includes the following elements: a channel formation region provided over the substrate containing the semiconductor material, impurity regions formed with the channel formation region sandwiched therebetween, the first gate insulating layer over the channel formation region, a first gate electrode over the first gate insulating layer, and the first source electrode and the first drain electrode both of which are electrically connected to the impurity regions.

Further, in the above structure, the second transistor includes the following elements: the second gate electrode over the substrate containing the semiconductor material, a second gate insulating layer over the second gate electrode, the oxide semiconductor layer over the second gate insulating layer, and the second source electrode and the second drain electrode both of which are electrically connected to the oxide semiconductor layer.

In the above structure, the third transistor includes the following elements: a channel formation region provided over the substrate containing the semiconductor material, impurity regions formed with the channel formation region sandwiched therebetween, the third gate insulating layer over the channel formation region, a third gate electrode over the third gate insulating layer, and the third source electrode and the third drain electrode both of which are electrically connected to the impurity regions In the above structure, the substrate containing the semiconductor material is preferably a single crystal semiconductor substrate. In particular, the semiconductor material is preferably silicon. Further, as a substrate containing the semiconductor material, an SOI substrate may also be used.

Preferably, in the above structure, the oxide semiconductor layer contains an In—Ga—Zn—O based oxide semiconductor material. In particular, the oxide semiconductor layer preferably contains an $In_2Ga_2ZnO_7$ crystal. In addition, preferably, the hydrogen concentration of the oxide semiconductor layer is less than or equal to $5\times10^{19}$ atoms/cm$^3$. The off-state current of the second transistor is preferably less than or equal to $1\times10^{-13}$ A.

In addition, in the above structure, the second transistor can be provided in a region overlapping with the first transistor.

Note that in this specification, "over" and "below" do not necessarily mean "directly on" and "directly under", respectively, in the description of a physical relationship between components. For example, the expression of "a first gate electrode over a gate insulating layer" may refer to the case where another component is interposed between the gate insulating layer and the first gate electrode. In addition, the terms "above" and "below" are just used for convenience of explanations and they can be interchanged unless otherwise specified.

In this specification, the term "electrode" or "wiring" does not limit the function of components. For example, an "electrode" can be used as a part of a "wiring", and the "wiring" can be used as a part of the "electrode". In addition, the term "electrode" or "wiring" can also mean a combination of a plurality of "electrodes" and "wirings", for example.

Further, functions of a "source" and a "drain" might be switched when transistors having different polarities are employed or a direction of current flow is changed in circuit operation, for example. Therefore, the terms "source" and "drain" can be switched in this specification.

Note that in this specification, the expression of "electrically connected" includes the case of electrical connection through "an object having any electrical function". Here, there is no particular limitation on "an object having any electrical function" as long as the object enables transmission and reception of an electrical signal between components connected by the object.

For example, the category "an object having any electrical function" can include a switching element such as a transistor, a resistor, an inductor, a capacitor, and other elements having several functions, as well as electrodes and wirings.

In general, the term "SOI substrate" means a substrate having a silicon semiconductor layer over an insulating surface. In this specification, the term "SOI substrate" also means a substrate having a semiconductor layer using a material other than silicon over an insulating surface. That is, a semiconductor layer included in the "SOI substrate" is not limited to a silicon semiconductor layer. Additionally, a substrate in an "SOI substrate" is not limited to a semiconductor substrate such as a silicon wafer, and may be a non-semiconductor substrate such as a glass substrate, a quartz substrate, a sapphire substrate, and a metal substrate. That is, an "SOI substrate" also includes a conductive substrate and an insulating substrate over which a layer is formed using a semiconductor material. In addition, in this specification, a "semiconductor substrate" means a substrate of only a semiconductor material and also a general substrate of a material including a semiconductor material. In other words, in this specification, an "SOI substrate" is also included in the broad category of a "semiconductor substrate".

Moreover, in this specification, a semiconductor material other than an oxide semiconductor may be any semiconductor material as long as it is a semiconductor material other than an oxide semiconductor material. For example, silicon, germanium, silicon germanium, silicon carbide, gallium arsenide, or the like can be given. Besides, an organic semiconductor material and the like can be used. Note that in the case where a material included in a semiconductor device and the like is not particularly specified, an oxide semiconductor material or a semiconductor material other than an oxide semiconductor material may be used.

One embodiment of the present invention provides, in its lower portion, a semiconductor device including a transistor using a material other than an oxide semiconductor in its channel formation region, and, in its upper portion, a transistor using an oxide semiconductor in its channel formation region.

A transistor using an oxide semiconductor has extremely low off-state current; therefore, by using the transistor, memory content can be stored for a relatively long time. That is, refresh operation can become unnecessary, or frequency of refresh operation can be reduced considerably, so that power consumption can be reduced substantially. Further, even in the case where power is not supplied, memory content can be stored for a long time.

In addition, high voltage is not needed for writing information in the semiconductor device and there is no problem of deterioration of elements. For example, since there is no need to perform injection of electrons to a floating gate and extraction of electrons from a floating gate which are needed in a conventional nonvolatile memory, deterioration such as deterioration of a gate insulating layer does not occur. That is, the semiconductor device according to one embodiment of the present invention does not have a limit on the number of times of writing which is a problem in a conventional nonvolatile memory, and reliability thereof is drastically improved. Further, information is written according to an on state and an off state of the transistor, whereby high-speed operation can be easily realized. Additionally, when information is written, there is an advantage that operation for erasing the previously stored information is not needed.

Further, the transistor formed using a material other than an oxide semiconductor can be operated at sufficiently high speed; therefore, by using the transistor, stored contents can be read out at high speed.

Moreover, the semiconductor device according to one embodiment of the present invention can easily multivalue data by being provided with a boosting circuit, so that storage capacity can be increased.

Accordingly, a semiconductor device having unprecedented characteristics can be realized by being provided with a combination of a transistor using a material other than an oxide semiconductor material and a transistor using an oxide semiconductor material.

BRIEF DESCRIPTION OF DRAWINGS

In the accompanying drawings:

FIG. 8A is a diagram illustrating a state where a positive voltage ($V_G>0$) is applied to a gate electrode (GE), and FIG. 8B is a diagram illustrating a state where a negative potential ($V_G<0$) is applied to the gate electrode (GE);

BEST MODE FOR CARRYING OUT THE INVENTION

Figure 1:
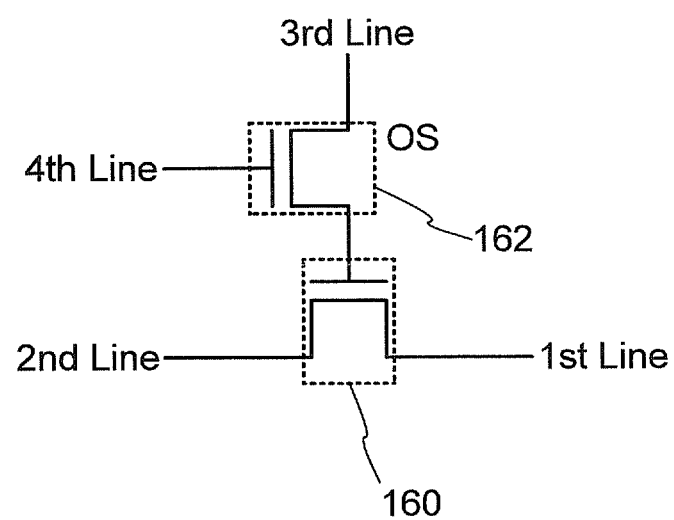
FIG. 1 is a circuit diagram for describing a semiconductor device.

Hereinafter, examples of embodiments of the present invention will be described with reference to the drawings. Note that the present invention is not limited to the following descriptions and it will be readily appreciated by those skilled in the art that modes and details can be modified in various ways without departing from the spirit and the scope of the present invention. Therefore, the invention should not be interpreted as being limited to the description of the following embodiment modes.

Note that for the easy understanding, the position, size, range and the like of each component illustrated in the drawings and the like are not actual ones in some cases. Therefore, the present invention is not limited to the position, size, and range and the like disclosed in the drawings and the like.

Note that in this specification, ordinal numbers such as "first", "second", and "third" are used in order to avoid confusion among components, and the terms do not limit the components numerically.

Embodiment 1

In this embodiment, structures and manufacturing methods of semiconductor devices according to one embodiment of the disclosed invention are described with reference to FIG. 1, FIGS. 2A and 2B, FIGS. 3A to 3H, FIGS. 4A to 4G, FIGS. 5A to 5D, FIG. 6, FIGS. 7A and 7B, FIGS. 8A and 8B, FIG. 9, FIG. 10, FIG. 11, FIG. 12, FIGS. 13A and 13B, FIGS. 14A and 14B, and FIGS. 15A and 15B.

<Circuit Configuration of Semiconductor Device>

FIG. 1 illustrates an example of a circuit configuration of a semiconductor device. The semiconductor device includes a transistor 160 which uses a material other than an oxide semiconductor and a transistor 162 which uses an oxide semiconductor. Note that a mark "OS" is added to the transistor 162 in FIG. 1 to show that the transistor 162 uses an oxide semiconductor.

Here, a gate electrode of the transistor 160 is electrically connected to one of a source electrode and a drain electrode of the transistor 162. A first wiring (which is denoted as "1st Line" and also called a source line) and a second wiring (which is denoted as "2nd Line" and also called a bit line) are electrically connected to a source electrode of the transistor 160 and a drain electrode of the transistor 160, respectively. Further, a third wiring (which is denoted as "3rd Line" and also called a first signal line) and a fourth wiring (which is denoted as "4th Line" and also called a second signal line) are electrically connected to the other of the source electrode and the drain electrode of the transistor 162 and to a gate electrode of the transistor 162, respectively.

The transistor 160 which uses a material other than an oxide semiconductor can operate at sufficiently high speed; thus, can read stored contents and the like at high speed. In addition, off-state current is extremely small in the transistor 162 which uses an oxide semiconductor. Therefore, when the transistor 162 is turned off, a potential of the gate electrode of the transistor 160 can be held for an extremely long time.

The advantage that the potential of the gate electrode can be held for an extremely long time enables writing, holding, and reading of information to be performed as described below.

Description is made on writing and holding of information first. First, a potential of the fourth wiring is set to a potential putting the transistor 162 in an on state. Accordingly, a potential of the third wiring is applied to the gate electrode of the transistor 160 (writing data operation). After that, the potential of the fourth wiring is set to a potential putting the transistor 162 in an off state; accordingly, the potential of the gate electrode of the transistor 160 is held (holding data operation).

Since the off-state current of the transistor 162 is extremely small, the potential of the gate electrode of the transistor 160 is held for a long time. For example, when the potential of the gate electrode of the transistor 160 is a potential putting the transistor 160 in an on state, the on state of the transistor 60 is kept for a long time. When the potential of the gate electrode of the transistor 160 is a potential to make the transistor 160 be in an off state, the off state of the transistor 160 is kept for a long time.

Next, description is made on the reading of information operation. When an on state or an off state of the transistor 160 is kept as described above and a predetermined potential (a low potential) is applied to the first wiring, the value of a potential of the second wiring varies depending on a state of the transistor 160 which is an on state or an off state. For example, when the transistor 160 is in an on state, the potential of the second wiring is lowered by being affected by the potential of the first wiring. On the other hand, when the transistor 160 is in an off state, the potential of the second wiring is not changed.

In this manner, by comparing the potential of the first wiring with the potential of the second wiring in a state where information is held, the information can be read.

Then, description is made on rewriting of information. Rewriting of information is performed in a manner similar to that of the writing and holding of information which are described above. That is, the potential of the fourth wiring is set to a potential putting the transistor 162 in an on state, whereby the transistor 162 is put in an on state. Accordingly, the potential of the third wiring (a potential relating to new information) is applied to the gate electrode of the transistor 160. After that, the potential of the fourth wiring is set to a potential putting the transistor 162 in an off state, whereby the transistor 162 is put in an off state; thus, the new information is held.

As described above, in the semiconductor device according to one embodiment of the disclosed invention, information can be directly rewritten by performing rewriting of information. Erasing operation, necessary in a flash memory and the like, is thus not needed; therefore, reduction in operation speed due to erasing operation can be suppressed. In other words, high-speed operation of a semiconductor device is realized.

Note that, in the above description, an n-type transistor (an n-channel transistor) using electrons as carriers is used; however, a p-channel transistor using holes as carriers, needless to say, can be used instead of an n-channel transistor.

It is also needless to say that a capacitor may be added to the gate electrode of the transistor 160 so that the potential of the gate electrode of the transistor 160 is easily held.

<Plan Structure and Cross-Sectional Structure of a Semiconductor Device>

Figure 2A:
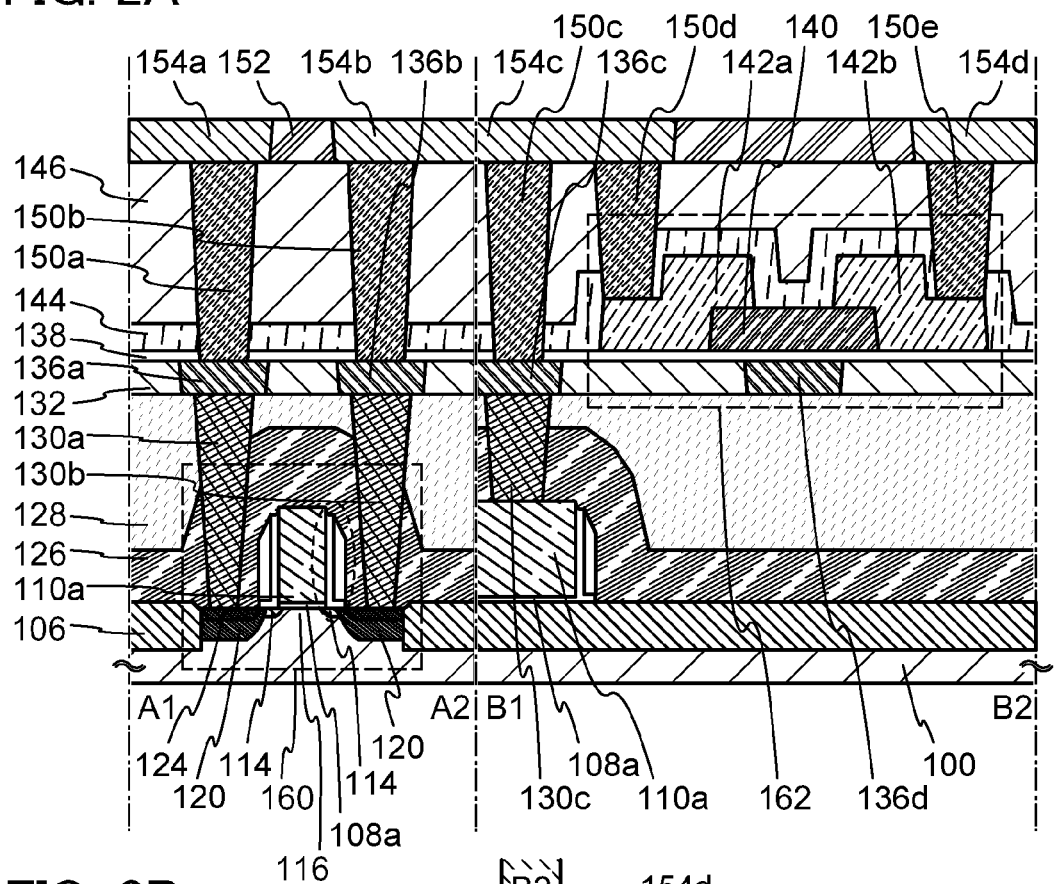
FIG. 2A is a cross-sectional view for describing a semiconductor device and FIG. 2B is a plan view for describing the semiconductor device.
Figure 2B:
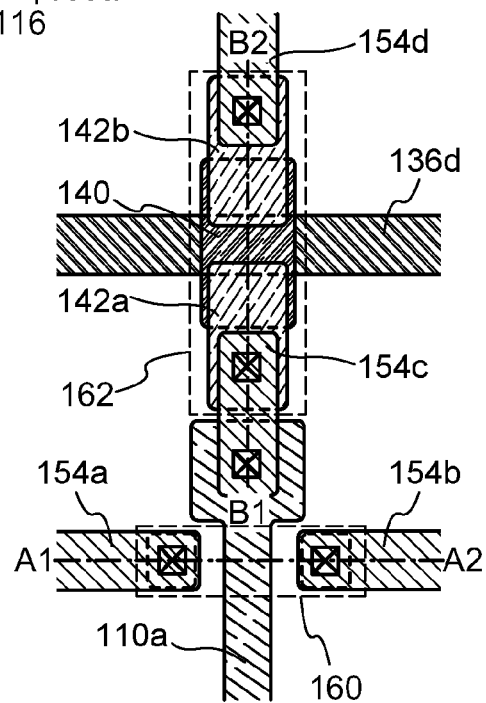

An example of a structure of the above semiconductor device is illustrated in FIGS. 2A and 2B. FIGS. 2A and 2B are a cross-sectional view of the semiconductor device and a plan view thereof, respectively. Here, FIG. 2A corresponds to a cross-section taken along line A1-A2 and line B1-B2 of FIG. 2B. The semiconductor device illustrated in FIGS. 2A and 2B includes the transistor 160 using a material other than an oxide semiconductor in a lower portion and the transistor 162 using an oxide semiconductor in an upper portion. Note that although n-channel transistors are described as the transistors 160 and 162, p-channel transistors may be employed. A p-channel transistor can be preferably used as the transistor 160, in particular.

The transistor 160 includes: a channel formation region 116 which is provided in a substrate 100 containing a semiconductor material; impurity regions 114 between which the channel formation region 116 is sandwiched and high-concentration impurity regions 120 between which the channel formation region 116 is sandwiched (impurity regions 114 and high-concentration impurity regions 120 are also collectively called impurity regions); a gate insulating layer 108a provided over the channel formation region 116: a gate electrode 110a provided over the gate insulating layer 108a; a source or drain electrode 130a electrically connected to a first impurity region 114 on one side of the channel formation region 116; and a source or drain electrode 130b electrically connected to a second impurity regions 114 on another side of the channel formation region 116.

Here, sidewall insulating layers 118 are provided for side surfaces of the gate electrode 110a. Moreover, at least parts of the side wall insulating layers 118 are comprised between the high concentration impurity regions 120 formed in regions of the substrate 100, when seen from above, and metal compound regions 124 are present over the high concentration impurity regions 120. Further, an element insulation insulating layer 106 is formed over the substrate 100 so as to surround the p-type transistor 160, and an interlayer insulating layer 126 and an interlayer insulating layer 128 are formed so as to cover the p-type transistor 160. The source or drain electrode 130a is electrically connected to a first metal compound region 124 on the one side of the channel formation region 116, and the source or drain electrode 130b is electrically connected to a second metal compound region 124 on the other side of the channel formation region 116 through openings in the interlayer insulating layer 126 and the interlayer insulating layer 128. In other words, the source or drain electrode 130a is electrically connected to a first high concentration region 120 and to the first impurity region 114 which are on the one side of the channel formation region 116 through the first metal compound region 124 on the one side of the channel formation region 116, and the source or drain electrode 130b is electrically connected to a second high concentration region 120 and to the second impurity region 114 which are on the other side of the channel formation region 116 through the second metal compound region 124 on the other side the channel formation region 116. Further, the gate electrode 110a is electrically connected to an electrode 130c provided in a similar manner to the source or drain electrode 130a and the source or drain electrode 130b.

The transistor 162 includes: a gate electrode 136d provided over the interlayer insulating layer 128; a gate insulating layer 138 provided over the gate electrode 136d; an oxide semiconductor layer 140 provided over the gate insulating layer 138; and a source or drain electrode 142a and a source or drain electrode 142b which are provided over and electrically connected to the oxide semiconductor layer 140.

Here, the gate electrode 136d is provided so as to be embedded in an insulating layer 132 which is formed over the interlayer insulating layer 128. Furthermore, similarly to the gate electrode 136d, an electrode 136a, an electrode 136b, and an electrode 136c are formed in contact with the source or drain electrode 130a, the source or drain electrode 130b, and the electrode 130c, respectively.

Over the transistor 162, a protective insulating layer 144 is provided in contact with part of the oxide semiconductor layer 140. An interlayer insulating layer 146 is provided over the protective insulating layer 144. Here, in the protective insulating layer 144 and the interlayer insulating layer 146, openings reaching the source or drain electrode 142a and the source or drain electrode 142b are formed. In the openings, an electrode 150d and an electrode 150e are formed to be in contact with the source or drain electrode 142a and the source or drain electrode 142b, respectively. Similarly to the electrodes 150d and 150e, an electrode 150a, an electrode 150b, and an electrode 150c are formed to be in contact with the electrode 136a, the electrode 136b, and the electrode 136c, respectively, through openings provided in the gate insulating layer 138, the protective insulating layer 144, and the interlayer insulating layer 146.

Here, the oxide semiconductor layer 140 is preferably an oxide semiconductor layer highly purified by removing an impurity such as hydrogen. Specifically, hydrogen concentration in the oxide semiconductor layer 140 is less than or equal to $5 \times 10^{19}$ atoms/cm$^3$, preferably, less than or equal to $5 \times 10^{18}$ atoms/cm$^3$, or more preferably, less than or equal to $5 \times 10^{17}$ atoms/cm$^3$. In addition, it is desirable that the oxide semiconductor layer 140 contain sufficient oxygen so that defects due to oxygen vacancies are reduced. In the oxide semiconductor layer 140 which is highly purified by sufficiently reducing the hydrogen concentration, carrier concentration is less than or equal to $1 \times 10^{12}$/cm$^3$, preferably less than or equal to $1 \times 10^{11}$/cm$^3$. In this manner, by using an oxide semiconductor which is made to be an i-type (intrinsic) oxide semiconductor or a substantially i-type oxide semiconductor, the transistor 162 which has extremely favorable off-state current characteristics can be obtained. For example, when a drain voltage $V_d$ is +1 V or +10 V and a gate voltage $V_g$ ranges from −5 V to −20 V, off-state current is less than or equal to $1 \times 10^{-13}$ A. When the oxide semiconductor layer 140 which is highly purified by sufficiently reducing the hydrogen concentration and in which the defects due to oxygen vacancies are reduced is used and off-state current of the transistor 162 is reduced, a semiconductor device having a new structure can be realized. Note that the hydrogen concentration in the oxide semiconductor layer 140 was measured by secondary ion mass spectroscopy (SIMS).

Furthermore, an insulating layer 152 is provided over the interlayer insulating layer 146. An electrode 154a, an electrode 154b, an electrode 154c, and an electrode 154d are provided so as to be embedded in the insulating layer 152. Here, the electrode 154a is in contact with the electrode 150a; the electrode 154b, the electrode 150b; the electrode 154c, the electrodes 150c and 150d; and the electrode 154d, the electrode 150e.

That is, in the semiconductor device illustrated in FIGS. 2A and 2B, the gate electrode 110a of the transistor 160 is electrically connected to the source or drain electrode 142a of the transistor 162 through the electrodes 130c, 136c, 150c, 154c, and 150d.

<Method for Manufacturing Semiconductor Device>

Next, an example of a method for manufacturing the above-described semiconductor device will be described. First, a method for manufacturing the transistor 160 in the lower portion will be described with reference to FIGS. 3A to 3H and next, a method for manufacturing the transistor 162 in the upper portion will be described with reference to FIGS. 4A to 4G and FIGS. 5A to 5D.

<Method for Manufacturing a Transistor in a Lower Portion>

Figure 3A:
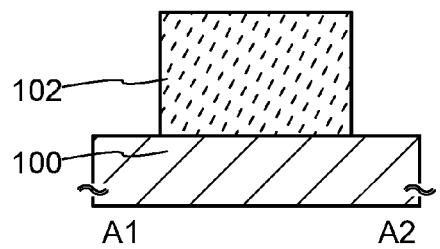
FIGS. 3A to 3H are cross-sectional views each for explaining a manufacturing step of a semiconductor device.
Figure 3E:
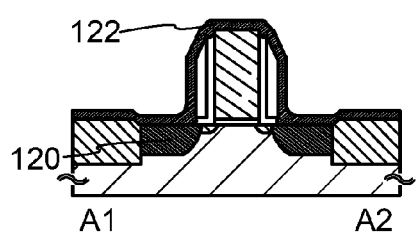

First, the substrate 100 which contains a semiconductor material is prepared (see FIG. 3A). As the substrate 100 which contains a semiconductor material, a single crystal semiconductor substrate or a polycrystalline semiconductor substrate containing silicon, silicon carbide, or the like, a compound semiconductor substrate containing silicon germanium or the like, an SOI substrate, or the like can be used. Here, an example in which a single crystal silicon substrate is used as the substrate 100 containing a semiconductor material is described. Note that in general, the term "SOI substrate" means a substrate having a silicon semiconductor layer over an insulating surface. In this specification, the term "SOI substrate" also means a substrate having a semiconductor layer using a material other than silicon over an insulating surface. That is, a semiconductor layer included in the "SOI substrate" is not limited to a silicon semiconductor layer. In addition, the SOI substrate includes a substrate which has a semiconductor layer over an insulating substrate such as a glass substrate, with an insulating layer between the semiconductor layer and the insulating substrate.

Over the substrate 100, a protective layer 102 which functions as a mask for forming an element insulation insulating layer is formed (see FIG. 3A). As the protective layer 102, for example, an insulating layer formed using silicon oxide, silicon nitride, silicon nitride oxide, or the like can be used. Note that an impurity element giving n-type conductivity or an impurity element giving p-type conductivity may be added to the substrate 100 before or after the above step to control the threshold voltage of the transistor. As the impurity giving n-type conductivity, phosphorus, arsenic, or the like can be used when the semiconductor material contained in the substrate 100 is silicon. As the impurity giving p-type conductivity, boron, aluminum, gallium, or the like can be used, for example.

Next, part of the substrate 100 in a region which is not covered with the protective layer 102 (an exposed region) is removed by etching with the use of the above protective layer 102 as a mask. Thus, an insulated semiconductor region 104 is formed (see FIG. 3B). For the etching, dry etching is preferably performed, but wet etching can be performed. An etching gas and an etchant can be selected as appropriate depending on a material of the object to be etched.

Figure 3B:
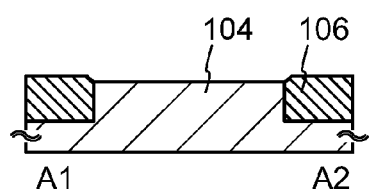
Figure 3F:
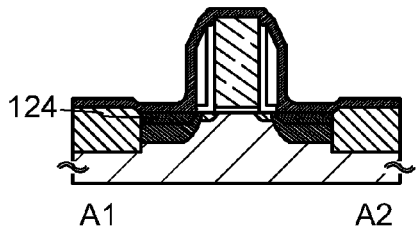

Next, an insulating layer is formed so as to cover the semiconductor region 104 and is selectively removed in a region which overlaps with the semiconductor region 104, whereby the element insulation insulating layer 106 is formed (see FIG. 3B). The insulating layer is formed using silicon oxide, silicon nitride, silicon nitride oxide, or the like. As a method for removing the insulating layer, there are etching and polishing treatment such as CMP, and any of them can be employed. Note that the protective layer 102 is removed either after the semiconductor region 104 is formed or after the element insulation insulating layer 106 is formed.

Then, an insulating layer is formed over the semiconductor region 104 and a layer containing a conductive material is formed over the insulating layer.

The insulating layer serves as a gate insulating layer later and preferably has a single-layer structure or a stacked-layer structure film containing silicon oxide, silicon nitride oxide, silicon nitride, hafnium oxide, aluminum oxide, tantalum oxide, or the like obtained by using a CVD method, a sputtering method, or the like. Alternatively, the above insulating layer may be obtained by oxidizing or nitriding a surface of the semiconductor region 104 by high-density plasma treatment or thermal oxidation treatment. The high-density plasma treatment can be performed using, for example, a mixed gas of a combination of a rare gas such as He, Ar, Kr, or Xe and oxygen, nitrogen oxide, ammonia, nitrogen, or hydrogen. There is no particular limitation on the thickness of the insulating layer, but the thickness can be greater than or equal to 1 nm and less than or equal to 100 nm, for example.

The layer containing a conductive material can be formed using a metal material such as aluminum, copper, titanium, tantalum, or tungsten. Alternatively, the layer containing a conductive material may be formed using a semiconductor material such as polycrystalline silicon containing a conductive material. There is also no particular limitation on a method for forming the layer containing a conductive material, and any of a variety of deposition methods such as an evaporation method, a CVD method, a sputtering method, and a spin coating method is applicable. Note that in this embodiment, an example of the case where the layer containing a conductive material is formed using a metal material is described.

Figure 3C:
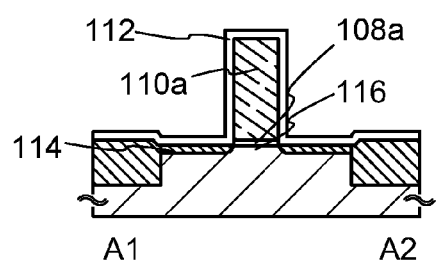

After that, by selectively etching the insulating layer and the layer containing a conductive material, the gate insulating layer 108a and the gate electrode 110a are formed (see FIG. 3C).

Next, an insulating layer 112 which covers the gate electrode 110a is formed (see FIG. 3C). Phosphorus (P), arsenic (As), or the like is then added to the semiconductor region 104, whereby the impurity regions 114 with a shallow junction depth are formed (see FIG. 3C). Note that although phosphorus or arsenic is added here so that an n-channel transistor is formed, an impurity element such as boron (B) or aluminum (Al) may be added in the case of forming a p-channel transistor. Note also that the channel formation region 116 is formed in the semiconductor region 104 under the gate insulating layer 108a by formation of the impurity regions 114 (see FIG. 3C). Here, the concentration of the added impurity can be set as appropriate; in the case where a semiconductor element is highly miniaturized, the concentration is preferably set to be high. Further, a process in which the insulating layer 112 is formed after formation of the impurity regions 114 may be employed instead of the process employed here in which the impurity regions 114 are formed after formation of the insulating layer 112.

Figure 3G:
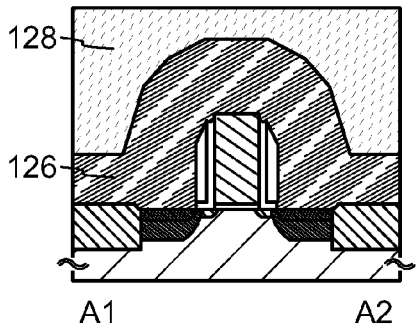
Figure 3D:
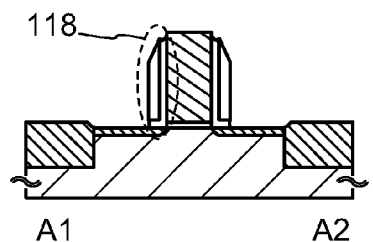

Then, the sidewall insulating layers 118 are formed (see FIG. 3D). An insulating layer is formed so as to cover the insulating layer 112 and then is subjected to highly anisotropic etching, whereby the sidewall insulating layers 118 can be formed in a self-aligned manner. It is preferable that the insulating layer 112 be partly etched at this time so that a top surface of the gate electrode 110a and top surfaces of the impurity regions 114 are exposed.

After that, an insulating layer is formed so as to cover the gate electrode 110a, the impurity regions 114, the side wall insulating layers 118, and the like. Phosphorus (P), arsenic (As), or the like is then added to regions which are in contact with the impurity regions 114, whereby the high-concentration impurity regions 120 are formed (see FIG. 3E). Next, the above insulating layer is removed and a metal layer 122 is formed so as to cover the gate electrode 110a, the sidewall insulating layers 118, the high-concentration impurity regions 120, and the like (see FIG. 3E). Any of a variety of film formation methods such as a vacuum evaporation method, a sputtering method, and a spin coating method is applicable to formation of the metal layer 122. It is preferable that the metal layer 122 be formed using a metal material that reacts with a semiconductor material included in the semiconductor region 104 so as to form a metal compound having low resistance. Examples of such a metal material include titanium, tantalum, tungsten, nickel, cobalt, and platinum.

Next, heat treatment is performed, whereby the metal layer 122 reacts with the semiconductor material. Accordingly, the metal compound regions 124 which are in contact with the high-concentration impurity regions 120 are formed (see FIG. 3F). Note that, in the case of using polycrystalline silicon for the gate electrode 110a, a portion of the gate electrode 110a which is in contact with the metal layer 122 also has the metal compound region.

As the heat treatment, irradiation with a flash lamp can be employed. Although it is needless to say that another heat treatment method may be used, a method by which heat treatment for an extremely short time can be achieved is preferably used in order to improve the controllability of chemical reaction in formation of the metal compound. Note that the metal compound regions 124 are formed through reaction of the metal material with the semiconductor material and have sufficiently high conductivity. By formation of the metal compound regions 124, electric resistance can be sufficiently reduced and element characteristics can be improved. The metal layer 122 is removed after formation of the metal compound regions 124.

The interlayer insulating layers 126 and 128 are formed so as to cover the components formed in the above steps (see FIG. 3G). The interlayer insulating layers 126 and 128 can be formed using a material containing an inorganic insulating material such as silicon oxide, silicon nitride oxide, silicon nitride, hafnium oxide, aluminum oxide, or tantalum oxide. Alternatively, an organic insulating material such as polyimide or acrylic can be used. Note that although the interlayer insulating layer 126 and the interlayer insulating layer 128 have a two-layer structure here, the structure of the interlayer insulating layers is not limited to this. A surface of the interlayer insulating layer 128 is preferably subjected to CMP, etching, or the like so as to be flattened after the interlayer insulating layer 128 is formed.

Figure 3H:
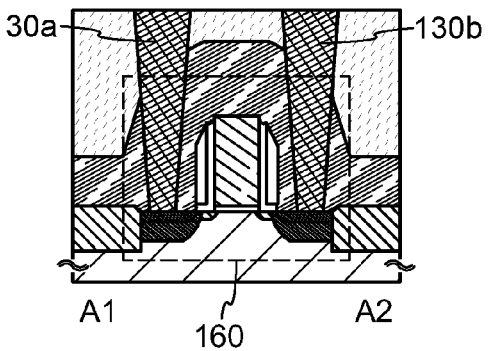

After that, openings reaching the metal compound regions 124 are formed in the interlayer insulating layers, and then the source or drain electrode 130a and the source or drain electrode 130b are formed in the openings (see FIG. 3H). For example, the source or drain electrode 130a and the source or drain electrode 130b can be formed as follows: a conductive layer is formed in a region including the openings by a PVD method, a CVD method, or the like; and then, part of the conductive layer is removed by etching, CMP, or the like.

Note that in the case of forming the source or drain electrode 130a and the source or drain electrode 130b by removing part of the conductive layer, surfaces thereof are preferably processed to be flat. For example, in the case where a titanium film, a titanium nitride film, or the like is formed to have a small thickness in the region including the openings and a tungsten film is then formed so as to be embedded in the openings, CMP which is performed after that can remove an unnecessary portion of the tungsten film, titanium film, titanium nitride film, or the like, and improve the flatness of the surfaces. By flattening surfaces including the surfaces of the source or drain electrode 130a and the source or drain electrode 130b as described above, favorable electrodes, wirings, insulating layers, semiconductor layers, or the like can be formed in a subsequent step.

Note that although only the source or drain electrode 130a and the source or drain electrode 130b which are in contact with the metal compound regions 124 are described, an electrode which is in contact with the gate electrode 110a (e.g., the electrode 130c of FIG. 2A) and the like can be formed in the same step. There is no particular limitation on a material used for the source or drain electrode 130a and the source or drain electrode 130b and any of a variety of conductive materials can be used. For example, a conductive material such as molybdenum, titanium, chromium, tantalum, tungsten, aluminum, copper, neodymium, or scandium can be used.

Through the above process, the transistor 160 which uses the substrate 100 containing a semiconductor material is formed. Note that electrodes, wirings, insulating layers, or the like may be formed as well after the above process is performed. When a multilayer wiring structure in which an interlayer insulating layer and a conductive layer are stacked is employed as a wiring structure, a highly-integrated semiconductor device can be provided.

<Method for Manufacturing a Transistor in an Upper Portion>

Next, a process through which the transistor 162 is manufactured over the interlayer insulating layer 128 is described with reference to FIGS. 4A to 4G and FIGS. 5A to 5D. Note that the transistor 160 and the like below the transistor 162 are omitted in FIGS. 4A to 4G and FIGS. 5A to 5D, which illustrate a manufacturing process of a variety of electrodes over the interlayer insulating layer 128, the transistor 162, and the like.

Figure 4A:
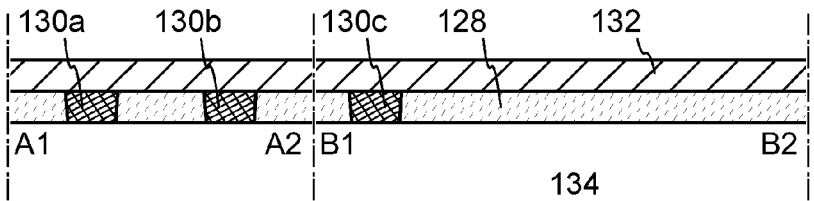
FIGS. 4A to 4G are cross-sectional views each for explaining a manufacturing step of a semiconductor device.
Figure 4B:
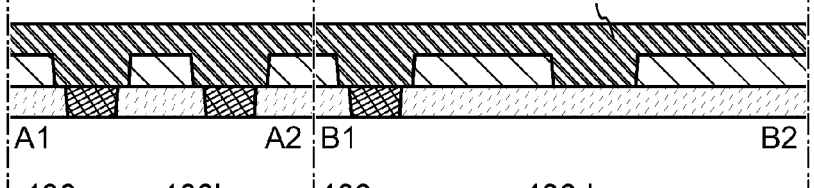

First, the insulating layer 132 is formed over the interlayer insulating layer 128, the source or drain electrode 130*a*, the source or drain electrode 130*b*, and the electrode 130*c* (see FIG. 4A). The insulating layer 132 can be formed by a PVD method, a CVD method, or the like. A material containing an inorganic insulating material such as silicon oxide, silicon nitride oxide, silicon nitride, hafnium oxide, aluminum oxide, or tantalum oxide can be used for the insulating layer 132.

Next, openings reaching the source or drain electrode 130*a*, the source or drain electrode 130*b*, and the electrode 130*c* are formed in the insulating layer 132. At this time, another opening is formed in a region where the gate electrode 136*d* is to be formed. A conductive layer 134 is formed so as to be embedded in the openings (see FIG. 4B). The above openings can be formed by etching with the use of a mask, for example. The mask can be formed by exposure using a photomask, for example. For the etching, either wet etching or dry etching may be performed but dry etching is preferable in view of the fine patterning. The conductive layer 134 can be formed by a film formation method such as a PVD method or a CVD method. Examples of a material for the conductive layer 134 include a conductive material such as molybdenum, titanium, chromium, tantalum, tungsten, aluminum, copper, neodymium, and scandium, an alloy of any of these, and a compound containing any of these (e.g., nitride of any of these).

Specifically, for example, the conductive layer 134 can be formed as follows: a titanium film is formed to have a small thickness by a PVD method in a region including the openings and a titanium nitride film is then formed to have a small thickness by a CVD method; and then, a tungsten film is formed so as to fill the openings. Here, the titanium film formed by a PVD method has a function of reducing formation of an oxide film at an interface with an electrode in a lower portion (here, the source or drain electrode 130*a*, the source or drain electrode 130*b*, the electrode 130*c*, or the like) so that contact resistance with the lower electrode is reduced. In addition, the subsequently formed titanium nitride film has a barrier property such that diffusion of a conductive material is prevented. Further, after a barrier film is formed using titanium, titanium nitride, or the like, a copper film may be formed by a plating method.

Figure 4C:
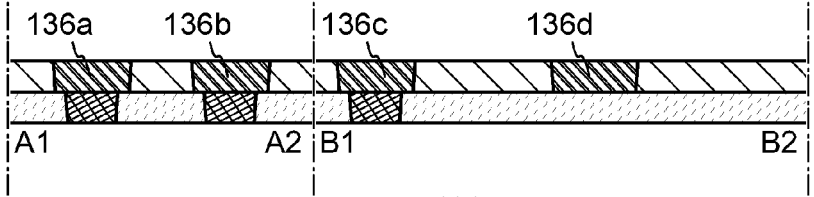

After the conductive layer 134 is formed, part of the conductive layer 134 is removed by etching, CMP, or the like so that the insulating layer 132 is exposed and the electrodes 136*a*, 136*b*, and 136*c*, and the gate electrode 136*d* are formed (see FIG. 4C). Note that when the electrodes 136*a*, 136*b*, and 136*c*, and the gate electrode 136*d* are formed by removing part of the above conductive layer 134, the process is preferably performed so that flattened surfaces are obtained. By flattening surfaces of the insulating layer 132, the electrodes 136*a*, 136*b*, and 136*c*, and the gate electrode 136*d*, favorable electrodes, wirings, insulating layers, semiconductor layers, and the like can be formed in a subsequent step.

Figure 4D:
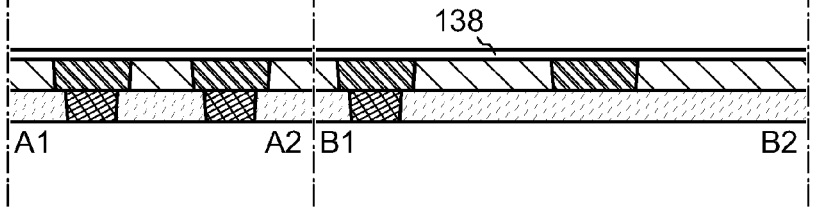

After that, the gate insulating layer 138 is formed so as to cover the insulating layer 132, the electrodes 136*a*, 136*b*, and 136*c*, and the gate electrode 136*d* (see FIG. 4D). The gate insulating layer 138 can be formed by a sputtering method, a CVD method, or the like. The gate insulating layer 138 preferably contains silicon oxide, silicon nitride, silicon oxynitride, silicon nitride oxide, aluminum oxide, hafnium oxide, tantalum oxide, or the like. Note that the gate insulating layer 138 may have a single-layer structure or a stacked-layer structure. For example, the gate insulating layer 138 of silicon oxynitride can be formed by a plasma CVD method using silane ($SiH_4$), oxygen, and nitrogen as source gases. There is no particular limitation on the thickness of the gate insulating layer 138, but the thickness can be greater than or equal to 10 nm and less than or equal to 500 nm, for example. When a stacked-layer structure is employed, the gate insulating layer 138 is preferably formed by stacking a first gate insulating layer with a thickness greater than or equal to 50 nm and less than or equal to 200 nm and a second gate insulating layer with a thickness greater than or equal to 5 nm and less than or equal to 300 nm over the first gate insulating layer.

Note that an oxide semiconductor which is made to be an i-type oxide semiconductor or a substantially i-type oxide semiconductor by removing an impurity (an oxide semiconductor which is highly purified) is extremely sensitive to an interface energy levels or to the electric charges trapping at the interface; therefore, when such an oxide semiconductor is used for an oxide semiconductor layer, an interface between the oxide semiconductor layer and a gate insulating layer is important. In other words, the gate insulating layer 138 which is to be in contact with the highly purified oxide semiconductor layer needs to be of high quality.

For example, a high-density plasma CVD method using microwave (2.45 GHz) is favorable because a dense and high-quality gate insulating layer 138 having high withstand voltage can be formed thereby. In this manner, the density of energy levels at the interface can be reduced and interface characteristics can be favorable when the highly purified oxide semiconductor layer and the high quality gate insulating layer are in contact with each other.

Needless to say, even when such a highly purified oxide semiconductor layer is used, another method such as a sputtering method or a plasma CVD method can be employed as long as an insulating layer having good quality can be formed as the gate insulating layer. Alternatively, an insulating layer whose film quality and interface characteristics are modified by heat treatment after being formed may be applied. In any case, a layer is acceptable which is of good quality as the gate insulating layer 138, and which reduces interface state density between the gate insulating layer and the oxide semiconductor layer so that a good interface is formed.

Moreover, when an impurity is contained in an oxide semiconductor, in the bias temperature test (the BT test) at a temperature of 85° C. for 12 hours with electric field strength of $2\times10^6$ V/cm, bond between impurities and the main components of the oxide semiconductor are cut by a strong electric field (B: bias) and a high temperature (T: temperature), and generated dangling bonds lead to a drift in the threshold voltage ($V_{th}$).

On the other hand, a transistor which is stable even in the BT test can be provided by removing impurities in the oxide semiconductor, especially hydrogen or water, and realizing good interface characteristics between the gate insulating layer and the oxide semiconductor layer as described above.

Figure 4E:
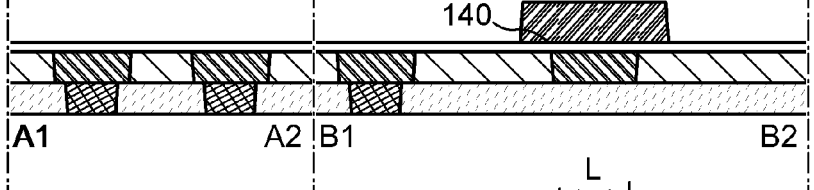

Then, an oxide semiconductor layer is formed over the gate insulating layer 138 and processed by a method such as etching using a mask so that the oxide semiconductor layer 140 having an island-shape is formed (see FIG. 4E).

As the oxide semiconductor layer, an oxide semiconductor layer formed using any of the following materials can be applied: four-component metal oxides such as In—Sn—Ga—Zn—O; three-component metal oxides such as In—Ga—Zn—O, In—Sn—Zn—O, In—Al—Zn—O, Sn—Ga—Zn—O, Al—Ga—Zn—O, and Sn—Al—Zn—O; two-component metal oxides such as In—Zn—O, Sn—Zn—O, Al—Zn—O, Zn—Mg—O, Sn—Mg—O, and In—Mg—O; single-component metal oxides such as In—O, Sn—O, and Zn—O. In addition, the above oxide semiconductor materials may contain $SiO_2$.

As the oxide semiconductor layer, a thin film represented by $InMO_3 (ZnO)_m$ (m>0) can be used. Here, M represents one or more metal elements selected from Ga, Al, Mn, and Co. For example, M can be Ga, Ga and Al, Ga and Mn, Ga and Co, or the like. An oxide semiconductor film which represented by $InMO_3 (ZnO)_m$ (m>0), which includes Ga as M, is referred to as an In—Ga—Zn—O-based oxide semiconductor, and a thin film of the In—Ga—Zn—O-based oxide semiconductor is referred to as an In—Ga—Zn—O-based oxide semiconductor film (an In—Ga—Zn—O-based amorphous film).

In this embodiment, as the oxide semiconductor layer, an amorphous oxide semiconductor layer is formed by a sputtering method with the use of an In—Ga—Zn—O-based oxide semiconductor target for film formation. Note that by adding silicon to the amorphous oxide semiconductor layer, crystallization can be suppressed; therefore, the oxide semiconductor layer may be formed using a target which contains $SiO_2$ at greater than or equal to 2 wt. % and less than or equal to 10 wt. %.

As a target for forming the oxide semiconductor layer by a sputtering method, a metal oxide containing zinc oxide as a main component can be used, for example. As the oxide semiconductor target for film formation containing In, Ga, and Zn, a target having a composition ratio of $In_2O_3:Ga_2O_3:ZnO=1:1:1$ (molar ratio) or the like can also be used. Alternatively, as the oxide semiconductor target for film formation containing In, Ga, and Zn, a target having a composition ratio of $In_2O_3:Ga_2O_3:ZnO=1:1:2$ (molar ratio) or a target having a composition ratio of $In_2O_3:Ga_2O_3:ZnO=1:1:4$ (molar ratio) can be used. The filling rate of the oxide semiconductor target for film formation is greater than or equal to 90% and less than or equal to 100%, preferably greater than or equal to 95% (e.g., 99.9%). By using an oxide semiconductor target for film formation whose filling rate is high, a dense oxide semiconductor layer is formed.

An atmosphere for formation of the oxide semiconductor layer is preferably a rare gas (typically argon) atmosphere, an oxygen atmosphere, or a mixed atmosphere of a rare gas (typically argon) and oxygen. Specifically, a high-purity gas, in which the concentration of impurities such as hydrogen, water, hydroxyl, and hydride is reduced to a concentration of approximately several parts per million (and even better, to several parts per billion), is preferable.

At the time of forming the oxide semiconductor layer, the substrate is placed in a treatment chamber which is kept in a reduced-pressure state and the substrate temperature is higher than or equal to 100° C. and lower than or equal to 600° C., preferably, higher than or equal to 200° C. and lower than or equal to 400° C. By forming the oxide semiconductor layer while the substrate is heated, the concentration of impurities contained in the oxide semiconductor layer can be reduced. In addition, damage due to sputtering is reduced. While moisture remaining in the treatment chamber is removed, a sputtering gas from which hydrogen and moisture are removed is introduced, and the oxide semiconductor layer is formed with use of metal oxide as a target. In order to remove remaining moisture in the treatment chamber, a sorption vacuum pump is preferably used. A cryopump, an ion pump, or a titanium sublimation pump can be used. The evacuation unit may be a turbo pump provided with a cold trap. A hydrogen atom, a compound containing a hydrogen atom, such as water ($H_2O$) (and also preferably a compound containing a carbon atom), or the like is removed from the deposition chamber while reduced pressure is maintained with the cryopump, thereby reducing the concentration of impurities contained in the oxide semiconductor layer formed in the deposition chamber.

For example, the film formation conditions can be set as follows: the distance between a substrate and a target is 100 mm; the pressure is 0.6 Pa; the direct-current (DC) power is 0.5 kW; and the atmosphere is an oxygen atmosphere (the proportion of the oxygen flow rate is 100%). It is preferable that a pulsed direct-current (DC) power supply be used because powder substances (also referred to as particles or dust) can be reduced and the film thickness can be uniform. The thickness of the oxide semiconductor layer is greater than or equal to 2 nm and less than or equal to 200 nm, preferably greater than or equal to 5 nm and less than or equal to 30 nm. Note that an appropriate thickness depends on an applied oxide semiconductor material, and the thickness of the oxide semiconductor layer may be set as appropriate depending on the material.

Note that before the oxide semiconductor layer is formed by a sputtering method, dust attached to a surface of the gate insulating layer 138 is preferably removed by reverse sputtering in which an argon gas is introduced and plasma is generated. Here, the reverse sputtering means a method for improving the quality of a surface of the object to be processed by ions striking on the surface, while general sputtering is achieved by ions striking on a sputtering target. Methods for making ions strike the surface of the object to be processed include a method in which a high frequency voltage is applied on the surface in an argon atmosphere and plasma is generated in the vicinity of the substrate. Note that a nitrogen atmosphere, a helium atmosphere, an oxygen atmosphere, or the like may be used instead of the argon atmosphere.

For the etching of the oxide semiconductor layer, either dry etching or wet etching may be used. Needless to say, a combination of dry etching and wet etching may be employed. The etching conditions (an etching gas, etching solution, etching time, temperature, or the like) are set as appropriate, depending on the material so that the oxide semiconductor layer can be etched into a desired shape.

Examples of the etching gas for dry etching are a gas containing chlorine (a chlorine-based gas such as chlorine ($Cl_2$), boron trichloride ($BCl_3$), silicon tetrachloride ($SiCl_4$), or carbon tetrachloride ($CCl_4$)) and the like. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like may be used.

As a dry etching method, a parallel plate reactive ion etching (RIE) method or an inductively coupled plasma (ICP) etching method can be used. In order to etch the layer into a desired shape, the etching conditions (the amount of electric power applied to a coil-shaped electrode, the amount of electric power applied to an electrode on a substrate side, the temperature of the electrode on the substrate side, or the like) are set as appropriate.

As an etchant used for wet etching, a mixed solution of phosphoric acid, acetic acid, and nitric acid, an ammonia hydrogen peroxide solution (31 wt % hydrogen peroxide in water: 28 wt % ammonia water:water=5:2:2), or the like can be used. Alternatively, ITO07N (manufactured by Kanto Chemical Co., Inc.) or the like may be used.

Then, the oxide semiconductor layer is preferably subjected to first heat treatment. By this first heat treatment, the oxide semiconductor layer can be dehydrated or dehydrogenated. The first heat treatment is performed at a temperature higher than or equal to 300° C. and lower than or equal to 750° C., preferably, higher than or equal to 400° C. and lower than the strain point of the substrate. For example, the substrate is introduced into an electric furnace using a resistance heating element or the like and the oxide semiconductor layer 140 is subjected to heat treatment in a nitrogen atmosphere at a temperature of 450° C. for one hour. During this time, the oxide semiconductor layer 140 is prevented from being exposed to the air so that entry of water or hydrogen is prevented.

Note that a heat treatment apparatus is not limited to an electrical furnace, and may include a device for heating an object to be processed by heat conduction or heat radiation given by a medium such as a heated gas or the like. For example, a rapid thermal anneal (RTA) apparatus such as a lamp rapid thermal anneal (LRTA) apparatus or a gas rapid thermal anneal (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, as the first heat treatment, GRTA may be performed as follows. The substrate is placed in an inert gas which has been heated to a high temperature of 650° C. to 700° C., heated for several minutes, and taken out from the inert gas. GRTA enables high-temperature heat treatment for a short time. In addition, such heat treatment is applicable even when a temperature exceeds the strain point of the substrate because it takes only a short time.

Note that the first heat treatment is preferably performed in an atmosphere which contains nitrogen or a rare gas (e.g., helium, neon, or argon) as its main component and does not contain water, hydrogen, or the like. For example, the purity of nitrogen or a rare gas (e.g., helium, neon, or argon) introduced into the heat treatment apparatus is greater than or equal to 6 N (99.9999%), preferably greater than or equal to 7 N (99.99999%) (that is, the concentration of impurities is less than or equal to 1 ppm, preferably less than or equal to 0.1 ppm).

In some cases, the oxide semiconductor layer might be crystallized to be a microcrystalline layer or a polycrystalline layer depending on the condition of the first heat treatment or the material of the oxide semiconductor layer. For example, the oxide semiconductor layer may be crystallized to become a microcrystalline oxide semiconductor layer having a degree of crystallization of greater than or equal to 90%, or greater than or equal to 80%. Further, depending on the condition of the first heat treatment or the material of the oxide semiconductor layer, the oxide semiconductor layer may become an amorphous oxide semiconductor layer containing no crystalline component.

The oxide semiconductor layer might become an oxide semiconductor layer in which a crystal (with a grain diameter greater than or equal to 1 nm and less than or equal to 20 nm, typically greater than or equal to 2 nm and less than or equal to 4 nm) is mixed in an amorphous oxide semiconductor (e.g. at a surface of the oxide semiconductor layer).

In addition, electric characteristics of the oxide semiconductor layer can be changed by providing a crystal layer over the amorphous surface of the oxide semiconductor layer. For example, in the case of forming the oxide semiconductor layer with the use of an In—Ga—Zn—O-based oxide semiconductor target for the film formation, the electric characteristics of the oxide semiconductor layer can be changed by forming a crystal portion represented by $In_2Ga_2ZnO_7$ in which a crystal grains are aligned and which exhibits electrical anisotropy.

More specifically, for example, by aligning the crystal grain in such a manner that the c-axis of $In_2Ga_2ZnO_7$ is oriented in a direction perpendicular to a surface of the oxide semiconductor layer, conductivity in a direction parallel to the surface of the oxide semiconductor is improved, and an insulating property in the direction perpendicular to the surface of the oxide semiconductor layer can be increased. Further, such a crystal portion has a function of suppressing entry of an impurity such as water or hydrogen into the oxide semiconductor layer.

Note that the above oxide semiconductor layer which includes the crystal portion can be formed by heating a surface of the oxide semiconductor layer by GRTA. When a sputtering target in which the amount of Zn is smaller than that of In or Ga is used, more favorable formation can be achieved.

The first heat treatment performed on the oxide semiconductor layer 140 can be performed on the oxide semiconductor layer which has not yet been processed into the island-shaped layer. In that case, after the first heat treatment, the substrate is taken out of the heating apparatus and a photolithography step is performed.

Note that the above heat treatment can dehydrate or dehydrogenate the oxide semiconductor layer 140 and thus can be called dehydration treatment or dehydrogenation treatment. It is possible to perform such dehydration treatment or dehydrogenation treatment at any timing, for example, after the oxide semiconductor layer is formed, after the source or drain electrodes are stacked over the oxide semiconductor layer 140, or after a protective insulating layer is formed over the source or drain electrodes. Such dehydration treatment or dehydrogenation treatment may be performed more than once.

Figure 4F:
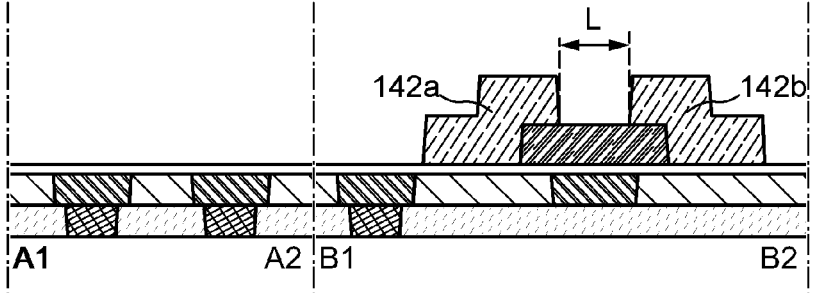

Next, the source or drain electrode 142a and the source or drain electrode 142b are formed in contact with the oxide semiconductor layer 140 (see FIG. 4F). The source or drain electrode 142a and the source or drain electrode 142b can be formed in such a manner that a conductive layer is formed so as to cover the oxide semiconductor layer 140 and then selectively etched.

The conductive layer can be formed by a PVD method such as a sputtering method, a CVD method such as a plasma CVD method. As a material of the conductive layer, an element selected from aluminum, chromium, copper, tantalum, titanium, molybdenum, and tungsten, an alloy containing any of the above elements as its component, or the like can be used. Further, a material containing one or more elements selected from manganese, magnesium, zirconium, beryllium, and thorium as a component may be used. A material in which aluminum and one or more elements selected from titanium, tantalum, tungsten, molybdenum, chromium, neodymium, and scandium are combined is also applicable for the material of the conductive layer.

Alternatively, the conductive layer may be formed using conductive metal oxide. As conductive metal oxide, indium oxide ($In_2O_3$), tin oxide ($SnO_2$), zinc oxide (ZnO), indium oxide-tin oxide alloy ($In_2O_3$—$SnO_2$, which is abbreviated to ITO in some cases), indium oxide-zinc oxide alloy ($In_2O_3$—ZnO), or any of these metal oxide materials in which silicon or silicon oxide is contained can be used.

The conductive layer may have either a single-layer structure or a stacked-layer structure of two or more layers. For example, a single-layer structure of an aluminum film containing silicon, a two-layer structure of an aluminum film and a titanium film stacked thereover, a three-layer structure in which a titanium film, an aluminum film, and a titanium film are stacked in this order, and the like can be given.

Here, ultraviolet rays, a KrF laser beam, or an ArF laser beam are preferably used for exposure for forming an etching mask.

The channel length (L) of the transistor is determined by a distance between a lower edge portion of the source or drain electrode 142a over the oxide semiconductor layer 140 and a lower edge portion of the source or drain electrode 142b over the oxide semiconductor layer 140, as shown in FIG. 4E. In the case where exposure for a pattern in which the channel length (L) is less than 25 nm, exposure for making a mask is performed in the extreme ultraviolet range of several nanometers to several tens of nanometers which is extremely short wavelength. In the exposure using extreme ultraviolet light, the resolution is high and the focus depth is large. Therefore, the channel length (L) of the transistor to be formed later can be greater than or equal to 10 nm and less than or equal to 1000 nm, whereby operation speed of a circuit can be increased. Further, off-state current of the transistor is extremely small, which prevents increase in power consumption.

Materials of the layers and etching conditions are adjusted as appropriate so that the oxide semiconductor layer 140 is not removed when the conductive layer is etched. Note that in some cases, the oxide semiconductor layer 140 is partly etched in this step so as to be an oxide semiconductor layer having a groove (a depressed portion) depending on the materials and etching conditions.

An oxide conductive layer may be formed between the oxide semiconductor layer 140 and the source or drain electrode 142a, and between the oxide semiconductor layer 140 and the source or drain electrode 142b. An oxide conductive layer and the conductive layer for forming the source or drain electrode 142a and the source or drain electrode 142b can be formed in immediate succession (successive deposition). The oxide conductive layer can function as a source region or a drain region. By providing such an oxide conductive layer, resistance of the source and drain regions can be reduced and high-speed operation of the transistor can be realized.

In order to reduce the number of the masks and steps, etching may be performed with the use of a resist mask formed using a multi-tone mask which is a light-exposure mask through which light is transmitted so as to have a plurality of intensities. A resist mask formed with the use of a multi-tone mask has a shape with a plurality of thicknesses (a step-like shape) and further can be changed in shape by ashing; therefore, the resist mask can be used in a plurality of etching steps for processing into different patterns. That is, a resist mask corresponding to at least two or more kinds of different patterns can be formed by one multi-tone mask. Thus, the number of light-exposure masks can be reduced and the number of corresponding photolithography steps can be also reduced, whereby simplification of a process can be realized.

Note that plasma treatment using a gas such as $N_2O$, $N_2$, or Ar is preferably performed after the above step. By this plasma treatment, water attached to a surface of the oxide semiconductor layer which is exposed is removed. Alternatively, plasma treatment may be performed using a gas containing oxygen such as a mixed gas of oxygen and argon. In this manner, the oxide semiconductor layer is supplied with oxygen and defects resulted from oxygen deficiency can be reduced.

Figure 4G:
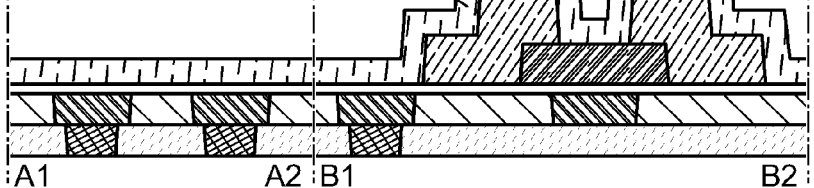

After that, the protective insulating layer 144 which is in contact with part of the oxide semiconductor layer 140 is formed without exposure to the air (see FIG. 4G).

The protective insulating layer 144 can be formed by appropriately employing a method such as a sputtering method, by which an impurity such as water or hydrogen is prevented from entering the protective insulating layer 144. The protective insulating layer 144 is formed to a thickness greater than or equal to 1 nm. As a material which can be used for the protective insulating layer 144, there are silicon oxide, silicon nitride, silicon oxynitride, silicon nitride oxide, and the like. The protective insulating layer 144 may have a single-layer structure or a stacked structure. The substrate temperature for formation of the protective insulating layer 144 is preferably higher than or equal to room temperature and lower than or equal to 300° C. The atmosphere for formation of the protective insulating layer 144 is preferably a rare gas (typically argon) atmosphere, an oxygen atmosphere, or a mixed atmosphere of a rare gas (typically argon) and oxygen.

Presence of hydrogen in the protective insulating layer 144 causes entry of the hydrogen to the oxide semiconductor layer, extraction of oxygen in the oxide semiconductor layer by the hydrogen, or the like, and the resistance of the backchannel side of the oxide semiconductor layer is made low, which may form a parasitic channel. Therefore, it is important that a formation method in which hydrogen is not used is employed so that the protective insulating layer 144 contains as little hydrogen as possible.

In addition, it is preferable that the protective insulating layer 144 be formed while remaining moisture in the treatment chamber is removed. This is for preventing hydrogen, hydroxyl, or water from being contained in the oxide semiconductor layer 140 and the protective insulating layer 144.

In order to remove remaining moisture in the treatment chamber, a sorption vacuum pump is preferably used. A cryopump, an ion pump, or a titanium sublimation pump is preferably used. The evacuation unit may be a turbo pump provided with a cold trap. A hydrogen atom, a compound containing a hydrogen atom, such as water ($H_2O$), or the like is removed from the deposition chamber which is evacuated with the cryopump, thereby reducing the concentration of impurities contained in the protective insulating layer 144 formed in the deposition chamber.

As a sputtering gas used in formation of the protective insulating layer 144, a high-purity gas from which an impurity such as hydrogen, water, hydroxyl, or hydride is reduced to a concentration of approximately several parts per million (preferably several parts per billion) is preferably used.

Next, second heat treatment (preferably at a temperature higher than or equal to 200° C. and lower than or equal to 400° C., for example, higher than or equal to 250° C. and lower than or equal to 350° C.) in an inert gas atmosphere or an oxygen atmosphere is preferably performed. For example, the second heat treatment is performed in a nitrogen atmosphere at 250° C. for one hour. The second heat treatment can reduce variation in the electric characteristics of the thin film transistor. Further, the oxide semiconductor layer can be supplied with oxygen by the second heat treatment.

Further, an additional heat treatment may be performed at a temperature higher than or equal to 100° C. and lower than or equal to 200° C. for one hour or more and 30 hours or less in the air. This heat treatment may be performed at a fixed temperature. Alternatively, the following temperature cycle may be applied plural times repeatedly: the temperature is increased from room temperature to a temperature higher than or equal to 100° C. and lower than or equal to 200° C. and then decreased to room temperature. Further, this heat treatment may be performed under a reduced pressure before formation of the protective insulating layer. The reduced pressure allows the heat treatment time to be short. Note that this heat treatment may be performed instead of the second heat treatment; alternatively, this heat treatment may be performed before and/or after the second heat treatment is performed.

Figure 5A:
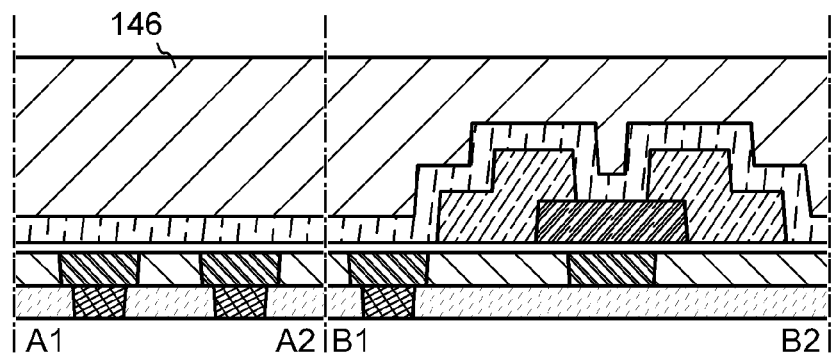
FIGS. 5A to 5D are cross-sectional views each for explaining a manufacturing step of a semiconductor device.

Then, the interlayer insulating layer 146 is formed over the protective insulating layer 144 (see FIG. 5A). The interlayer insulating layer 146 can be formed by a PVD method, a CVD method, or the like. A material containing an inorganic insulating material such as silicon oxide, silicon nitride oxide, silicon nitride, hafnium oxide, aluminum oxide, or tantalum oxide can be used for the interlayer insulating layer 146. Further, a surface of the interlayer insulating layer 146 is preferably subjected to CMP, etching, or the like so as to be flattened after the interlayer insulating layer 146 is formed.

Figure 5B:
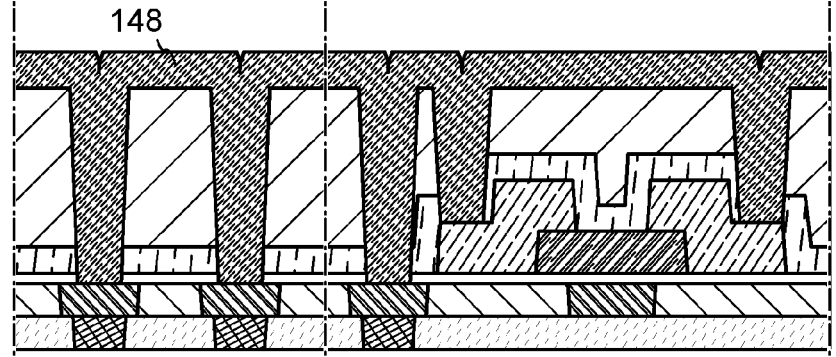

Next, openings reaching the electrodes 136*a*, 136*b*, and 136*c*, the source or drain electrode 142*a*, and the source or drain electrode 142*b* are formed in the interlayer insulating layer 146, the protective insulating layer 144, and the gate insulating layer 138; then, a conductive layer 148 is formed so as to fill the openings (see FIG. 5B). The above openings can be formed by etching with the use of a mask, for example. The mask can be formed by exposure using a photomask, for example. For the etching, either wet etching or dry etching may be performed but dry etching is preferable in view of the fine patterning. The conductive layer 148 can be formed by a film formation method such as a PVD method or a CVD method. Examples of a material for the conductive layer 148 include a conductive material such as molybdenum, titanium, chromium, tantalum, tungsten, aluminum, copper, neodymium, and scandium, an alloy of any of these, and a compound containing any of these (e.g., nitride of any of these).

Specifically, for example, the conductive layer 148 can be formed as follows: a titanium film is formed to have a small thickness by a PVD method in a region including the openings and a titanium nitride film is then formed to have a small thickness by a CVD method; and then, a tungsten film is formed so as to fill the openings. Here, the titanium film formed by a PVD method has a function of reducing an oxide film at an interface with an electrode in a lower portion (here, the electrodes 136*a*, 136*b*, and 136*c*, the source or drain electrode 142*a*, the source or drain electrode 142*b*, or the like), so that contact resistance with the electrode in a lower portion is reduced. In addition, the subsequently formed titanium nitride film has a barrier property such that diffusion of a conductive material is prevented. Further, after a barrier film is formed using titanium, titanium nitride, or the like, a copper film may be formed by a plating method.

Figure 5C:
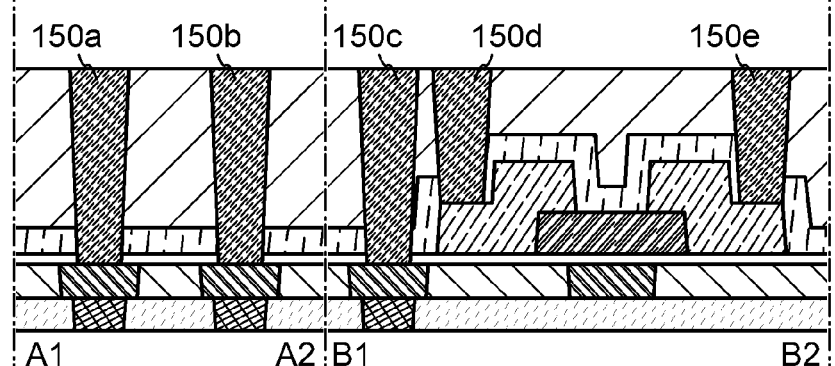
Figure 5D:
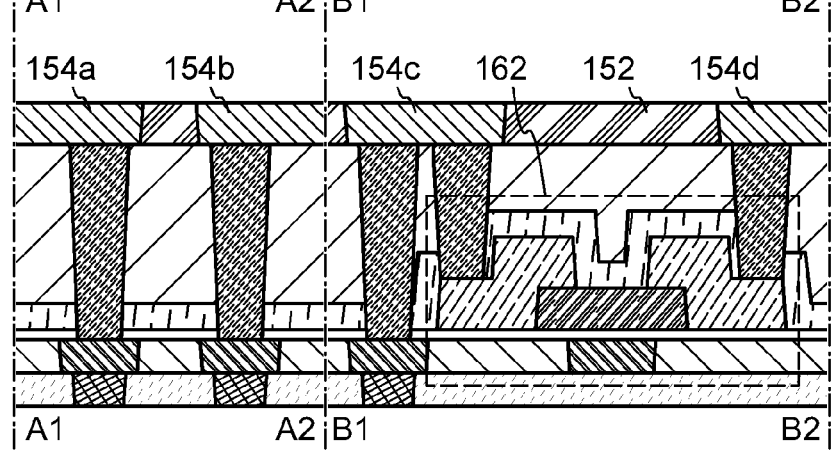

After the conductive layer 148 is formed, part of the conductive layer 148 is removed by etching, CMP, or the like so that the interlayer insulating layer 146 is exposed and the electrodes 150*a*, 150*b*, 150*c*, 150*d* and 150*e* are formed (see FIG. 5C). Note that when the electrodes 150*a*, 150*b*, 150*c*, 150*d* and 150*e* are formed by removing part of the above conductive layer 148, processing is preferably performed to obtain flattened surfaces. By flattening surfaces of the interlayer insulating layer 146 and the electrodes 150*a*, 150*b*, 150*c*, 150*d* and 150*e*, electrodes, wirings, insulating layers, semiconductor layers, and the like can be favorably formed in a later step.

Further, the insulating layer 152 is formed and openings reaching the electrodes 150*a*, 150*b*, 150*c*, 150*d* and 150*e* are formed in the insulating layer 152; then, a conductive layer is formed so as to fill the openings. After that, part of the conductive layer is removed by etching, CMP, or the like so that the insulating layer 152 is exposed and the electrodes 154*a*, 154*b*, 154*c*, and 154*d* are formed (see FIG. 5D). This step is similar to that of forming the electrode 150*a* and the like; therefore, detailed description is omitted here.

When the transistor 162 is manufactured in the above-described manner, the hydrogen concentration of the oxide semiconductor layer 140 is less than or equal to $5\times10^{19}/cm^3$ and off-state current of the transistor 162 is less than or equal to $1\times10^{-13}$ A. Thus, the transistor 162 having excellent characteristics can be obtained by employing the highly purified oxide semiconductor layer 140 in which the hydrogen concentration is sufficiently reduced and defects resulted from oxygen deficiency are reduced. In addition, a semiconductor device having excellent characteristics which includes the transistor 160 using a material other than an oxide semiconductor in a lower portion and the transistor 162 using an oxide semiconductor in an upper portion can be manufactured.

Note that although many researches on a physical property of density of state (DOS) or the like in an oxide semiconductor have been conducted, they do not suggest an idea of substantially reducing density of localized energy levels in an energy gap. In one embodiment of the disclosed invention, water or hydrogen which induces localized energy levels is removed from an oxide semiconductor, whereby a highly purified oxide semiconductor is manufactured. This is based on an idea of substantially reducing localized energy levels and realizing manufacture of excellent industrial products.

Note that when hydrogen, water, or the like is removed, oxygen is also removed in some cases. Therefore, it is favorable that an oxide semiconductor be further purified (made to be an i-type oxide semiconductor) by supplying oxygen to dangling bonds of metal which are generated by oxygen deficiency so that localized energy levels resulting from oxygen deficiency are reduced. For example, localized states resulted from oxygen deficiency can be reduced in the following manner: an oxide film having oxygen in excess is formed in close contact with a channel formation region; and heat treatment at 200° C. to 400° C., typically, approximately 250° C., is performed so that oxygen is supplied to the oxide semiconductor from the oxide film. Further, an inert gas may be changed to a gas containing oxygen during the second heat treatment. An oxide semiconductor can be supplied with oxygen by being subjected to a temperature decreasing step in an oxygen atmosphere or an atmosphere from which hydrogen, water, or the like is sufficiently reduced, after the second heat treatment.

It can be considered that a factor of deterioration of characteristics of an oxide semiconductor is a shallow level resulted from excessive hydrogen at 0.1 eV to 0.2 eV below the conduction band, a deep level resulted from oxygen deficiency, or the like. A technical idea of thoroughly removing hydrogen and sufficiently supplying oxygen in order to correct these defects ought to be valid.

In the disclosed invention, since an oxide semiconductor is highly purified, carrier concentration of the oxide semiconductor is sufficiently low.

With the use of Fermi-Dirac distribution function at normal temperature, intrinsic carrier density of an oxide semiconductor having an energy gap at 3.05 eV to 3.15 eV is $1 \times 10^{-7}/cm^3$, which is much lower than intrinsic carrier density of $1.45 \times 10^{10}/cm^3$ of silicon.

Accordingly, the number of holes that are minority carriers is extremely small. Leakage current of an insulated gate field effect transistor (IGFET) in an off-state with less than or equal to 100 aA/μm at normal temperature, preferably, less than or equal to 10 aA/μm, or more preferably less than or equal to 1 aA/μm can be realized. Note that "1 aA/μm" means that flowing current per micrometer of channel width of a transistor is 1 aA ($1 \times 10^{-18}$ A).

In fact, SiC (3.26 eV), GaN (3.42 eV), and the like are known as semiconductors having a wide energy gap greater than or equal to 3 eV. Transistor characteristics similar to the above described characteristics are expected to be obtained with the use of these semiconductors. However, it is practically impossible to form a thin film of these semiconductor materials because they need a process temperature higher than or equal to 1500° C. In addition, the process temperature is so high that these materials cannot be stacked in three dimensions over a silicon integrated circuit. On the other hand, an oxide semiconductor can be deposited as a thin film by sputtering at room temperature to 400° C. and can be dehydrated or dehydrogenated (removal of hydrogen or water from an oxide semiconductor layer) and supplied with oxygen (supply of oxygen to an oxide semiconductor layer) at 450° C. to 700° C.; thus, an oxide semiconductor can be stacked in three dimensions over a silicon integrated circuit.

Note that although an oxide semiconductor generally has n-type conductivity, in one embodiment of the disclosed invention, an oxide semiconductor is made to be an i-type oxide semiconductor by removing an impurity such as water or hydrogen and supplying oxygen that is a component of the oxide semiconductor. From this aspect, different from the case of silicon which is made to be an i-type silicon by adding an impurity, one embodiment of the disclosed invention includes a novel technical idea.

Note that in this embodiment, the case where the transistor 162 using the oxide semiconductor is a bottom gate type is described; however, the present invention is not limited thereto. The structure of the transistor 162 may be a top gate type or a dual gate type. A dual gate type transistor refers to a transistor including two gate electrodes formed above and below a channel region with a gate insulating layer interposed therebetween.

<Electrical Conduction Mechanism of Transistor Using Oxide Semiconductor>

Here, the electrical conduction mechanism of the transistor using an oxide semiconductor is described with reference to FIG. 6, FIG. 7, FIGS. 8A and 8B, and FIG. 9. Note that the description below is only consideration and the effect of one embodiment of the disclosed invention is not denied thereby.

Figure 6:
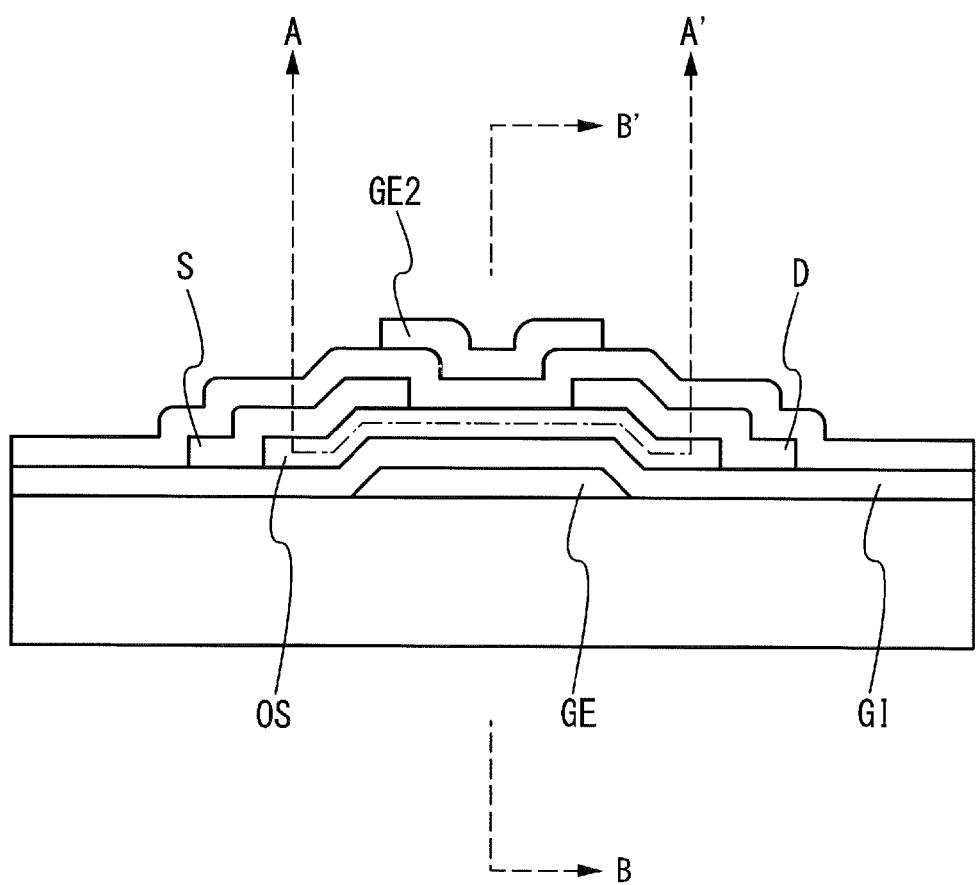
FIG. 6 is a cross-sectional view of a transistor formed using an oxide semiconductor.

FIG. 6 is a cross-sectional view illustrating a dual gate type transistor (a thin film transistor) using an oxide semiconductor. An oxide semiconductor layer (OS) is provided over a gate electrode (GE) with a gate insulating layer (GI) therebetween and a source electrode (S) and a drain electrode (D) are provided thereover. An insulating layer is provided so as to cover the source electrode (S) and the drain electrode (D).

Figure 7:
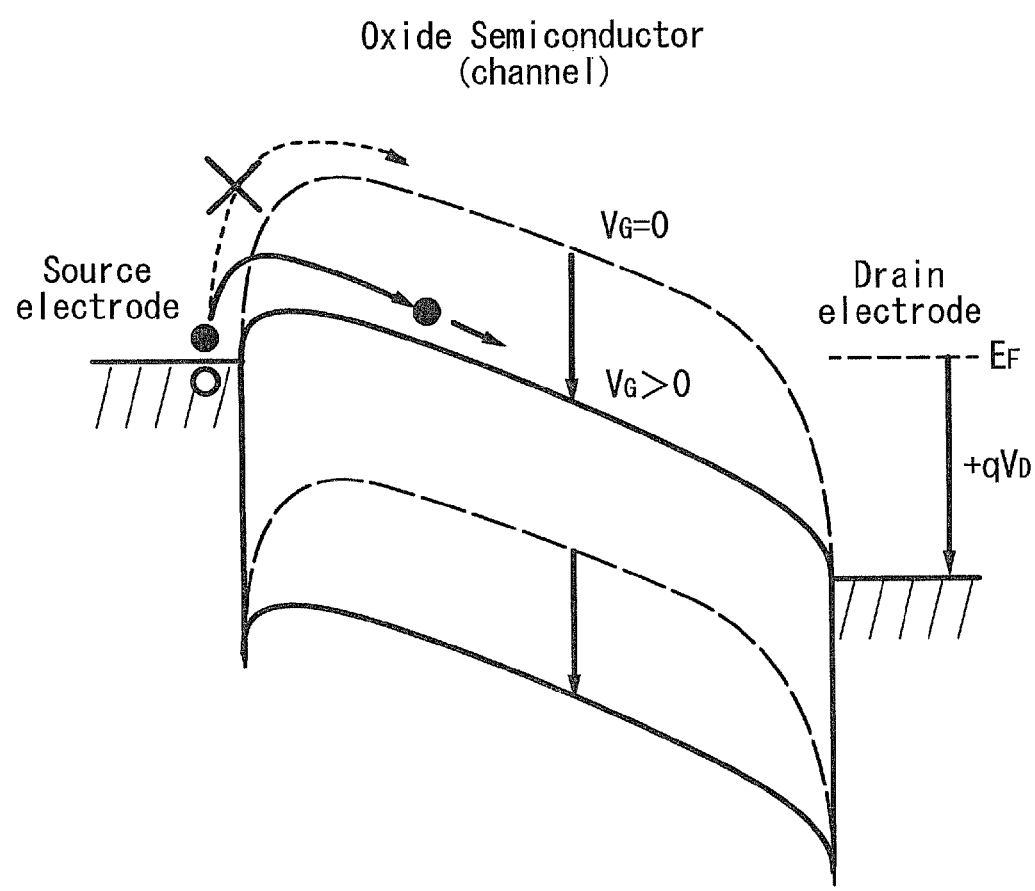
FIG. 7 is an energy band diagram (schematic diagram) along an A-A' section in FIG. 6.

FIG. 7 represents an energy band diagram (schematic view) corresponding to a cross-section taken along line A-A' in FIG. 6. In FIG. 7, a black circle (●) and a white circle (○) represent an electron and a hole and have electric charges (−q, +q), respectively.

With a positive voltage ($V_D > 0$) applied to the drain electrode, the dashed line shows the case where no voltage is applied to the gate electrode ($V_G = 0$) and the solid line shows the case where a positive voltage is applied to the gate electrode ($V_G > 0$). In the case where no voltage is applied to the gate electrode, carriers (electrons) are not injected to the oxide semiconductor side from an electrode because of a high potential barrier, so that a current does not flow, which means an off state. On the other hand, when a positive voltage is applied to the gate electrode, potential barrier is lowered, and thus a current flows, which means an on state.

FIGS. 8A and 8B are energy band diagrams (schematic views) each corresponding to a cross-section taken along line B-B' in FIG. 6. FIG. 8A illustrates an on state in which a positive voltage ($V_G > 0$) is applied to the gate electrode (GE) and carriers (electrons) flow between the source electrode and the drain electrode. FIG. 8B illustrates an off state in which a negative voltage ($V_G < 0$) is applied to the gate electrode (GE) and minority carriers do not flow.

Figure 9:
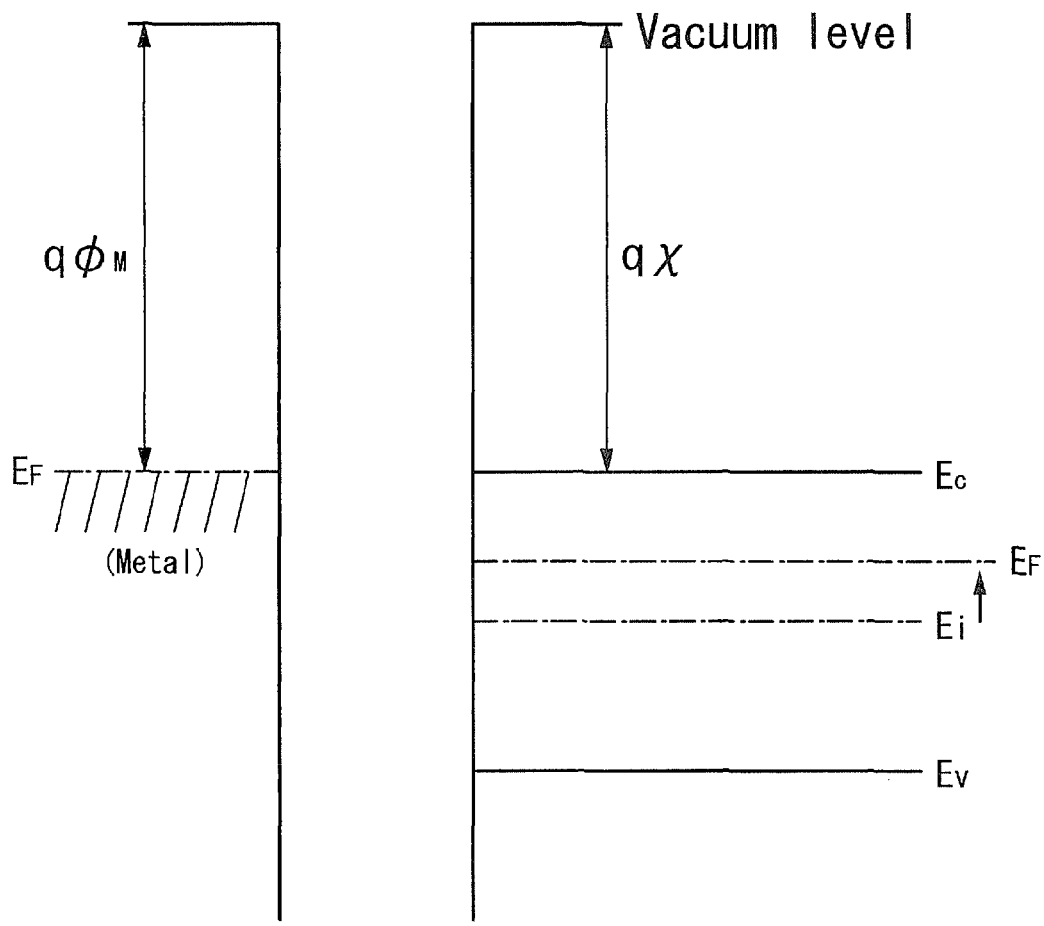
FIG. 9 is a diagram illustrating the relationship between the vacuum level and the electron affinity ($\chi$) of an oxide semiconductor.

FIG. 9 is a diagram illustrating the relationship between the vacuum level and the work function of a metal (ϕM) and the relationship between the vacuum level and the electron affinity (χ) of an oxide semiconductor.

At normal temperature, electrons in the metal are in degenerate states and the Fermi level is located in the conduction band. On the other hand, a conventional oxide semiconductor is an n-type semiconductor, in which the Fermi level ($E_F$) is away from the intrinsic Fermi level ($E_i$) located in the middle of a band gap and is located closer to the conduction band. Note that it is known that hydrogen is a donor in an oxide semiconductor and is one factor causing an oxide semiconductor to be an n-type semiconductor.

On the other hand, an oxide semiconductor according to one embodiment of the disclosed invention is made to be an intrinsic (i-type) or extremely close to an intrinsic oxide semiconductor by removal of hydrogen that is a factor which makes the oxide semiconductor have n-type conductivity so as to be highly purified in such a manner that elements (impurity elements) that are not main components thereof are contained as little as possible. In other words, the oxide semiconductor according to one embodiment of the disclosed invention is not an oxide semiconductor which is made to be an i-type oxide semiconductor by adding an impurity element but an i-type (intrinsic) or almost i-type oxide semiconductor which is highly purified by removing an impurity such as hydrogen or water as much as possible. In this manner, the Fermi level ($E_F$) can be extremely close to the intrinsic Fermi level ($E_i$).

It is said that when a band gap ($E_g$) of an oxide semiconductor is 3.15 eV, electron affinity (χ) thereof is 4.3 eV. The work function of titanium (Ti) contained in the source and drain electrodes is almost equivalent to the electron affinity (χ) of the oxide semiconductor. In that case, at an interface between the metal and the oxide semiconductor, a Schottky barrier against an electron passage is not formed.

At that time, the electron moves in the vicinity of the interface between the gate insulating layer and the highly purified oxide semiconductor (the lowest portion of the oxide semiconductor which is stable in terms of energy) as illustrated in FIG. 8A.

In addition, as illustrated in FIG. 8B, when a negative potential is applied to the gate electrode (GE), the current value is extremely close to zero because holes that are minority carriers are substantially nonexistent.

In such a manner, an intrinsic (i-type) or substantially intrinsic oxide semiconductor is obtained by being highly purified such that an element other than its main element (i.e., an impurity element) is contained as little as possible. Thus, characteristics of the interface between the oxide semiconductor and the gate insulating layer become obvious. For that reason, the gate insulating layer needs to be able to form a favorable interface with the oxide semiconductor. Specifically, it is preferable to use, for example, an insulating layer formed by a CVD method using high-density plasma generated with a power supply frequency in the range of the VHF band to the microwave band, an insulating layer formed by a sputtering method, or the like.

When the oxide semiconductor is highly purified and the interface between the oxide semiconductor and the gate insulating layer is made favorable, in the case where the transistor has a channel width (W) of $1 \times 10^4$ µm and a channel length (L) of 3 µm, for example, it is possible to realize an off-state current of $10^{-13}$ A or less and a sub-threshold swing (S value) of 0.1 V/dec. (with a 100-nm-thick gate insulating layer).

The oxide semiconductor is highly purified as described above so as to contain an element other than its main element (i.e., an impurity element) as little as possible, so that the transistor can operate in a favorable manner.

<Carrier Concentration>

In a technical idea according to the disclosed invention, an oxide semiconductor layer is made as close as possible to an intrinsic (i-type) oxide semiconductor layer by sufficiently reducing carrier concentration thereof. Hereinafter, a method for calculating the carrier concentration and carrier concentration actually measured are described with reference to FIG. 10 and FIG. 11.

First, a method for calculating the carrier concentration is easily explained. The carrier concentration can be calculated in such a manner that an MOS capacitor is manufactured and results of CV measurement (CV characteristics) of the MOS capacitor are evaluated.

Specifically, carrier concentration $N_d$ is calculated in the following manner: C-V characteristics are obtained by plotting relations between a gate voltage ($V_g$) and a capacitance (C) of an MOS capacitor; a graph of a relation between the gate voltage $V_g$ and $(1/C)^2$ is obtained with the use of the C—V characteristics; a differential value of $(1/C)^2$ in a weak inversion region of the graph is found; and the differential value is substituted into Formula 1. Note that e, $\epsilon_0$, and $\epsilon$ in Formula 1 represent elementary electric charge, vacuum permittivity, and relative permittivity of an oxide semiconductor, respectively.

[Formula 1]

$$N_d = -\left(\frac{2}{e\epsilon_0\epsilon}\right) / \frac{d(1/C)^2}{dV} \quad (1)$$

Next, measurement of actual carrier concentration corresponding to that calculated by the above method is described. For the measurement, a sample (a MOS capacitor) which was formed as follows was used: a titanium film was formed to a thickness of 300 nm over a glass substrate; a titanium nitride film was formed to a thickness of 100 nm over the titanium film; an oxide semiconductor layer using an In—Ga—Zn—O-based oxide semiconductor was formed to a thickness of 2 µm over the titanium nitride film; and a silver film was formed to a thickness of 300 nm over the oxide semiconductor layer. Note that the oxide semiconductor layer was formed using an oxide semiconductor target containing In, Ga, and Zn ($In_2O_3:Ga_2O_3:ZnO=1:1:1$ (molar ratio)) by a sputtering method. Further, a formation atmosphere of the oxide semiconductor layer was a mixed atmosphere of argon and oxygen (a flow ratio was $Ar:O_2=30$ (sccm):15 (sccm)).

Figure 10:
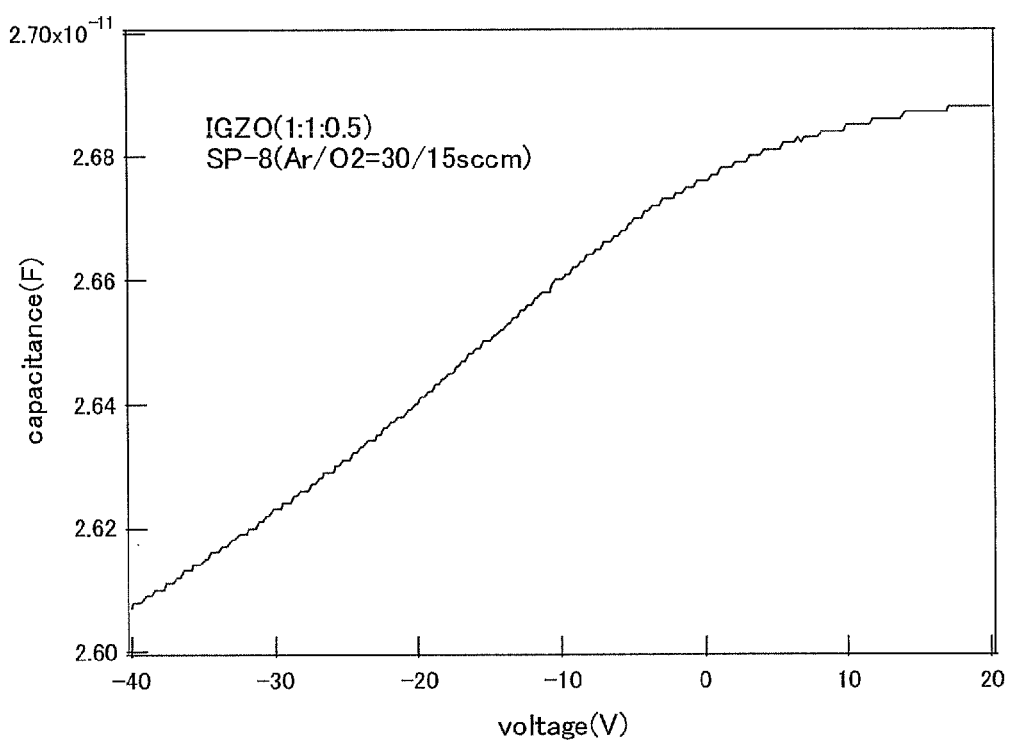
FIG. 10 is a graph illustrating a C-V characteristic.
Figure 11:
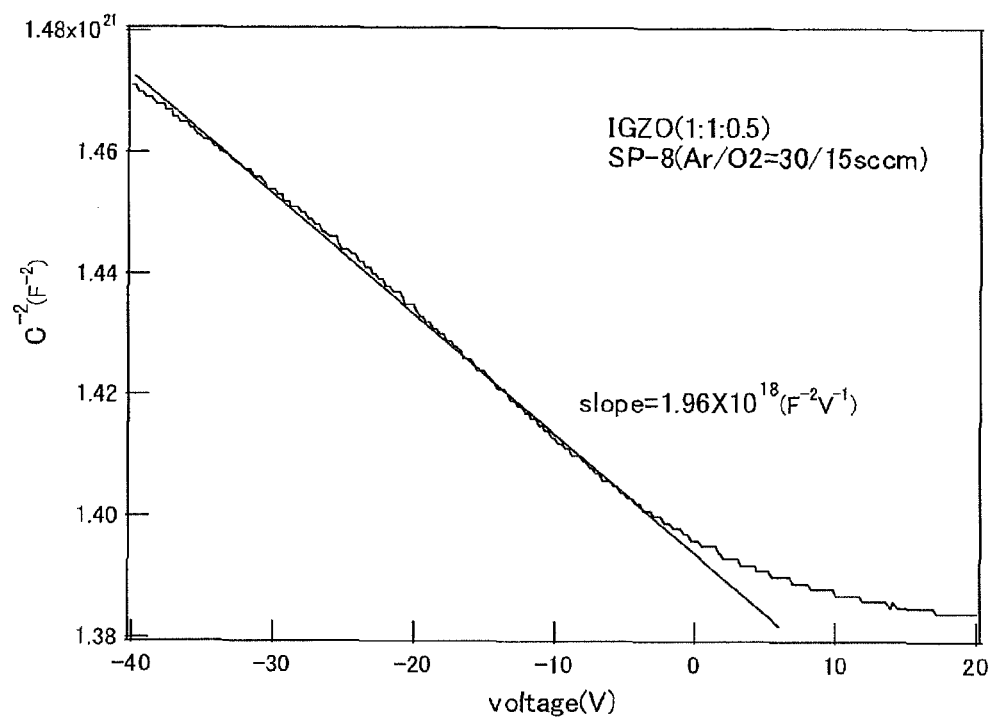
FIG. 11 is a graph illustrating a relation between $V_g$ and $(1/C)^2$.

The C-V characteristics and the relation between the gate voltage ($V_g$) and $(1/C)^2$ are illustrated in FIG. 10 and FIG. 11, respectively. The carrier concentration calculated using Formula 1 from the differential value of $(1/C)^2$ in a weak inversion region of the graph of FIG. 11 was $6.0 \times 10^{10}/cm^3$.

As described above, by using an oxide semiconductor which is made to be an i-type or substantially i-type oxide semiconductor (for example, carrier concentration is less than or equal to $1 \times 10^{12}/cm^3$, preferably, less than or equal to $1 \times 10^{11}/cm^3$), a transistor which has extremely favorable off-state current characteristics can be obtained.

<Examples of Variations>

Examples of variations of a structure of a semiconductor device are described with reference to FIG. 12, FIGS. 13A and 13B, FIGS. 14A and 14B, and FIGS. 15A and 15B. Note that in the following examples, the structure of the transistor 162 is different from that already described. However, the structure of the transistor 160 is similar to that already described.

Figure 12:
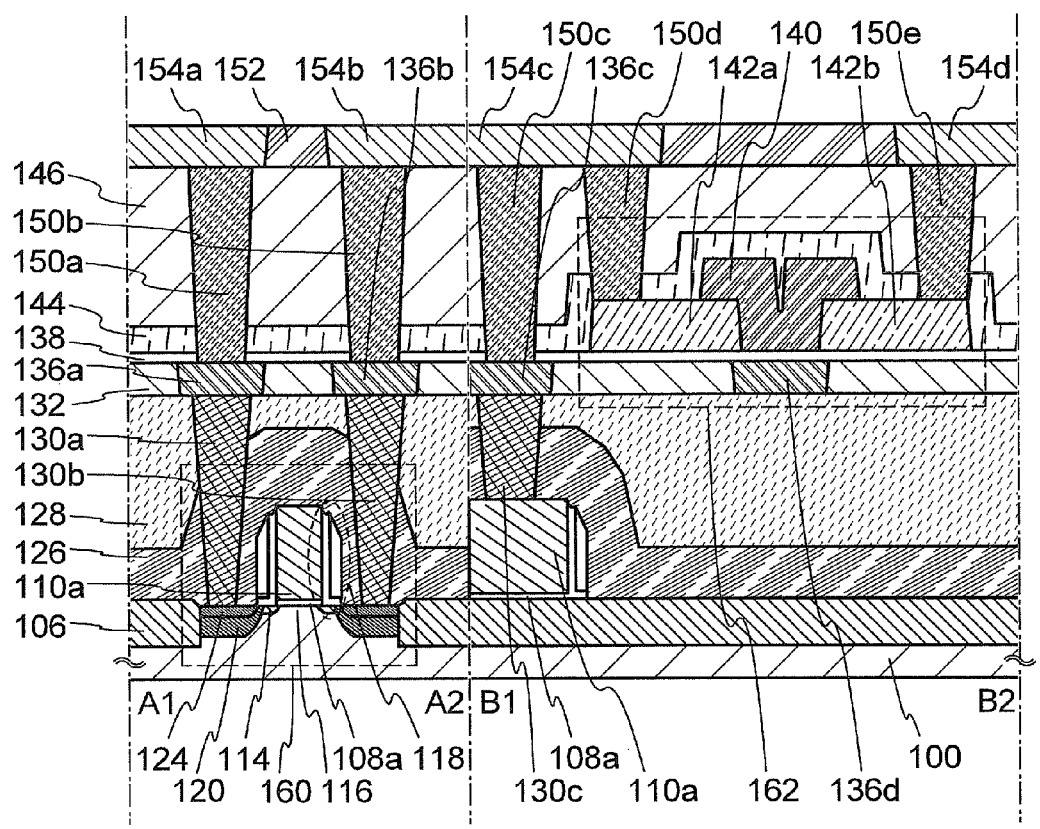
FIG. 12 is a cross-sectional view for describing a semiconductor device.

In an example illustrated in FIG. 12, a semiconductor device including the transistor 162 having the gate electrode 136d under the oxide semiconductor layer 140 and the source or drain electrode 142a and the source or drain electrode 142b which are in contact with the oxide semiconductor layer 140 at a bottom surface of the oxide semiconductor layer 140. Since a plan structure may be appropriately changed corresponding to a cross-sectional structure, only the cross-sectional structure is described here.

As an important difference between the structure illustrated in FIG. 12 and that illustrated in FIGS. 2A and 2B, there are connection positions where the source or drain electrode 142a and the source or drain electrode 142b are connected to the oxide semiconductor layer 140. That is, in the structure illustrated in FIGS. 2A and 2B, the source or drain electrode 142a and the source or drain electrode 142b are in contact with a top surface of the oxide semiconductor layer 140; on the other hand, in the structure illustrated in FIG. 12, the source or drain electrode 142a and the source or drain electrode 142b are in contact with the bottom surface of the oxide semiconductor layer 140. In addition, resulting from this difference in contact positions, a position of another electrode, another insulating layer, or the like is changed. As for details of each component, FIGS. 2A and 2B can be referred to.

Specifically, the semiconductor device includes: the gate electrode 136d provided over the interlayer insulating layer 128; the gate insulating layer 138 provided over the gate electrode 136d; the source or drain electrode 142a and the source or drain electrode 142b which are provided over the gate insulating layer 138; and the oxide semiconductor layer 140 in contact with top surfaces of the source or drain electrode 142a and the source or drain electrode 142b.

Here, the gate electrode 136d is provided so as to be embedded in the insulating layer 132 which is formed over the interlayer insulating layer 128. Furthermore, similarly to the gate electrode 136d, an electrode 136a, an electrode 136b, and an electrode 136c are formed in contact with the source or drain electrode 130a, the source or drain electrode 130b, and the electrode 130c, respectively.

In addition, over the transistor 162, a protective insulating layer 144 is provided in contact with part of the oxide semiconductor layer 140. An interlayer insulating layer 146 is provided over the protective insulating layer 144. Here, in the protective insulating layer 144 and the interlayer insulating layer 146, openings reaching the source or drain electrode 142a and the source or drain electrode 142b are formed. In the openings, the electrode 150d and the electrode 150e are formed to be in contact with the source or drain electrode 142a and the source or drain electrode 142b, respectively. Similarly to the electrodes 150d and 150e, the electrode 150a, the electrode 150b, and the electrode 150c are formed to be in contact with the electrode 136a, the electrode 136b, and the electrode 136c, respectively, in openings provided in the gate insulating layer 138, the protective insulating layer 144, and the interlayer insulating layer 146.

Furthermore, the insulating layer 152 is provided over the interlayer insulating layer 146. The electrode 154a, the electrode 154b, the electrode 154c, and the electrode 154d are provided so as to be embedded in the insulating layer 152. Here, the electrode 154a is in contact with the electrode 150a; the electrode 154b, the electrode 150b; the electrode 154c, the electrodes 150c and 150d; and the electrode 154d, the electrode 150e.

Figure 13A:
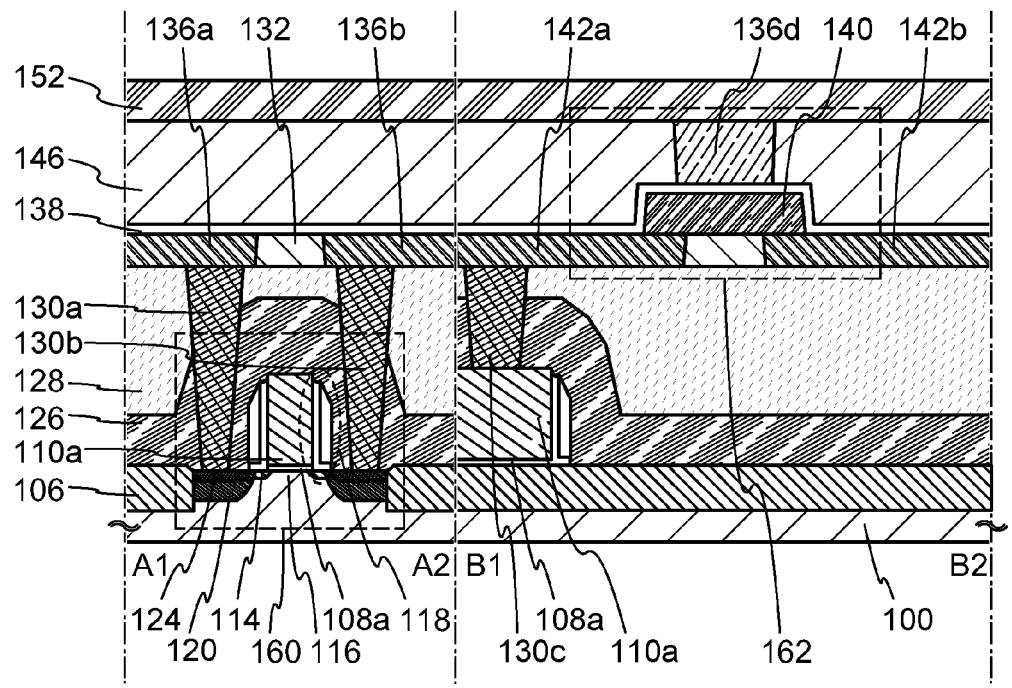
FIGS. 13A and 13B are cross-sectional views for describing a semiconductor device.
Figure 13B:
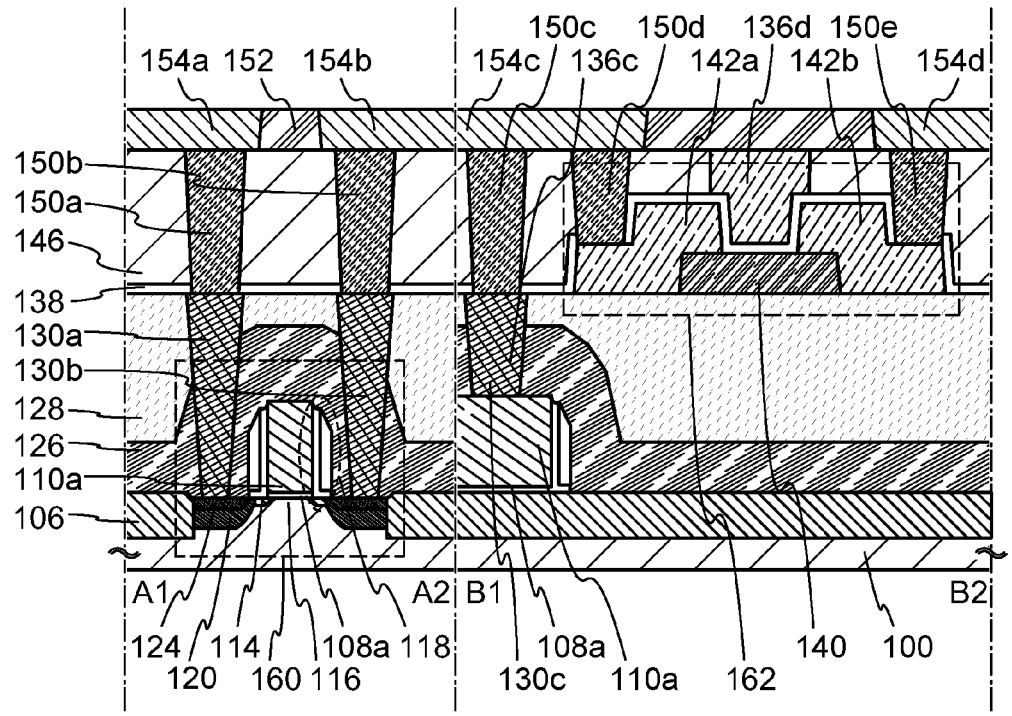

FIGS. 13A and 13B each illustrate an example in which the gate electrode 136d is provided over the oxide semiconductor layer 140. Here, FIG. 13A illustrates an example in which the source or drain electrode 142a and the source or drain electrode 142b are in contact with the oxide semiconductor layer 140 at the bottom surface of the oxide semiconductor layer 140; and FIG. 13B illustrates an example in which the source or drain electrode 142a and the source or drain electrode 142b are in contact with the oxide semiconductor layer 140 at the top surface of the oxide semiconductor layer 140.

The structures of FIGS. 13A and 13B are largely different from those of FIGS. 2A and 2B and FIG. 12 in that the gate electrode 136d is provided over the oxide semiconductor layer 140. Further, an important difference between the structure in FIG. 13A and the structure in FIG. 13B is that which of the bottom surface or the top surface of the oxide semiconductor layer 140 the source and drain electrodes 142a and 142b are in contact with. Furthermore, resulting from these differences, a position of another electrode, another insulating layer, or the like is changed. As for details of each component, FIGS. 2A and 2B or other drawings can be referred to.

Specifically, in FIG. 13A, the semiconductor device includes: the source or drain electrode 142a and the source or drain electrode 142b which are provided over the interlayer insulating layer 128; the oxide semiconductor layer 140 which is in contact with the top surfaces of the source or drain electrode 142a and the source or drain electrode 142b; the gate insulating layer 138 provided over the oxide semiconductor layer 140; and the gate electrode 136d over a region of the gate insulating layer 138 which is overlapped with the oxide semiconductor layer 140.

In FIG. 13B, the semiconductor device includes: the oxide semiconductor layer 140 provided over the interlayer insulating layer 128; the source or drain electrode 142a and the source or drain electrode 142b which are provided in contact with the top surface of the oxide semiconductor layer 140; the gate insulating layer 138 provided over the oxide semiconductor layer 140, the source or drain electrode 142a, and the source or drain electrode 142b; and the gate electrode 136d over a region of the gate insulating layer 138 which is overlapped with the oxide semiconductor layer 140.

Note that in the structures illustrated in FIGS. 13A and 13B, a component (e.g., the electrode 150a, the electrode 154a, or the like) which the structure illustrated in FIGS. 2A and 2B or the like has can be omitted in some cases. In such a case, simplification of the manufacturing process can be achieved secondarily. Needless to say, a component which is not essential can be omitted also in the structure illustrated in FIGS. 2A and 2B or the like.

Figure 14A:
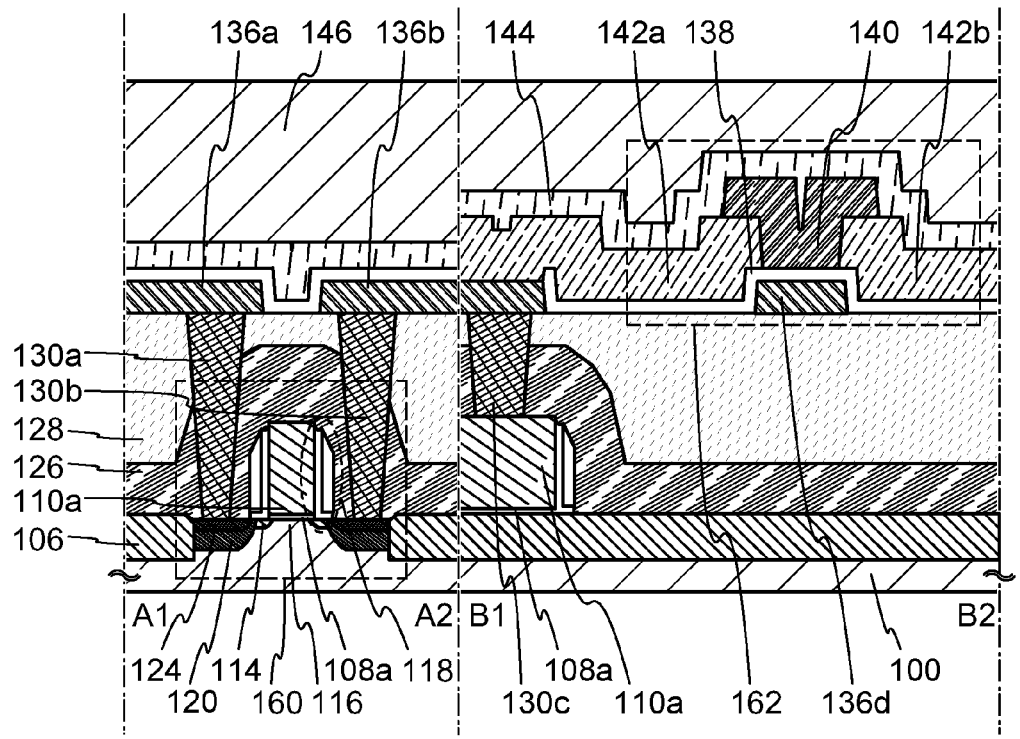
FIGS. 14A and 14B are cross-sectional views for describing a semiconductor device.
Figure 14B:
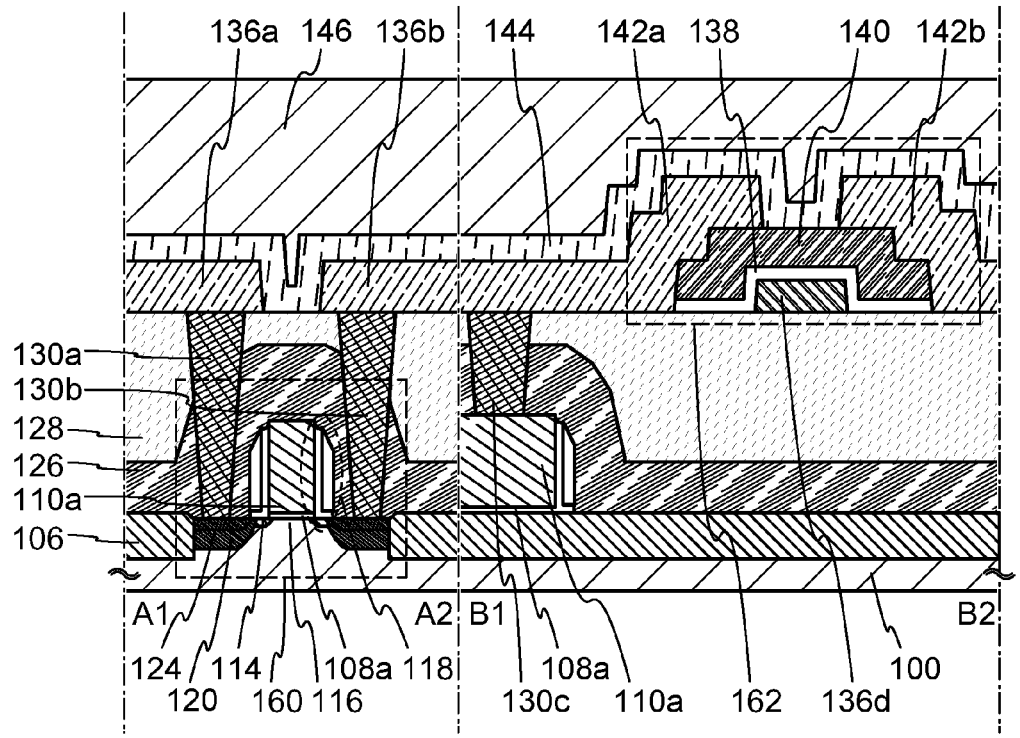

FIGS. 14A and 14B each illustrate an example of a structure in which the semiconductor device has a relatively large size and the gate electrode 136d is provided under the oxide semiconductor layer 140. In this case, a wiring, an electrode, or the like does not need to be formed so as to be embedded in the insulating layer because flatness or coverage of a surface is not needed to be extremely high. For example, the gate electrode 136d and the like can be formed in such a manner that a conductive layer is formed and then patterned. Note that although not illustrated, the transistor 160 can be manufactured similarly.

An important difference between the structure in FIG. 14A and the structure in FIG. 14B is that which of the bottom surface or the top surface of the oxide semiconductor layer 140 the source and drain electrodes 142a and 142b are in contact with. In addition, resulting from this difference, a position of another electrode, another insulating layer, or the like is changed. As for details of each component, FIGS. 2A and 2B or other drawings can be referred to.

Specifically, in FIG. 14A, the semiconductor device includes: the gate electrode 136d provided over the interlayer insulating layer 128; the gate insulating layer 138 provided over the gate electrode 136d; the source or drain electrode 142a and the source or drain electrode 142b which are provided over the gate insulating layer 138; and the oxide semiconductor layer 140 in contact with the top surfaces of the source or drain electrode 142a and the source or drain electrode 142b.

In FIG. 14B, the semiconductor device includes: the gate electrode 136d provided over the interlayer insulating layer 128; the gate insulating layer 138 provided over the gate electrode 136d; the oxide semiconductor layer 140 provided over the gate insulating layer 138 so as to overlap with the gate electrode 136d; and the source or drain electrode 142a and the source or drain electrode 142b which are provided in contact with the top surface of the oxide semiconductor layer 140.

Note that a component which the structure illustrated in FIGS. 2A and 2B or the like are omitted in some cases also in the structures illustrated in FIGS. 14A and 14B. Also in this case, simplification of the manufacturing process can be achieved.

Figure 15A:
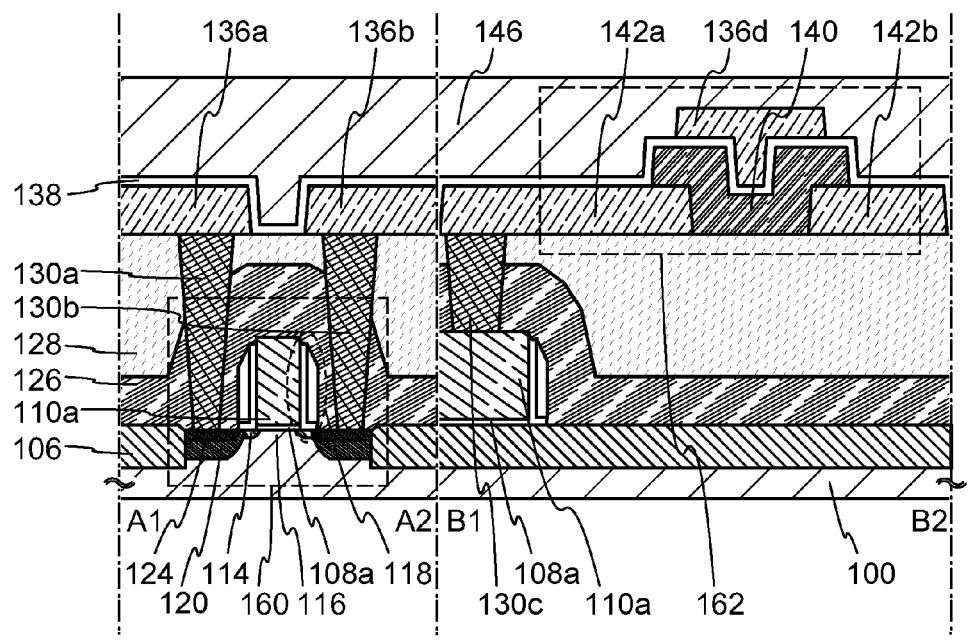
FIGS. 15A and 15B are cross-sectional views for describing a semiconductor device.
Figure 15B:
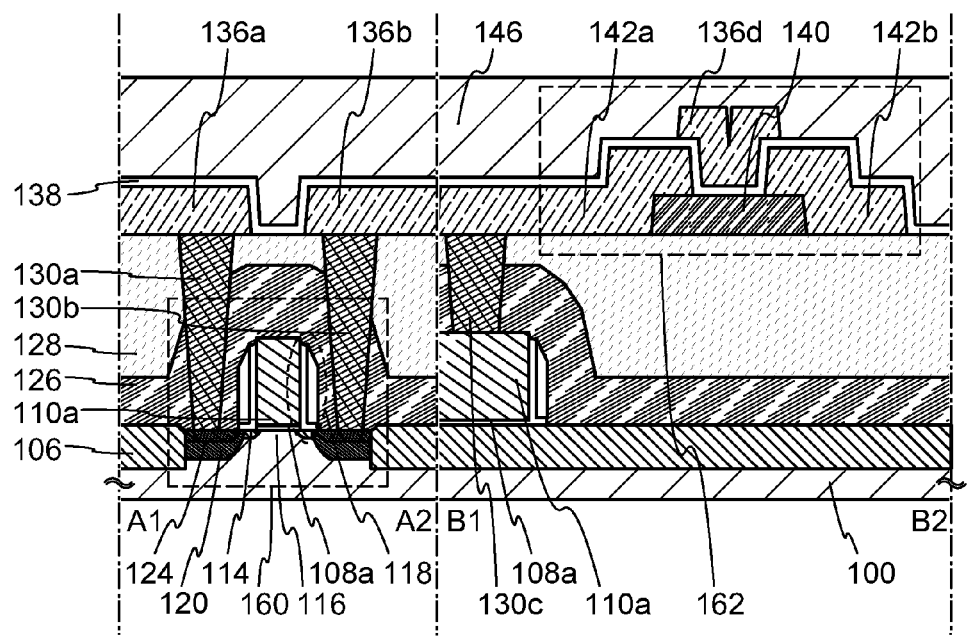

FIGS. 15A and 15B each illustrate an example of a structure in which the semiconductor device has a relatively large size and the gate electrode 136d is provided over the oxide semiconductor layer 140. Also in this case, a wiring, an electrode, or the like does not need to be formed so as to be embedded in the insulating layer because flatness or coverage of a surface is not needed to be extremely high. For example, the gate electrode 136d and the like can be formed in such a manner that a conductive layer is formed and then patterned. Note that although not illustrated, the transistor 160 can be manufactured similarly.

An important difference between the structure in FIG. 15A and the structure in FIG. 15B is that which of the bottom surface or the top surface of the oxide semiconductor layer 140 the source and drain electrodes 142a and 142b are in contact with. In addition, resulting from this difference, a position of another electrode, another insulating layer, or the like is changed. As for details of each component, FIGS. 2A and 2B or other drawings can be referred to.

Specifically, in FIG. 15A, the semiconductor device includes: the source or drain electrode 142a and the source or drain electrode 142b which are provided over the interlayer insulating layer 128; the oxide semiconductor layer 140 which is in contact with the top surfaces of the source or drain electrode 142a and the source or drain electrode 142b; the gate insulating layer 138 provided over the source or drain electrode 142a, the source or drain electrode 142b, and the oxide semiconductor layer 140; and the gate electrode 136d over a region of the gate insulating layer 138 which is overlapped with the oxide semiconductor layer 140.

In FIG. 15B, the semiconductor device includes: the oxide semiconductor layer 140 provided over the interlayer insulating layer 128; the source or drain electrode 142a and the source or drain electrode 142b which are provided in contact with the top surface of the oxide semiconductor layer 140; the gate insulating layer 138 provided over the source or drain electrode 142a, the source or drain electrode 142b, and the oxide semiconductor layer 140; and the gate electrode 136d over a region of the gate insulating layer 138 which is overlapped with the oxide semiconductor layer 140.

Note that a component which the structure illustrated in FIGS. 2A and 2B or the like has can be omitted in some cases also in the structures illustrated in FIGS. 15A and 15B. Also in this case, simplification of the manufacturing process can be achieved.

As described above, according to one embodiment of the disclosed invention, a semiconductor device having a new structure is realized. Although the transistor 160 and the transistor 162 are stacked in this embodiment, the structure of the semiconductor device is not limited thereto. Further, although an example in which the channel length direction of the transistor 160 and that of the transistor 162 are perpendicular to each other is described, the positions of the transistors 160 and 162 are not limited to this. In addition, the transistors 160 and 162 may be provided to overlap with each other.

Note that although in this embodiment a semiconductor device per minimum storage unit (one bit) is described for easy understanding, the structure of the semiconductor device is not limited to this. A more developed semiconductor device can be formed by appropriately connecting a plurality of semiconductor devices. For example, it is possible to make a NAND-type or NOR-type semiconductor device by using a plurality of the above described semiconductor devices. The structure of the wiring is not limited to that illustrated in FIG. 1 and can be changed as appropriate.

In the semiconductor device according to this embodiment, the low off-state current characteristics of the transistor 162 enable information to be held for an extremely long time. In other words, refreshing operation, which is needed in DRAM memories and the like, is not necessary; thus, power consumption can be suppressed. In addition, the semiconductor device can be substantially used as a non-volatile memory.

Since information is written by switching operation of the transistor 162, high voltage is not needed and an element is not deteriorated in the semiconductor device. Further, information is written or erased according to an on state and an off state of the transistor, whereby high-speed operation can be easily realized. Moreover, there is an advantage in that operation for erasing information which is necessary in flash memory and the like is not needed.

Furthermore, a transistor using a material other than an oxide semiconductor can operate at sufficiently high speed; thus, high-speed reading of stored content can be realized by using the semiconductor device.

The methods and structures described in this embodiment can be combined as appropriate with any of the methods and structures described in the other embodiments.

Embodiment 2

In this embodiment, a circuit configuration and operation of a semiconductor device according to one embodiment of the present invention will be described.

Figure 16:
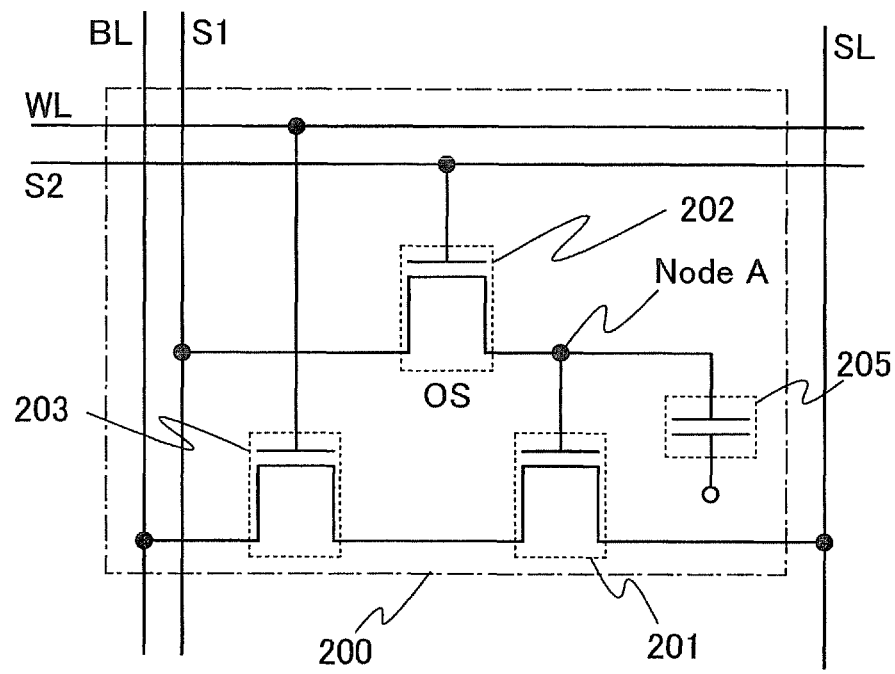
FIG. 16 is a circuit diagram for describing a memory element.

An example of a circuit diagram of a memory element (hereinafter also referred to as a memory cell) including the semiconductor device is illustrated in FIG. 16. A memory cell 200 illustrated in FIG. 16 is a multi-valued memory cell and includes a source line SL, a bit line BL, a first signal line S1, a second signal line S2, a word line WL, a transistor 201, a transistor 202, a transistor 203, and a capacitor 205. The transistors 201 and 203 are formed using a material other than an oxide semiconductor, and the transistor 202 is formed using an oxide semiconductor.

Here, a gate electrode of the transistor 201 is electrically connected to one of a source electrode and a drain electrode of the transistor 202. In addition, the source line SL is electrically connected to a source electrode of the transistor 201, and a source electrode of the transistor 203 is electrically connected to a drain electrode of the transistor 201. The bit line BL is electrically connected to a drain electrode of the transistor 203, and the first signal line S1 is electrically connected to the other of the source electrode and the drain electrode of the transistor 202. The second signal line S2 is electrically connected to a gate electrode of the transistor 202, and the word line WL is electrically connected to a gate electrode of the transistor 203. Additionally, one of electrodes of the capacitor 205 is electrically connected to the gate electrode of the transistor 201 and one of the source electrode and the drain electrode of the transistor 202. The other of the electrodes of the capacitor 205 is supplied with a predetermined potential, for example, GND.

Next, operation of the memory cell 200 illustrated in FIG. 16 is described. In the case where the memory cell 200 is a four-valued memory cell is described. Four states of the memory cell 200 are set to data "00b", "01b", "10b", and "11b", and respective potentials of a node A at that time are set to $V_{00}$, $V_{01}$, $V_{10}$, and $V_{11}$ ($V_{00} < V_{01} < V_{10} < V_{11}$), respectively.

When writing is performed to the memory cell 200, the source line SL is set to 0 [V], the word line WL is set to 0 [V], the bit line BL is set to 0 [V], and the second signal line S2 is set to 2 [V]. When the data "00b" is to be written, the first signal line S1 is set to $V_{00}$ [V]. When the data "01b" is to be written, the first signal line S1 is set to $V_{01}$ [V]. When the data "10b" is to be written, the first signal line S1 is set to $V_{10}$ [V]. When the data "11b" is to be written, the first signal line S1 is set to $V_{11}$ [V]. At this time, the transistor 203 is put in an off state and the transistor 202 is put in an on state. Note that when writing data is completed, the second signal line S2 is set to 0 [V] so as to turn off the transistor 202, before a potential of the first signal line S1 is changed.

As a result, after writing one of the data "00b", "01b", "10b", and "11b", a potential of a node connected to the gate electrode of the transistor 201 (hereinafter referred to as the node A) becomes approximately one of $V_{00}$ [V], $V_{01}$ [V], $V_{10}$ [V], and $V_{11}$ [V]. A charge corresponding to the potential of the first signal line S1 is accumulated in the node A; however, since off-state current of the transistor 202 is extremely small or is substantially 0, a potential of the gate electrode of the transistor 201 is held for a long time.

When reading is performed from the memory cell 200, first, the bit line BL is pre-charged to a voltage $V_{pc}$ [V]. The source line SL is set to $V_{s\_read}$ [V], the word line WL is set to 2 [V], the second signal line S2 is set to 0 [V], and the first signal line S1 is set to 0 [V]. At this time, the transistor 203 takes an on state and the transistor 202 takes an off state. Note that the potential $V_{pc}$ is set to lower than $V_{00}$-$V_{th}$. Additionally, $V_{s\_read}$ is set to higher than $V_{11}$-$V_{th}$.

As a result, current flows from the source line SL to the bit line BL, and the bit line is charged to a potential represented by (the potential of the node A)–(a threshold voltage Vth of the transistor 201). Consequently, the potential of the bit line BL becomes one of $V_{00}$-$V_{th}$, $V_{01}$-$V_{th}$, $V_{10}$-$V_{th}$, and $V_{11}$-$V_{th}$ corresponding to the data "00b", "01b", "10b", and "11b", respectively. Since the potentials applied to the bit line and corresponding to the data are different from each other, a reading circuit connected to the bit line BL can read the data "00b", "01b", "10b", and "11b".

Figure 17:
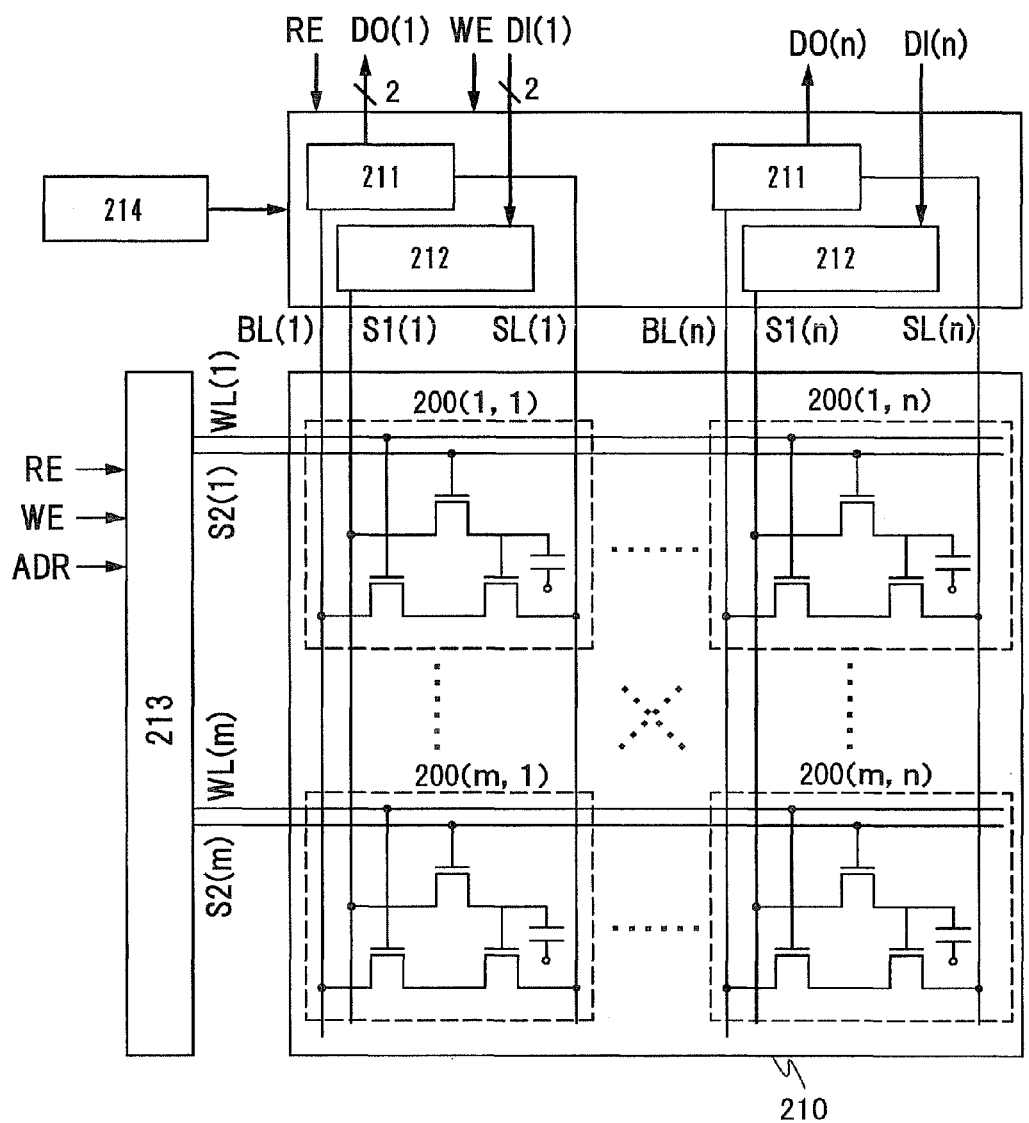
FIG. 17 is a circuit diagram for describing a semiconductor device.

A block circuit diagram of a semiconductor device according to one embodiment of the present invention including m×n bits of storage capacity is illustrated in FIG. 17.

The semiconductor device according to one embodiment of the present invention includes the following components: an m number of word lines WL and an m number of second signal lines S2; an n number of bit lines BL, an n number of first signal lines S1, and an n number of source lines SL; a memory cell array 210 including a plurality of memory cells 200(1, 1) to 200(m, n) arranged in a matrix with m cells in vertical (rows) and n cells in horizontal (columns) (both m and n are natural numbers); and peripheral circuits such as reading circuits 211, first signal line driver circuits 212, a driver circuit 213 for the second signal lines and word lines, and a potential generating circuit 214. As another peripheral circuit, a refresh circuit and the like may be provided.

Each of the memory cells, for example, a memory cell 200(i, j) is considered (here, i is an integer greater than or equal to 1 and less than or equal to m and j is an integer greater than or equal to 1 and less than or equal to n). The memory cell 200(i, j) is connected to the bit line BL(j), the first signal line S1(j), the source line SL(j), the word line WL(i), and the second signal line S2(i). In addition, the bit lines BL(1) to BL(n) and the source lines SL(1) to SL(n) are connected to the reading circuits 211. The first signal lines S1(1) to S1(n) are connected to the first signal line driver circuits 212. The word lines WL(1) to WL(m) and the second signal lines S2(1) to S2(m) are connected to the driver circuit 213 for the second signal lines and the word lines.

Figure 18:
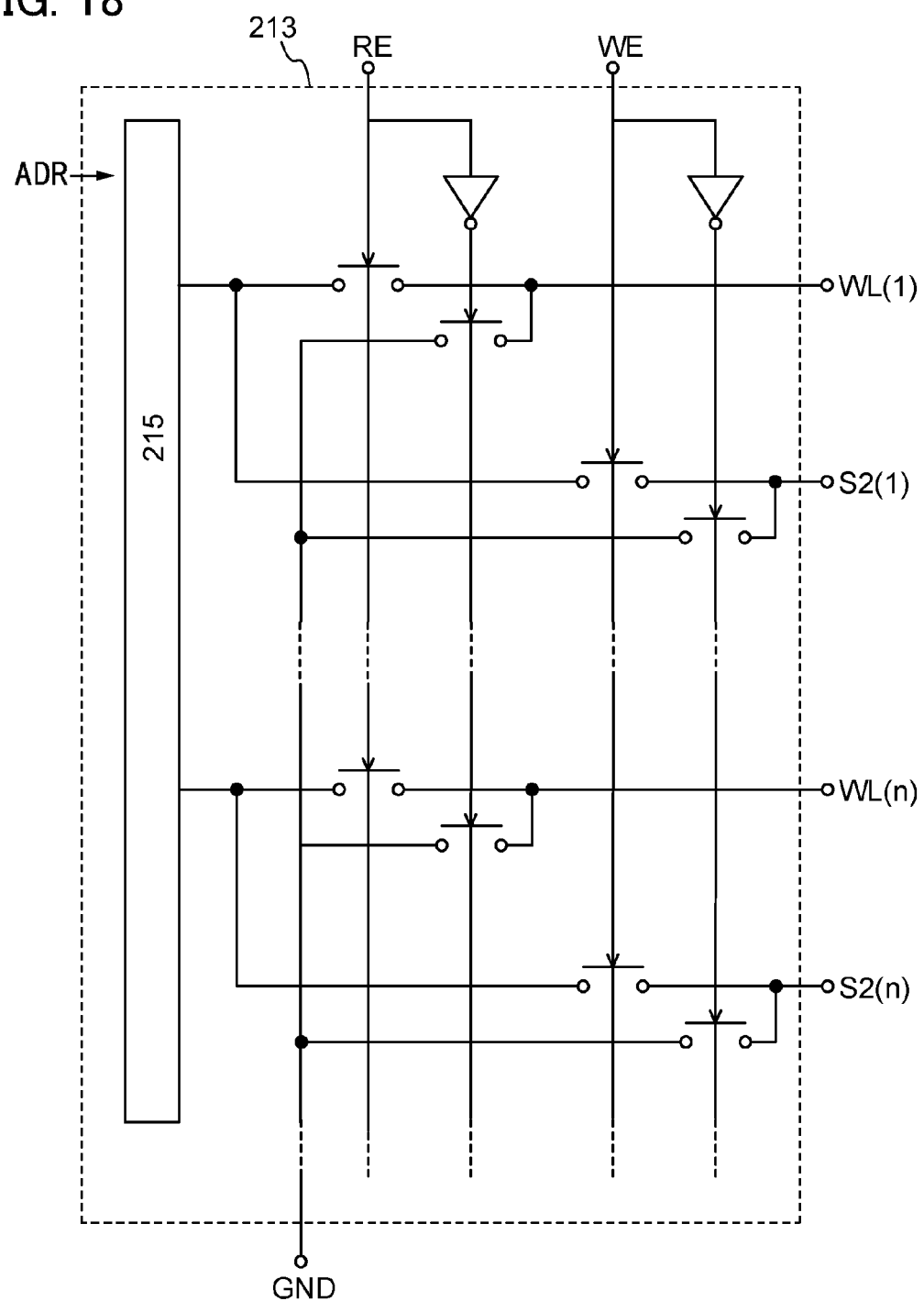
FIG. 18 is a circuit diagram for describing a driver circuit.

An example of the driver circuit 213 for the second signal lines and the word lines is illustrated in FIG. 18. The driver circuit 213 for the second signal lines and the word lines includes a decoder 215. The decoder 215 is connected to the second signal lines S2 and the word lines WL through switches. Further, the second signal lines S2 and the word lines WL are connected to GND (a ground potential) through the switches. The switches are controlled by a read enable signal (an RE signal) or a write enable signal (a WE signal). An address signal ADR is input to the decoder 215 from the exterior.

When the address signal ADR is input to the driver circuit 213 for the second signal lines and the word lines, rows specified by the address (hereinafter also referred to as selected rows) are asserted (activation) and rows other than the rows specified by the address (hereinafter also referred to as non-selected rows) are de-asserted (inactivation). Further, when the RE signal is asserted, the word line WL is connected to an output of the decoder 215, and when the RE signal is de-asserted, the word line WL is connected to the GND. When the WE signal is asserted, the second signal line S2 is connected to the output of the decoder 215, and when the WE signal is de-asserted, the second signal line S2 is connected to the GND.

Figure 19:
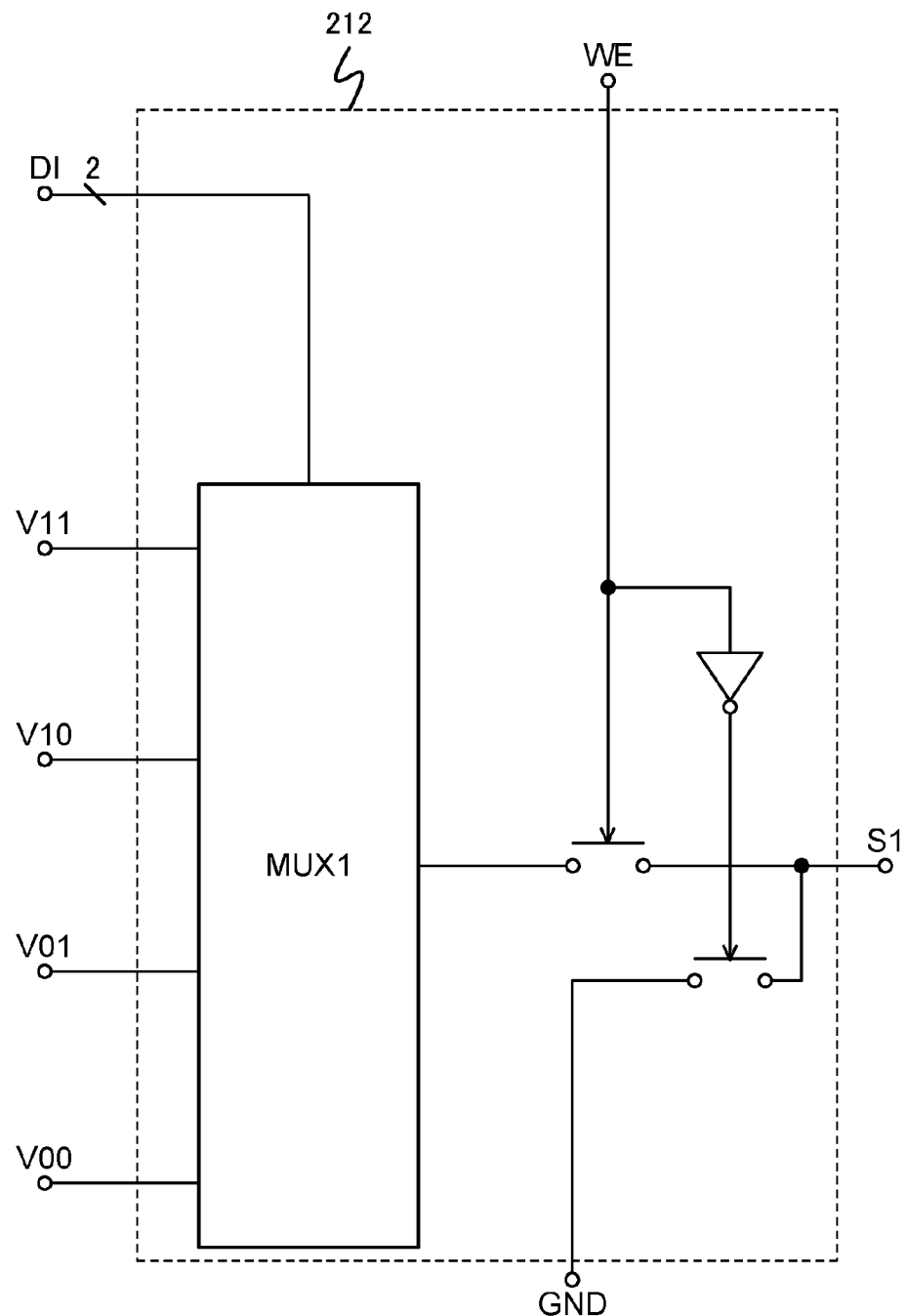
FIG. 19 is a circuit diagram for describing a driver circuit.

An example of the first signal line driver circuit 212 is illustrated in FIG. 19. The first signal line driver circuit 212 includes a multiplexer (MUX1). Input data DI and the writing potentials $V_{00}$, $V_{01}$, $V_{10}$, and $V_{11}$ are input to the multiplexer (MUX1). An output terminal of the multiplexer (MUX1) is connected to the first signal line S1 through a switch. Additionally, the first signal line S1 is connected to GND through a switch. The switches are controlled by a write enable signal (a WE signal).

When DI is input to the first signal line driver circuit 212, the multiplexer (MUX1) selects writing potential $V_w$ in accordance with the value of DI from the writing potentials $V_{00}$, $V_{01}$, $V_{10}$, and $V_{11}$. The behavior of the multiplexer (MUX1) is shown in Table 1. When the WE signal is asserted, the selected writing potential $V_w$ is applied to the first signal line S1. When the WE signal is de-asserted, 0 [V] is applied to the first signal line S1 (the first signal line S1 is connected to the GND).

TABLE 1

| DI[1] | DI[0] | MUX1 output |
|---|---|---|
| 0 | 0 | Corresponds to V00 |
| 0 | 1 | Corresponds to V01 |
| 1 | 0 | Corresponds to V10 |
| 1 | 1 | Corresponds to V11 |

Figure 20:
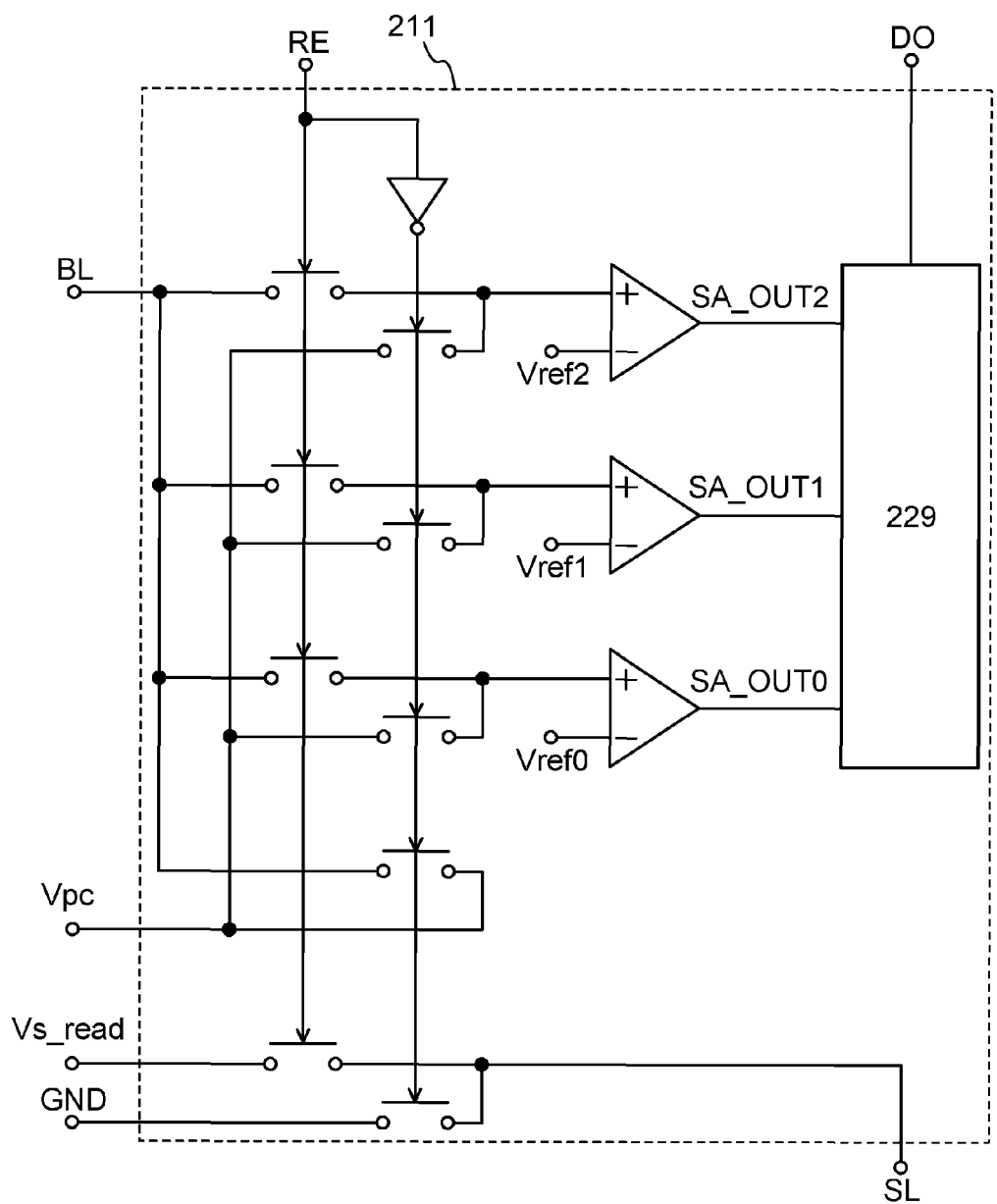
FIG. 20 is a circuit diagram for describing a reading circuit.

An example of the reading circuit 211 is illustrated in FIG. 20. The reading circuit 211 includes a plurality of sense amplifier circuits, a logic circuit 229, and the like. One input terminal of each of the sense amplifier circuits is connected to the bit line BL and a wiring to which a potential $V_{pc}$ is applied through switches. Any of reference potentials $V_{ref0}$, $V_{ref1}$, and $V_{ref2}$ is input to the other input terminal of each of the sense amplifier circuits. An output terminal of each of the sense amplifier circuits is connected to an input terminal of the logic circuit 229. Note that the switches are controlled by a read enable signal (an RE signal).

A state of a memory cell can be read as a digital signal with three bits by setting values of each of the reference potentials $V_{ref0}$, $V_{ref1}$, and $V_{ref2}$ so as to satisfy $V_{00}-V_{th}<V_{ref0}<V_{01}-V_{th}<V_{ref1}<V_{10}-V_{th}<V_{ref2}<V_{11}-V_{th}$. For example, in the case of the data "00b", a potential of the bit line BL is $V_{00}-V_{th}$. Here, the potential of the bit line is smaller than any of the reference potentials: $V_{ref0}$, $V_{ref1}$, and $V_{ref2}$, whereby, all of outputs SA_OUT0, SA_OUT1, and SA_OUT2 of the sense amplifier circuits become "0". Similarly, in the case of the data "01b", the potential of the bit line BL becomes $V_{01}-V_{th}$, so that the outputs SA_OUT0, SA_OUT1, and SA_OUT2 of the sense amplifier circuits become "1", "0", and "0", respectively. In the case of the data "10b", the potential of the bit line BL is $V_{10}-V_{th}$, whereby the outputs SA_OUT0, SA_OUT1, and SA_OUT2 of the sense amplifier circuits become "1", "1", and "0", respectively. In the case of the data "11b", the potential of the bit line BL is $V_{11}-V_{th}$, so that the outputs SA_OUT0, SA_OUT1, and SA_OUT2 of the sense amplifier circuits become "1", "1", and "1", respectively. Then, using the logic circuit 229 shown in a logic table Table 2, data DO with two bits is generated and output from the reading circuit 211.

TABLE 2

| SA_OUT0 | SA_OUT1 | SA_OUT2 | DO1 | DO0 |
|---------|---------|---------|-----|-----|
| 0 | 0 | 0 | 0 | 0 |
| 1 | 0 | 0 | 0 | 1 |
| 1 | 1 | 0 | 1 | 0 |
| 1 | 1 | 1 | 1 | 1 |

Note that in the reading circuit 211 illustrated here, when the RE signal is de-asserted, the source line SL is connected to GND and 0 [V] is applied to the source line SL. At the same time, the potential $V_{pc}$ [V] is also applied to the bit line BL and a terminal of the sense amplifier circuits connected to the bit line BL. When the RE signal is asserted, $V_{s\_read}$ [V] is applied to the source line SL, whereby a potential reflecting data is charged to the bit line BL. Then, the reading is performed. Note that the potential $V_{pc}$ is set to lower than $V_{00}-V_{th}$. Additionally, $V_{s\_read}$ is set to higher than $V_{11}-V_{th}$.

Note that "potentials of the bit line BL" compared in reading include a potential of node of input terminals of the sense amplifier circuits connected to the bit line BL through switches. That is, potentials compared in the reading circuit 211 do not need to be exactly the same as the potentials of the bit line BL.

Figure 21:
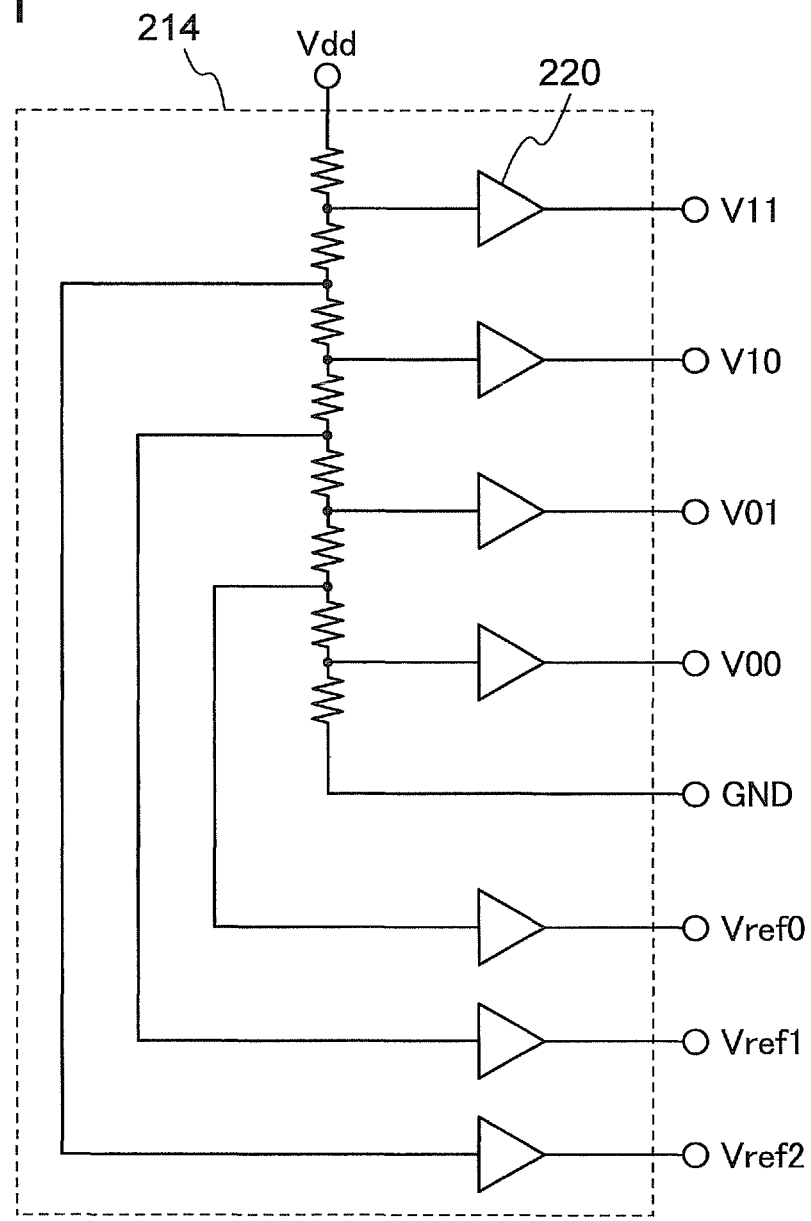
FIG. 21 is a circuit diagram for describing a potential generating circuit.

An example of the potential generating circuit 214 is illustrated in FIG. 21. In the potential generating circuit 214, a potential is divided between $V_{dd}$ and GND by resistance, whereby desired potentials can be obtained. Then the generated potentials are output through an analogue buffer 220. In such a manner, the writing potentials $V_{00}$, $V_{01}$, $V_{10}$, and $V_{11}$ and the reference potentials $V_{ref0}$, $V_{ref1}$, and $V_{ref2}$ are generated. Note that a configuration in which $V_{00}<V_{ref0}<V_{01}<V_{ref1}<V_{10}<V_{ref2}<V_{11}$ is illustrated in FIG. 21; however, a potential relation is not limited thereto. Potentials required can be generated as appropriate by adjusting a resistor and nodes to which the reference potentials are connected. Further, $V_{00}$, $V_{01}$, $V_{10}$, and $V_{11}$ may be generated using another potential generating circuit than that of $V_{ref0}$, $V_{ref1}$, and $V_{ref2}$.

A potential boosted in a boosting circuit may be supplied to the potential generating circuit 214 instead of the power supply potential $V_{dd}$. This is because the absolute value of the potential difference can be increased by supplying an output of the boosting circuit to the potential generating circuit, so that a higher potential can be supplied.

Note that even in the case where the power supply potential $V_{dd}$ is directly supplied to the potential generating circuit, the power supply potential $V_{dd}$ can be divided into a plurality of potentials. However, since in this case, it is difficult to distinguish adjacent potentials from each other, writing mistakes and reading mistakes would increase. In the case where the output of the boosting circuit is supplied to the potential generating circuit, the absolute value of the potential difference can be increased, so that a sufficient potential difference between the adjacent potentials can be secured even if the number of partitions is increased.

Thus, storage capacity of a memory cell can be increased without increasing writing mistakes and reading mistakes.

Figure 22A:
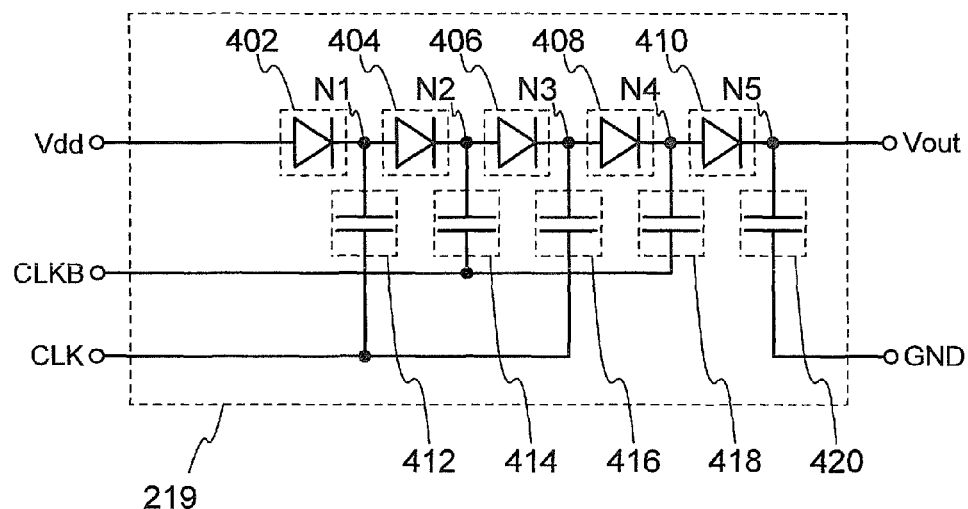
FIGS. 22A and 22B are circuit diagrams for describing a boosting circuit.

As an example of a boosting circuit in which boosting of four stages is performed, a boosting circuit 219 is illustrated in FIG. 22A. In FIG. 22A, the power supply potential $V_{dd}$ is supplied to an input terminal of a first diode 402. An input terminal of a second diode 404 and one terminal of a first capacitor 412 are connected to an output terminal of the first diode 402. Similarly, an input terminal of a third diode 406 and one terminal of a second capacitor 414 are connected to an output terminal of the second diode 404. Connections of other parts are similar to the above; therefore, detailed explanation is omitted. However, the connection can be represented as follows: one terminal of an n-th capacitor is connected to an output terminal of an n-th diode (where n represents an integer). Note that an output of a fifth diode 410 becomes an output $V_{out}$ of the boosting circuit 219.

In addition, a clock signal CLK is input to the other terminal of the first capacitor 412 and the other terminal of a third capacitor 416. An inverted clock signal CLKB is input to the other terminal of the second capacitor 414 and the other terminal of a fourth capacitor 418. That is, the clock signal CLK is input to the other terminal of the (2k−1)-th capacitor and the inverted clock signal CLKB is input to the other terminal of the 2k-th capacitor (where k represents an integer). Note that a ground potential GND is input to the other terminal of a capacitor of the last stage.

When the clock signal CLK is high, that is, when the inverted clock signal CLKB is low, the first capacitor 412 and the third capacitor 416 are charged, and potentials of node N1 and node N3 capacitively coupled with the clock signal CLK are increased by predetermined voltage. On the other hand, potentials of node N2 and node N4 capacitively coupled with the inverted clock signal CLKB are decreased by predetermined voltage.

Therefore, a charge moves through the first diode 402, the third diode 406, and the fifth diode 410, and the potentials of node N2 and node N4 are increased to a predetermined value.

Next, when the clock signal CLK becomes low and the inverted clock signal CLKB becomes high, potentials of node N2 and node N4 further increase. On the other hand, the potentials of node N1, node N3, and node N5 are decreased by a predetermined voltage.

Accordingly, a charge moves through the second diode 404 and the fourth diode. As a result, potentials of node N3 and node N5 are increased to a predetermined potential. Thus, each of potentials of nodes becomes $V_{N5}>V_{N4(CLKB=High)}>V_{N3(CLK=High)}>V_{N2(CLKB=High)}>V_{N1(CLK=High)}>V_{N2(CLKB=High)}>V_{N1(CLK=High)}>V_{dd}$, whereby boosting is performed. Note that the boosting circuit 219 is not limited to a circuit performing four stages of boosting. The number of stages of the boosting can be changed as appropriate.

Note that the output $V_{out}$ of the boosting circuit 219 is significantly affected by variations between the characteristics of diodes. For example, a diode is provided by connecting a source electrode and a gate electrode of a transistor to each other, but in this case, the diode is affected by variation in the threshold value of the transistor.

Figure 22B:
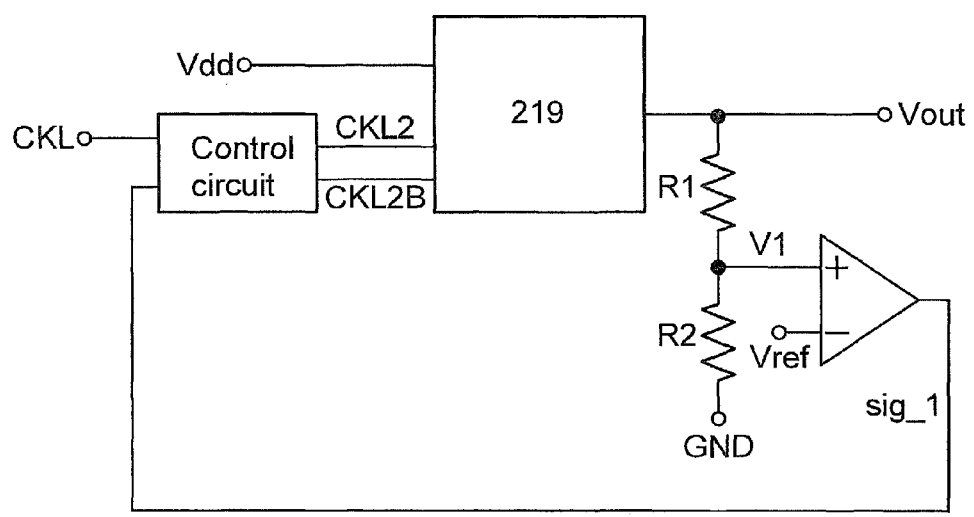

In order to control the output $V_{out}$ with high accuracy, a structure in which the output $V_{out}$ is fed back may be employed. FIG. 22B illustrates an example of a circuit configuration in the case where the output $V_{out}$ is fed back. The boosting circuit 219 in FIG. 22B corresponds to the boosting circuit 219 in FIG. 22A.

An output terminal of the boosting circuit 219 is connected to one input terminal of a sense amplifier circuit through a resistance $R_1$. In addition, the one input terminal of the sense amplifier circuit is grounded through a resistance $R_2$. That is, a potential $V_1$ corresponding to the output $V_{out}$ is input to the one input terminal of the sense amplifier circuit. Here, $V_1 = V_{out} \cdot R_2/(R_1+R_2)$.

Further, the reference potential $V_{ref}$ is input to the other input terminal of the sense amplifier circuit. That is, $V_1$ and $V_{ref}$ are compared in the sense amplifier circuit. An output terminal of the sense amplifier circuit is connected to a control circuit. A clock signal CLK0 is input to the control circuit. The control circuit outputs the clock signal CLK and the inverted clock signal CLKB to the boosting circuit 219 in response to the output of the sense amplifier circuit.

When $V_1 > V_{ref}$, an output sig_1 of the sense amplifier circuit is asserted, and the control circuit stops supplying the clock signal CLK and the inverted clock signal CLKB to the boosting circuit 219. Thus, the boosting operation is stopped, so that the potential $V_{out}$ stops increasing. Then, a circuit connected to the output of the boosting circuit 219 consumes electricity, whereby the potential $V_{out}$ gradually decreases.

When $V_1 < V_{ref}$, the output sig_1 of the sense amplifier circuit is de-asserted, and the control circuit starts to supply the clock signal CLK and the inverted clock signal CLKB to the boosting circuit 219. Thus, the boosting operation is performed, so that the potential $V_{out}$ gradually increases.

In such a manner, the output potential $V_{out}$ of the boosting circuit 219 can be kept equal to a predetermined value by feeding back the output potential $V_{out}$ of the boosting circuit 219. The above configuration is especially effective in the case where the characteristics of the diodes vary. Moreover, it is also effective in the case where a predetermined potential is to be generated in accordance with the reference potential $V_{ref}$. Note that a plurality of potentials can be generated in the boosting circuit 219 by using a plurality of different reference potentials.

The absolute value of a potential difference can be increased by supplying an output of a boosting circuit to a potential generating circuit. Therefore, a higher potential can be generated without a change of the minimum unit of the potential difference. That is, storage capacity of a memory cell can be increased.

Figure 23:
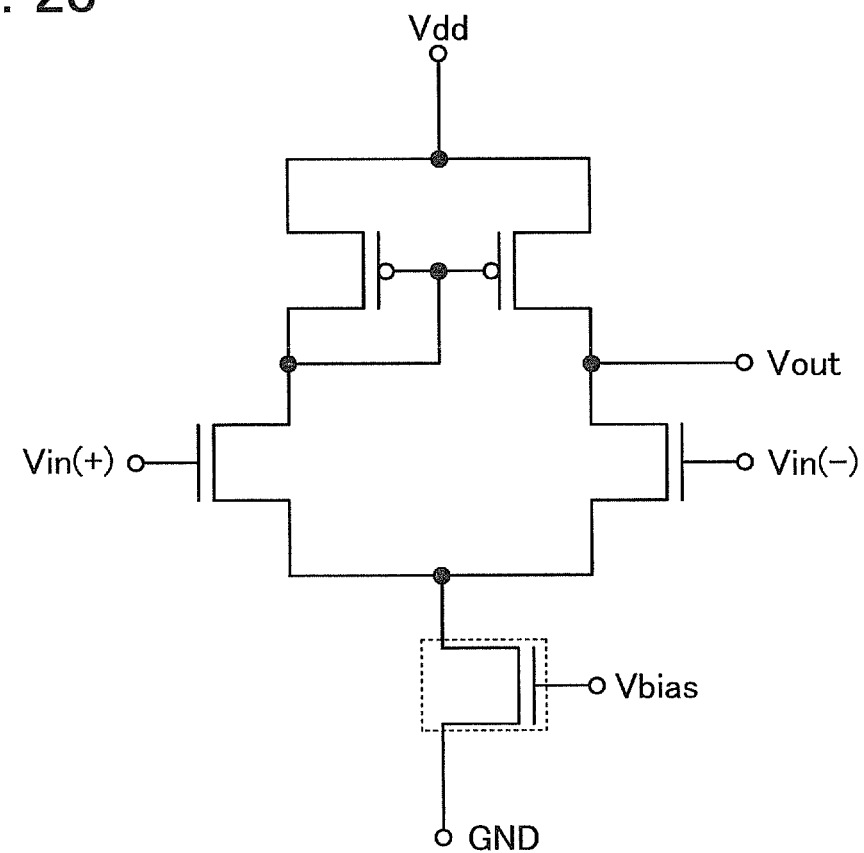
FIG. 23 is a circuit diagram for describing a differential sense amplifier circuit.

FIG. 23 illustrates a differential sense amplifier as an example of a sense amplifier circuit. The differential sense amplifier includes input terminals $V_{in}(+)$ and $V_{in}(-)$ and an output terminal $V_{out}$, and amplifies a difference between $V_{in}(+)$ and $V_{in}(-)$. The output $V_{out}$ is relatively high when $V_{in}(+) > V_{in}(-)$, and is relatively low when $V_{in}(+) < V_{in}(-)$.

Figure 24:
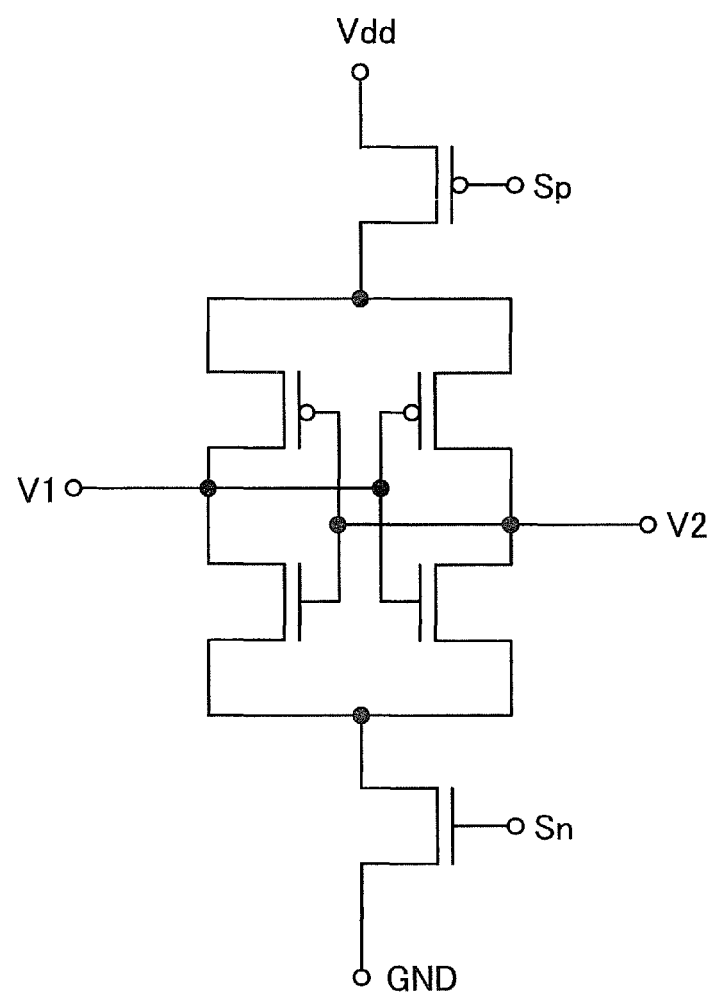
FIG. 24 is a circuit diagram for describing a latch sense amplifier.

FIG. 24 illustrates a latch sense amplifier as an example of a sense amplifier circuit. The latch sense amplifier includes input-output terminals V1 and V2 and input terminals of control signals Sp and Sn. First, power supply is stopped by setting the signal Sp at high and the signal Sn at low. Next, potentials to be compared are applied to V1 and V2. After that, when power is supplied by setting the signal Sp at low and the signal Sn at high, output V1 becomes high and output V2 becomes low when the potentials before supplying the power verify V1>V2. Output V1 becomes low and output V2 becomes high when potentials before supplying the power verify V1<V2. In such a manner, a potential difference between V1 and V2 is amplified.

Figure 25A:
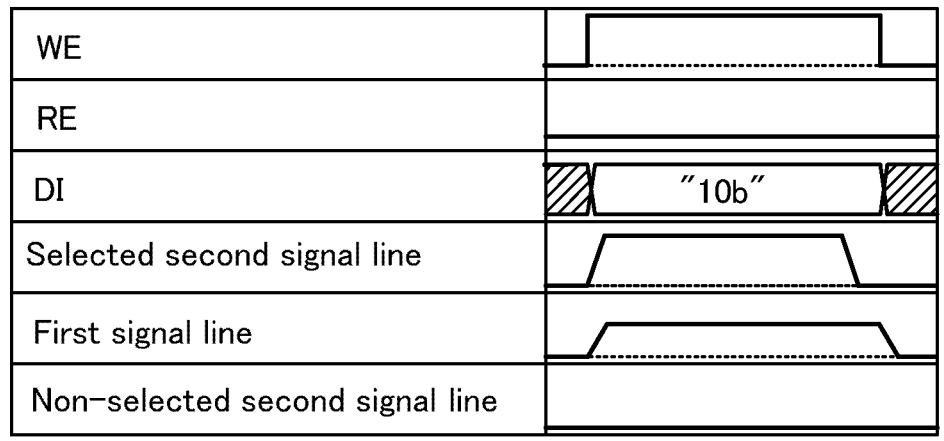
FIGS. 25A and 25B are timing charts for explaining an operation.
Figure 25B:
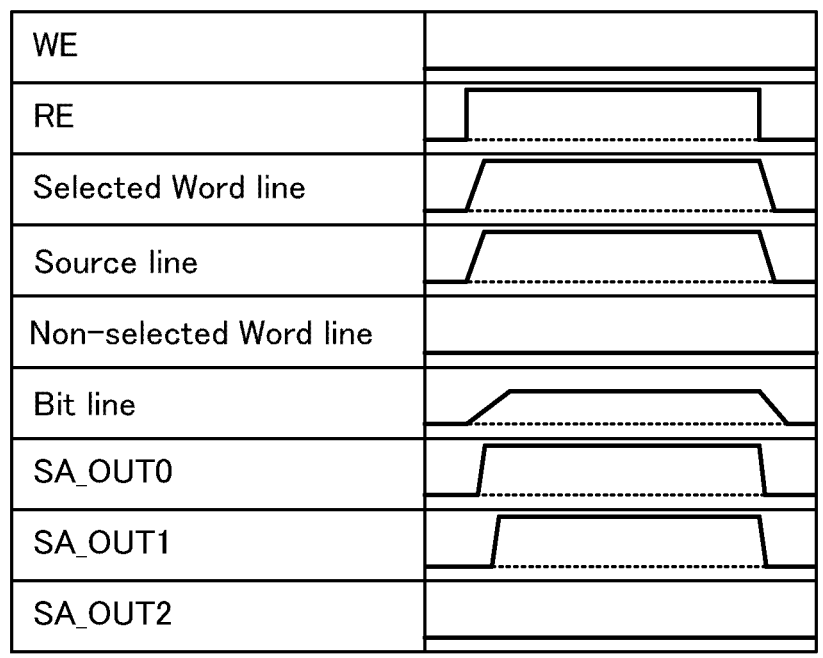

FIG. 25A illustrates an example of a timing chart of a writing operation. The case where data "10b" is a written to a memory cell is illustrated in the timing chart in FIG. 25A. The selected second signal line S2 becomes 0 [V] earlier than the first signal line S1. During the writing period, the potential of the first signal line S1 becomes $V_{10}$. Note that the word line WL, the bit line BL, and the source line SL are all at 0 [V]. In addition, FIG. 25B illustrates an example of a timing chart of reading operation. The case where data "10b" is read out from a memory cell is illustrated in the timing chart in FIG. 25B. The selected word line WL is asserted and the source line SL takes the potential $V_{s\_read}$ [V], whereby the bit line BL is charged to $V_{10}-V_{th}$ [V] corresponding to the data "10b" of the memory cell. As a result, SA_OUT0, SA_OUT1, and SA_OUT2 become "1", "1", and "0", respectively. Note that the first signal line S1 and the second signal line S2 are at 0 [V].

Here, examples of specific operation potentials (voltages) are described. For example, the following can be obtained: the threshold voltage of the transistor 201 is approximately 0.3 V, the power supply voltage $V_{DD}$ is 2 V, $V_{11}$ is 1.6 V, $V_{10}$ is 1.2 V, $V_{01}$ is 0.8 V, $V_{00}$ is 0V, $V_{ref0}$ is 0.6 V, $V_{ref1}$ is 1.0 V, and $V_{ref2}$ is 1.4 V. The potential $V_{pc}$ is preferably 0 V, for example.

Although, the first signal line S1 is arranged in the bit line BL direction (the column direction) and the second signal line S2 is arranged in the word line WL direction (the row direction) in this embodiment, one embodiment of the present invention is not limited thereto. For example, the first signal line S1 may be arranged in the word line WL direction (the row direction) and the second signal line S2 may be arranged in the bit line BL direction (the column direction). In such a case, the driver circuit to which the first signal line S1 is connected and the driver circuit to which the second signal line S2 is connected may be arranged as appropriate.

In this embodiment, operation of four-valued memory cells, i.e., writing any of four different states to one memory cell or reading any of four different states from one memory cell is described. By appropriately changing the circuit configuration, operation of n valued memory cells, i.e., writing any of n different states (n is integer greater than or equal to 2) to one memory cell or reading any of n different states from one memory cell, can be performed.

For example, in eight-valued memory cells, storage capacity becomes three times as large as two-valued memory cells. When writing data, eight values of potentials are prepared to decide a potential of a node A and eight states are prepared. When reading data, seven reference potentials capable of distinguishing the eight states are prepared. One sense amplifier is provided and comparison is performed seven times, so that data can be read. Further, the number of comparison times may be reduced to three times by feeding back the result of comparison. In a reading method for driving the source line SL, data can be read in one comparison by providing seven sense amplifiers. Furthermore, a plurality of sense amplifiers can be provided and comparison is performed plural times.

Generally, in $2^k$-valued memory cells (k is integer greater than or equal to 1), memory capacity is k times as large as that of two-valued memory cells. When writing data, $2^k$ values of writing potentials to decide a potential of a node A are prepared, each value corresponding to one of $2^k$ states. When reading data, $2^k-1$ values of reference potentials enabling to distinguish $2^k$ states may be set up. One sense amplifier is provided and comparison is performed $2^k-1$ times, so that data can be read. Further, the number of comparison times may be reduced to k times by feeding back the result of comparison. In a reading method for driving the source line SL, data can be read in one comparison by providing a $2^k-1$ number of sense amplifiers. Furthermore, a plurality of sense amplifiers can be provided and comparison is performed plural times.

The semiconductor device according to this embodiment can store information for quite a long time because of low off-state current characteristics of the transistor 202. That is, refresh operation which is necessary in DRAM and the like is not needed, so that power consumption can be reduced. In addition, the semiconductor device of this embodiment can be used as a substantially nonvolatile memory device.

Since writing data and the like are performed by switching operation of the transistor 202, high voltage is not needed and there is no problem of deterioration of elements. Further, high-speed operation can be easily realized because writing information and erasing information are performed by turning transistors on or off. Furthermore, information can be directly rewritten by controlling potentials input to transistors. Accordingly, erasing operation which is necessary in flash memory and the like is not needed, and decrease in operation speed due to erasing operation can be prevented.

Moreover, a transistor using a material other than an oxide semiconductor material can operate at sufficiently high speed; therefore, by using the transistor, memory content can be read at high speed.

The semiconductor device according to this embodiment is a multivalued semiconductor device, so that storage capacity per area can be increased. Therefore, the size of the semiconductor device can be reduced and the semiconductor device can be highly integrated. Additionally, potentials of nodes which take a floating state when writing operation is performed can be directly controlled; thus, threshold voltages of the semiconductor device can be easily controlled with high accuracy which is required for a multivalued memory. Therefore, verification of states after writing data which is required to a multivalued-type memory can be omitted, and in such a case, time required for writing data can be shortened.

Embodiment 3

In this embodiment, a circuit configuration and operation of a semiconductor device according to one embodiment of the present invention are described.

In this embodiment, a reading operation different from that of Embodiment 2 is described with the use of a circuit configuration of a memory element illustrated in FIG. 16. Note that the capacitor 205 shown in FIG. 16 is not always necessary and can be omitted in some cases. The memory element considered is a multivalued memory element, and a case where the memory element is a four-valued memory element is described in this embodiment. Four states of a memory cell 200 are data "00b", "01b", "10b", and "11b", and corresponding potentials of a node A are $V_{00}$, $V_{01}$, $V_{10}$, and $V_{11}$ ($V_{00}<V_{01}<V_{10}<V_{11}$), respectively.

When writing is performed to the memory cell 200, the source line SL is set to 0 [V], the word line WL is set to 0 [V], the bit line BL is set to 0 [V], and the second signal line S2 is set to 2 [V]. When the data "00b" is to be written, the first signal line S1 is set to $V_{00}$ [V]. When the data "01b" is to be written, the first signal line S1 is set to $V_{01}$ [V]. When the data "10b" is to be written, the first signal line S1 is set to $V_{10}$ [V]. When the data "11b" is to be written, the first signal line S1 is set to $V_{11}$ [V]. At this time, the transistor 203 is put in an off state and a transistor 202 to an on state. Note that when writing data is completed, the second signal line S2 is set to 0 [V] so as to turn off the transistor 202, before a potential of the first signal line S1 is changed.

As a result, after writing the data "00b", "01b", "10b", or "11b", the potential of a node connected to a gate electrode of the transistor 201 (hereinafter, referred to as a node A) is approximately $V_{00}$ [V], $V_{01}$ [V], $V_{10}$ [V], or $V_{11}$ [V], respectively. A charge is accumulated in the node A in accordance with the potential of the first signal line S1, and since off-state current of the transistor 202 is extremely small or substantially 0, the potential of the gate electrode of the transistor 201 is held for a long time.

Next, in the case where reading of the memory cell 200 is performed, the source line SL is set to 0 [V], the word line WL is set to $V_{DD}$, the second signal line S2 is set to 0 [V], the first signal line S1 is set to 0 [V], and a reading circuit 211 connected to the bit line BL is in an operation state. At this time, the transistor 203 is in an on state and the transistor 202 is in an off state.

As a result, an effective resistance value of the memory cell 200 between a source line SL and a corresponding bit line BL is function of the state of the memory cell 200. As the potential of the node A is increased, the effective resistance value is reduced. The reading circuit can read out the data "00b", "01b", "10b", and "11b" from potential differences caused by differences between resistance values. Note that in the case of data other than data "00b" in which the potential of the node A is the lowest value, it is preferable that the transistor 201 be in an on state.

Figure 26:
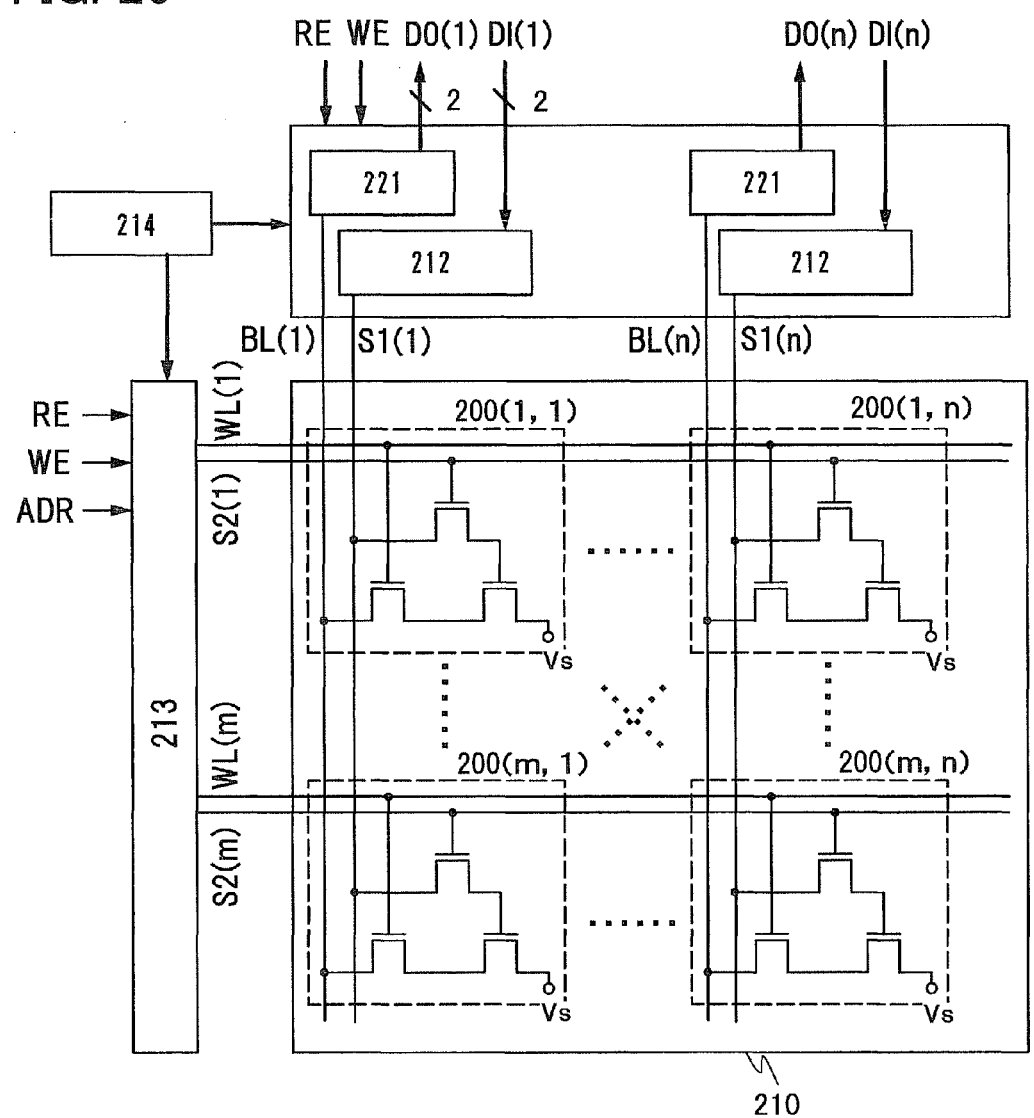
FIG. 26 is a circuit diagram for describing a semiconductor device.

FIG. 26 illustrates a block circuit diagram of another example of a semiconductor device according to one embodiment of the present invention, which includes memory capacity of m×n bits.

The semiconductor device illustrated in FIG. 26 includes an m number of word lines WL, an m number of second signal lines S2, an n number of bit lines BL, an n number of first signal lines S1, a memory cell array 210 in which the plurality of memory cells 200(1, 1) to 200(m, n) are arranged in a matrix of m cells in vertical (rows) by n cells in horizontal (columns) (both m and n are natural numbers), and peripheral circuits such as reading circuits 221, first signal line driver circuits 212, a driver circuit 213 for the second signal lines and the word lines, and a potential generating circuit 214. A refresh circuit or the like may be provided as another peripheral circuit.

Each of the memory cells, for example, a memory cell 200(i, j) is considered (here, i is an integer greater than or equal to 1 and less than or equal to m and j is an integer greater than or equal to 1 and less than or equal to n). The memory cell 200(i, j) is connected to a bit line BL(j), a first signal line S1(j), a word line WL(i), a second signal line S2(i), and a source wiring. A potential Vs (0V for example) is applied to the source wiring. In addition, the bit lines BL(1) to BL(n) are connected to the reading circuits 221, the first signal lines S1(1) to S1(n) are connected to the first signal line driver circuits 212, the word lines WL(1) to WL(m) and the second signal lines S2(1) to S2(m) are connected to the driver circuit 213 for the second signal lines and the word lines.

Note that, the configurations of the potential generating circuit 214, the driver circuit 213 for the second signal lines and the word signal lines, and the first signal line driver circuit 212 may be the same as the configurations of FIG. 21, FIG. 18, and FIG. 19, for example.

Figure 27:
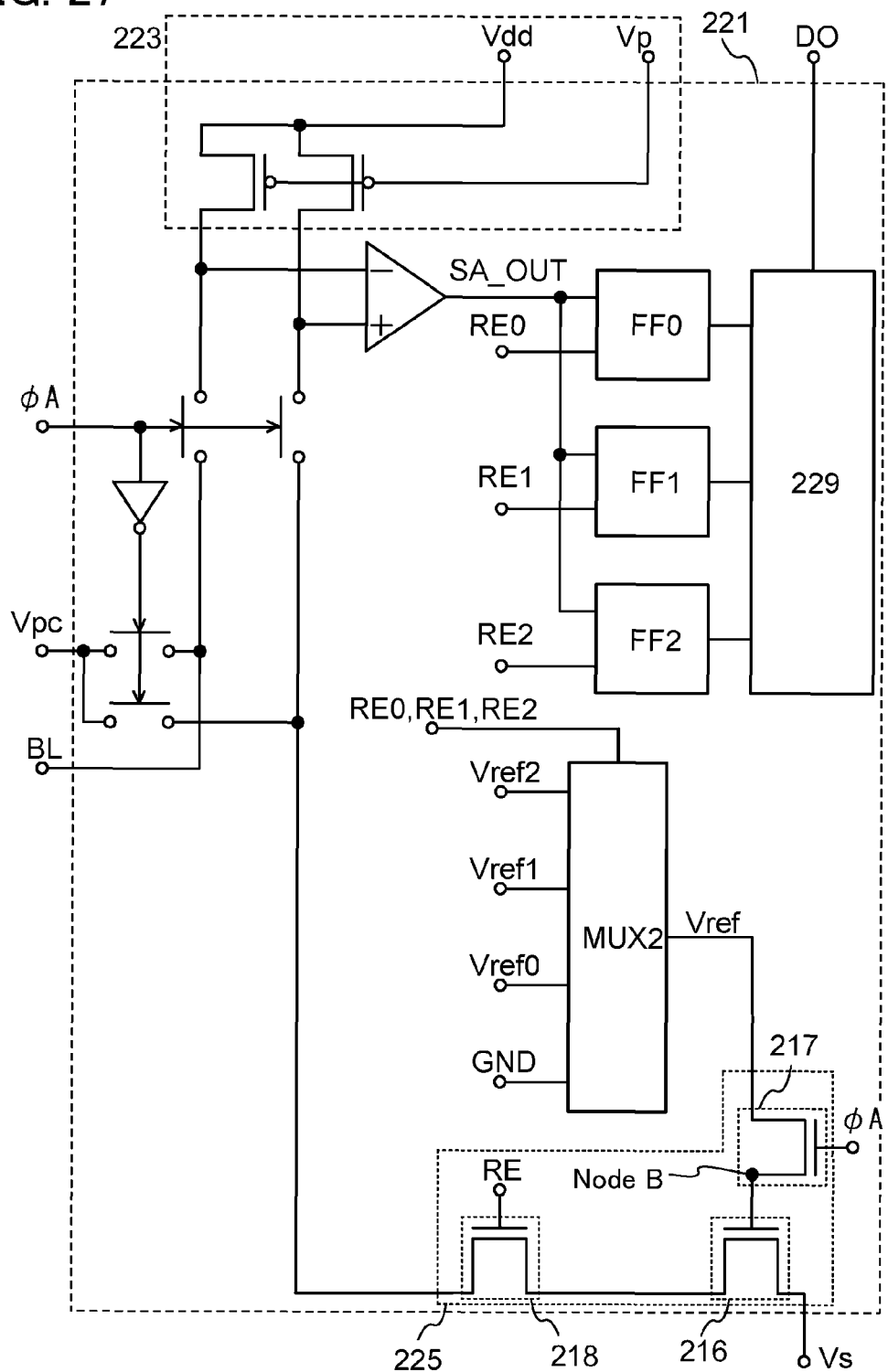
FIG. 27 is a circuit diagram for describing a reading circuit.

FIG. 27 illustrates an example of the reading circuit 221. The reading circuit 221 includes a sense amplifier circuit, a reference cell 225, a logic circuit 229, a multiplexer (MUX2), flip-flop circuits FF0, FF1, and FF2, a bias circuit 223, and the like. The reference cell 225 includes a transistor 216, a transistor 217, and a transistor 218. The transistor 216, the transistor 217, and the transistor 218 included in the reference cell 225 correspond to the transistor 201, the transistor 202, and the transistor 203 included in the memory cell, respectively, and form the same circuit configuration as the memory cell. It is preferable that the transistor 216 and the transistor 218 be formed using materials other than an oxide semiconductor, and the transistor 217 be formed using an oxide semiconductor. In addition, in the case where the memory cell includes the capacitor 205, it is preferable that the reference cell 225 also include a capacitor. Two output terminals of the bias circuit 223 are connected to the bit line BL and a drain electrode of the transistor 218 included in the reference cell 225, respectively, through a switch. In addition, the output terminals of the bias circuit 223 are connected to input terminals of the sense amplifier circuit. An output terminal of the sense amplifier circuit is connected to the flip-flop circuits FF0, FF1, and FF2. Output terminals of the flip-flop circuits FF0, FF1, and FF2 are connected to input terminals of the logic circuit 229. Signals RE0, RE1, and RE2, reference potentials $V_{ref0}$, $V_{ref1}$, and $V_{ref2}$, and GND are input to the multiplexer (MUX2). An output terminal of the multiplexer (MUX2) is connected to one of a source electrode and a drain electrode of the transistor 217 included in the reference cell 225. The bit line BL and the drain electrode of the transistor 218 included in the reference cell 225 are connected to a wiring $V_{pc}$ through switches. Note that the switches are controlled by a signal φA.

The reading circuit 221 has a structure in which a comparison of the conductance of the memory cell with the conductance of the reference cell 225 is performed by comparing potential values output from the memory cell and the reference cell. This structure includes one sense amplifier circuit. In this structure, the comparison is performed three times in order to read out the four states. In other words, the comparison of the conductance of the memory cell with the conductance of the reference cell 225 is performed in the case of each of three values of reference potentials. The three comparisons are controlled by the signals RE0, RE1, RE2, and φA. The multiplexer (MUX2) selects any of the three values of reference potentials $V_{ref0}$, $V_{ref1}$, and $V_{ref2}$, and GND in accordance with the values of the signals RE0, RE1, and RE2. The behavior of the multiplexer (MUX2) is illustrated in Table 3. The flip-flop circuits FF0, FF1, and FF2 are controlled by the signals RE0, RE1, and RE2, respectively, and store the value of an output signal SA_OUT of the sense amplifier.

TABLE 3

| RE0 | RE1 | RE2 | VwL |
|---|---|---|---|
| 0 | 0 | 0 | Corresponds to GND |
| 1 | 0 | 0 | Corresponds to Vref0 |
| 0 | 1 | 0 | Corresponds to Vref1 |
| 0 | 0 | 1 | Corresponds to Vref2 |

The values of the reference potentials are determined so as to be $V_{00} < V_{ref0} < V_{01} < V_{ref1} < V_{10} < V_{ref2} < V_{11}$. Thus, the four states can be read out from the results of the three comparisons. The values of the flip-flop circuits FF0, FF1, and FF2 are "0", "0", and "0", respectively in the case of the data "00b". The values of the flip-flop circuits FF0, FF1, and FF2 are "1", "0", and "0", respectively in the case of the data "01b". The values of the flip-flop circuits FF0, FF1, and FF2 are "1", "1", and "0", respectively in the case of the data "10b". The values of the flip-flop circuits FF0, FF1, and FF2 are "1", "1", and "1", respectively in the case of the data "11b". In this manner, the state of the memory cell can be read out as a 3-bit digital signal. After that, with the use of the logic circuit 229 whose a logic value table is shown in Table 2, 2-bit data DO is generated and output from the reading circuit.

Note that in the reading circuit illustrated in FIG. 27, when a signal RE is de-asserted, the bit line BL and the reference cell 225 are connected to the wiring $V_{pc}$ so that pre-charge is performed. When the signal RE is asserted, electrical continuity between the bit line BL and the bias circuit 223 and between the reference cell 225 and the bias circuit 223 is established.

Note that the pre-charge is not necessarily performed. In this circuit, it is preferable that the circuits which generate two signals input to the sense amplifier circuit have almost the same structure. For example, it is preferable that the structure of the transistors in the reference cell 225 be the same as the structure of the corresponding transistors in the memory cell. It is preferable that the corresponding transistors in the bias circuit 223 and the switch have the same structure.

Figure 28:
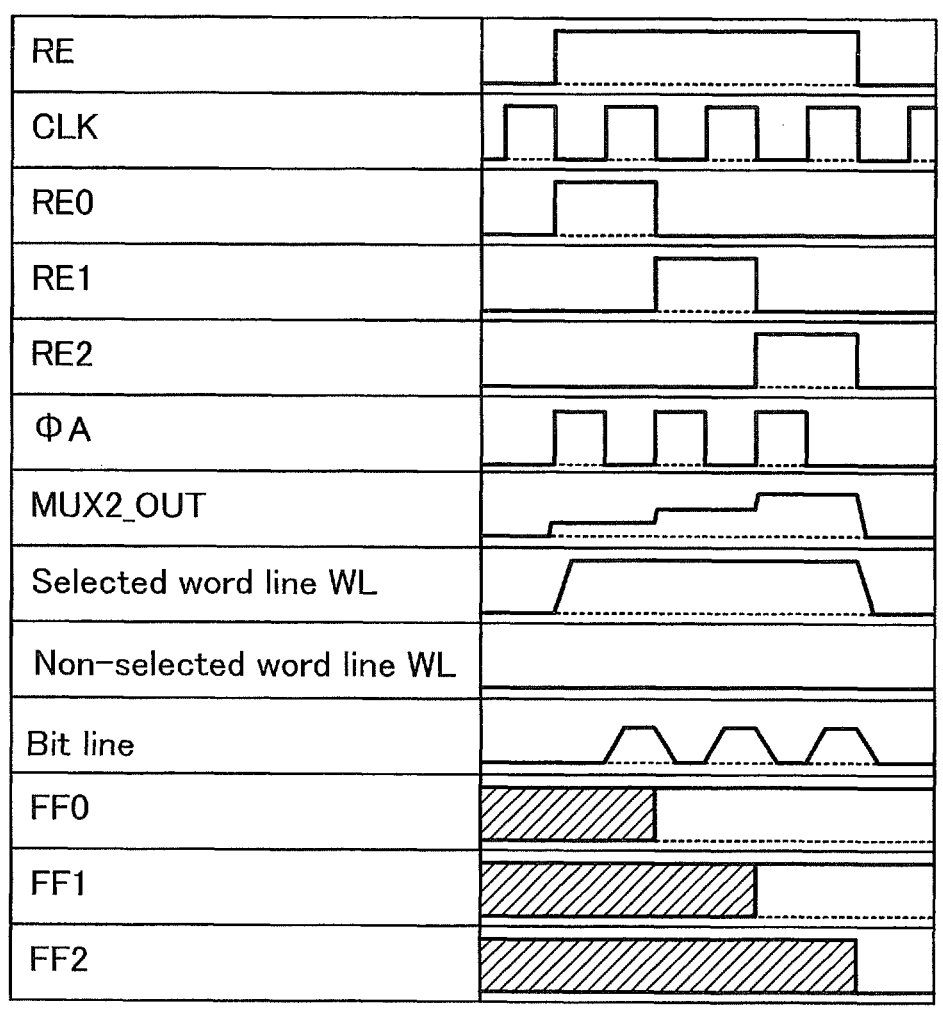
FIG. 28 is a timing chart for explaining an operation.

A timing chart of the writing operation is the same as FIG. 25A. An example of a timing chart of the reading operation is shown in FIG. 28. FIG. 28 shows a timing chart in the case where the data "10b" is read out from the memory cell. $V_{ref0}$, $V_{ref1}$, and $V_{ref2}$ are input to an output MUX2_OUT of the multiplexer (MUX2) in respective periods in which the signals RE0, RE1, and RE2 are asserted. In a first half of each of the periods, the signal φA is asserted and a predetermined potential is applied to a node B of the transistor included in the reference cell 225. In a latter half of each of the periods, the signal φA is de-asserted, the predetermined potential is held in the node B of the transistor included in the reference cell 225 and the drain electrode of the transistor 218 included in the reference cell 225 is connected to the bias circuit 223. Then, a result of the comparison in the sense amplifier circuit is stored in each of the flip-flop circuits FF0, FF1, and FF2. In the case of the data of the memory cell is "10b", the values of the flip-flop circuits FF0, FF1, and FF2 are "1", "1", and "0", respectively. Note that the first signal line S1 and the second signal line S2 are at 0 [V].

Next, a reading circuit which is different from that illustrated in FIG. 20 and a reading method are described.

Figure 29:
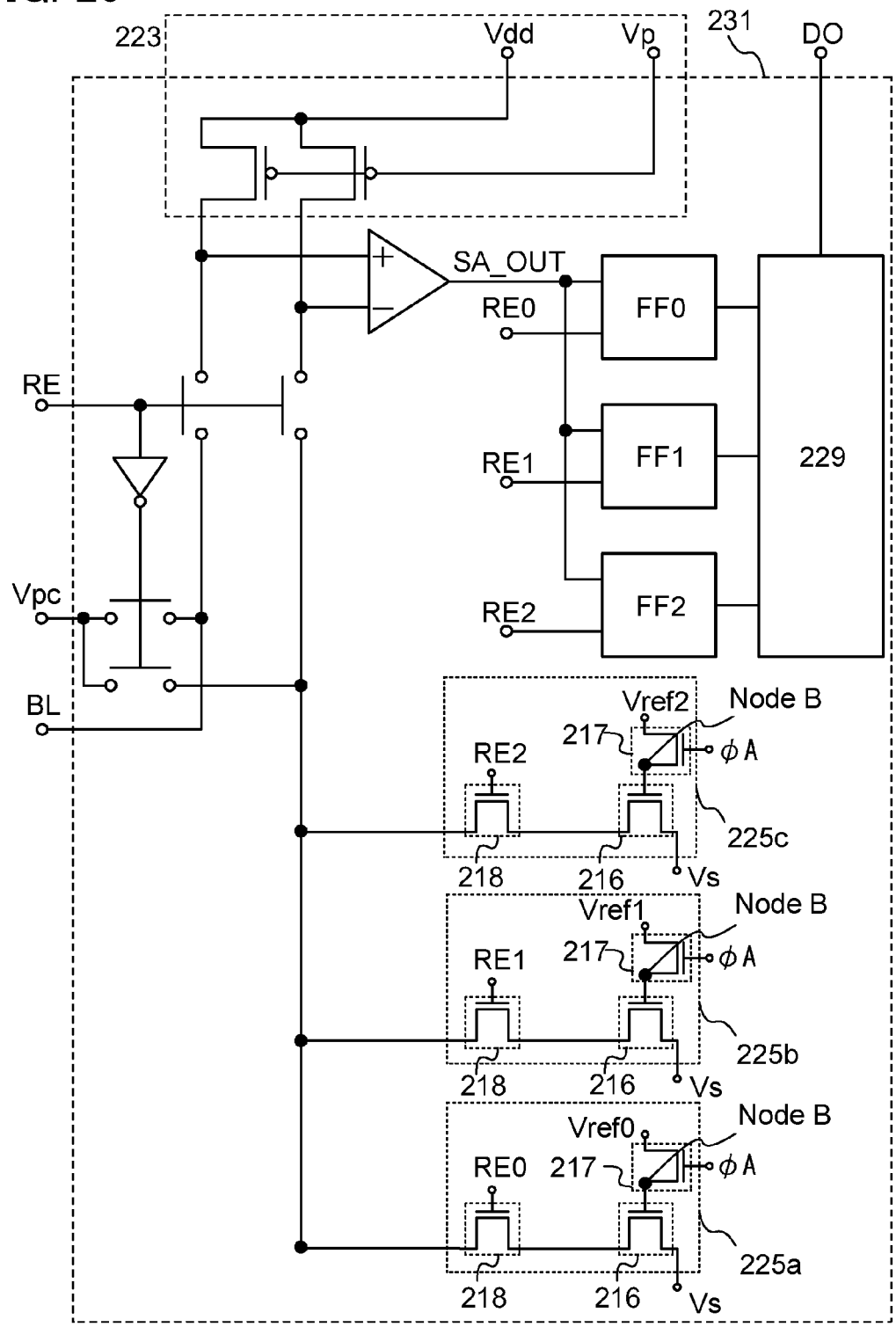
FIG. 29 is a circuit diagram for describing a reading circuit.

FIG. 29 illustrates an example of a reading circuit 231. The reading circuit 231 includes a sense amplifier circuit, a plurality of reference cells (a reference cell 225a, a reference cell 225b, and a reference cell 225c), the logic circuit 229, the flip-flop circuits FF0, FF1, and FF2, the bias circuit 223, and the like.

The reference cell each includes a transistor 216, a transistor 217, and a transistor 218. Transistors 216, 217, and 218 correspond to transistor 201, 202, and 203, respectively, and form the same circuit configuration as that of the memory cell 200. It is preferable that the transistors 216 and the transistors 218 be formed using materials other than an oxide semiconductor, and the transistors 217 be formed using an oxide semiconductor. In addition, in the case where the memory cells include capacitors 205, it is preferable that the reference cell also include a capacitor. Two output terminals of the bias circuit 223 are connected to the bit line BL and the drain electrodes of the transistors 218 included in the plurality of reference cells, respectively, through switches. In addition, the output terminals of the bias circuit 223 are connected to input terminals of the sense amplifier circuit. An output terminal of the sense amplifier circuit is connected to the flip-flop circuits FF0, FF1, and FF2. Output terminals of the flip-flop circuits FF0, FF1, and FF2 are connected to input terminals of the logic circuit 229. The bit line BL and the drain electrodes of the transistors 218 included in the reference cells are connected to a wiring $V_{pc}$ through switches. Note that the switches are controlled by a read enable signal (an RE signal).

The reading circuit 231 has a configuration in which a comparison of the conductance of the memory cell with the conductance of the plurality of the reference cells is performed by comparing potential values output from the memory cells and the reference cell. This configuration includes one sense amplifier circuit. In this structure, the comparison is performed three times in order to read out the four states. That is, the reading circuit 231 has a structure in which the comparison of the conductance of the memory cell with the conductance of each of the three reference cells is performed. The three comparisons are controlled by the signals RE0, RE1, and RE2. $V_{ref0}$, $V_{ref1}$, and $V_{ref2}$ are input to the gate electrode of the transistor 216 of the three respective reference cells through the transistors 217. Before reading, the signal φA is asserted, all the transistors 217 are turned on, and writing to the reference cells is performed. The writing to the reference cells may be performed once before the reading operation. Needless to say, writing may be performed once when reading is performed several times, or may be performed every time when reading is performed. In addition, the flip-flop circuits FF0, FF1, and FF2 are controlled by the signals RE0, RE1, and RE2, and store the value of the output signal SA_OUT of the sense amplifier.

The values of the reference potentials are determined so as to verify $V_{00}<V_{ref0}<V_{01}<V_{ref1}<V_{10}<V_{ref2}<V_{11}$. Thus, the four states can be read out from the results of the three comparisons. The values of the flip-flop circuits FF0, FF1, and FF2 are "0", "0", and "0", respectively in the case of the data "00b". The values of the flip-flop circuits FF0 FF1, and FF2 are "1", "0", and "0", respectively in the case of the data "01b". The values of the flip-flop circuits FF0, FF1, and FF2 are "1", "1", and "0", respectively in the case of the data "10b". The values of the flip-flop circuits FF0, FF1, and FF2 are "1", "1", and "1", respectively in the case of the data "11b". In this manner, the state of the memory cell can be read out as a 3-bits digital signal. After that, with the use of the logic circuit 229 which is represented in a logic value table shown in Table 2, 2-bit data DO is generated and output from the reading circuit.

Note that in the reading circuit illustrated in FIG. 29, when the RE signal is de-asserted, the bit line BL and the reference cells are connected to the wiring $V_{pc}$ so that pre-charge is performed. When the RE signal is asserted, electrical continuity between the bit line BL and the bias circuit 223 and between the reference cells and the bias circuit 223 is established.

Note that the pre-charge is not necessarily performed. In this circuit, it is preferable that the circuits which generate two signals input to the sense amplifier circuit have almost the same structure. For example, it is preferable that the structure of the transistors in the reference cells be the same as the structure of the corresponding transistors in the memory cell. It is preferable that the corresponding transistors in the bias circuit 223 and the switch have the same structure.

Figure 30:
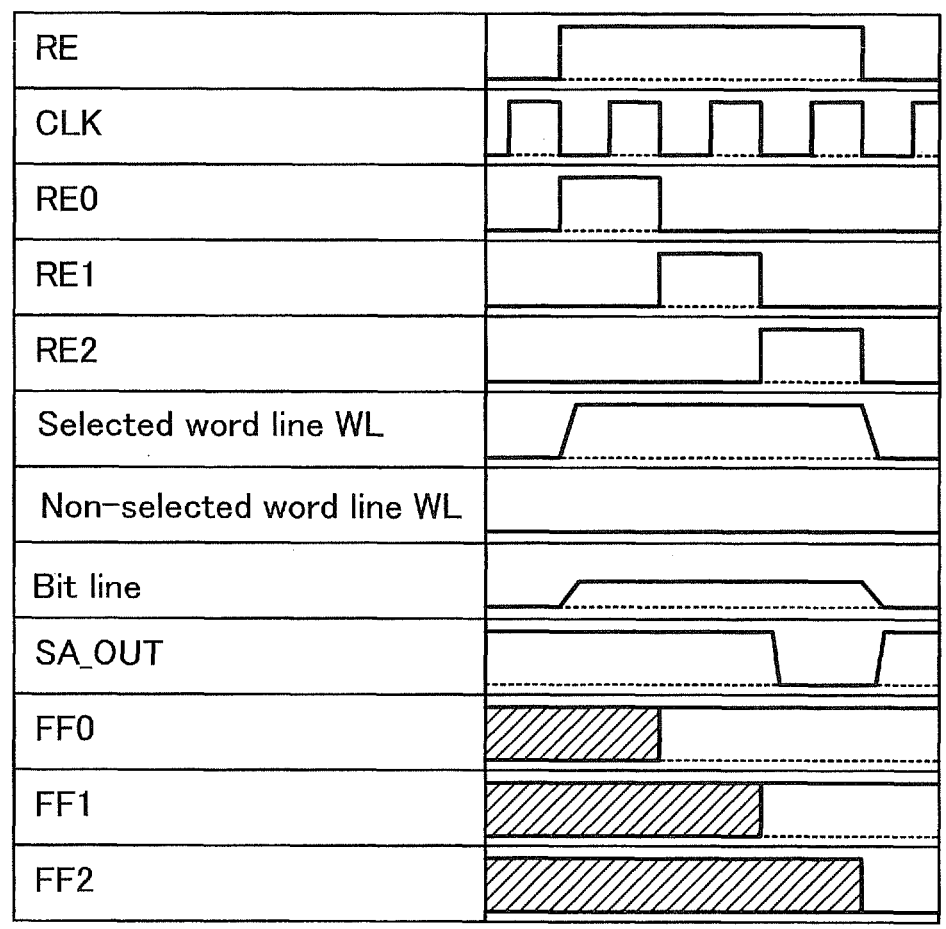
FIG. 30 is a timing chart for explaining an operation.

A timing chart of the writing operation is the same as FIG. 25A. An example of a timing chart of the reading operation is shown in FIG. 30. FIG. 30 shows a timing chart in the case where the data "10b" is read out from the memory cell. The reference cell 225a, the reference cell 225b, and the reference cell 225c are selected and connected to the bias circuit 223 in respective terms in which the signals RE0, RE1, and RE2 are asserted. Then, a result of comparison in the sense amplifier circuit is stored in each of the flip-flop circuits FF0, FF1, and FF2. In the case of the data of the memory cell is "10b", the values of the flip-flop circuits FF0, FF1, and FF2 are "1", "1", and "0", respectively. Note that the first signal line S1 and the second signal line S2 have 0 [V].

Examples of specific operation potentials (voltages) are described. For example, the following can be obtained: the threshold voltage of the transistor 201 is approximately 0.3 V, the power supply potential $V_{DD}$ is 2 V, $V_{11}$ is 1.6 V, $V_{10}$ is 1.2 V, $V_{01}$ is 0.8 V, $V_{00}$ is 0V, $V_{ref0}$ is 0.6 V, $V_{ref1}$ is 1.0 V, and $V_{ref2}$ is 1.4 V. The potential $V_{pc}$ is preferably 0 V, for example.

Although, the first signal line S1 is arranged in the bit line BL direction (the column direction) and the second signal line S2 is arranged in the word line WL direction (the row direction) in this embodiment, one embodiment of the present invention is not limited thereto. For example, the first signal line S1 may be arranged in the word line WL direction (the row direction) and the second signal line S2 may be arranged in the bit line BL direction (the column direction). In such a case, the driver circuit to which the first signal line S1 is connected and the driver circuit to which the second signal line S2 is connected may be arranged as appropriate.

In this embodiment, operation of four-valued memory cells, i.e., writing any of four different states to one memory cell or reading any of four different states from one memory cell is described. By appropriately changing the circuit configuration, operation of n-valued memory cells, i.e., writing any of n different states (n is an integer greater than or equal to 2) to one memory cell or reading any of n different states from one memory cell, can be performed.

For example, in eight-valued memory cells, storage capacity becomes three times as large as two-valued memory cells. When writing data, eight values of potentials corresponding to eight states are prepared to decide a potential of a node A. When reading data, seven reference potentials capable of distinguishing the eight states are prepared. One sense amplifier is provided and comparison is performed seven times, so that data can be read. Further, the number of comparison times may be reduced to three times by feeding back the result of comparison. In a reading method for driving the source line SL, data can be read in one comparison by providing seven sense amplifiers. Furthermore, a plurality of sense amplifiers can be provided and comparison is performed plural times.

Generally, in $2^k$-valued memory cells (k is an integer greater than or equal to 1), memory capacity is k times as large as that of two-valued memory cells. When writing data, $2^k$ values of writing potentials to decide a potential of a node A are prepared, each value corresponding to one of $2^k$ states. When reading data, $2^k-1$ values of reference potentials enabling to distinguish $2^k$ states may be set up. One sense amplifier is provided and comparison is performed $2^k-1$ times, so that data can be read. Further, the number of comparison times may be reduced to k times by feeding back the result of comparison. In a reading method for driving the source line SL, data can be read in one comparison by providing a $2^k-1$ number of sense amplifiers. Furthermore, a plurality of sense amplifiers can be provided and comparison is performed plural times.

The semiconductor device according to this embodiment can store information for quite a long time because of low off-state current characteristics of the transistor 202. That is, refresh operation which is necessary in DRAM and the like is not needed, so that power consumption can be reduced. In addition, the semiconductor device of this embodiment can be used as a substantially nonvolatile memory device.

Since writing information and the like are performed by switching operation of the transistor 202, high voltage is not needed and there is no problem of deterioration of elements. Further, high-speed operation can be easily realized because writing information and erasing information are performed by turning transistors on or off. Furthermore, information can be directly rewritten by controlling potentials input to transistors. Accordingly, erasing operation which is necessary in flash memory and the like is not needed, and decrease in operation speed due to erasing operation can be prevented.

In addition, the transistor formed using a material other than an oxide semiconductor can be operated at sufficient high speed; therefore, by using the transistor, stored contents can be read out at high speed.

The semiconductor device according to this embodiment is a multivalued semiconductor device, so that storage capacity per area can be increased. Therefore, the size of the semiconductor device can be reduced and the semiconductor device can be highly integrated. Additionally, potentials of a node which takes a floating state when writing operation is performed can be directly controlled; thus, threshold voltages of the semiconductor device can be easily controlled with high accuracy which is required for a multivalued memory. Therefore, verification of states after writing data which is necessary to a multivalued-type memory can be omitted, and in such a case, time required for writing data can be shortened.

Embodiment 4

In this embodiment, a circuit configuration and operation of a semiconductor device which is different from Embodiment 2 and Embodiment 3 are described as an example.

Figure 31:
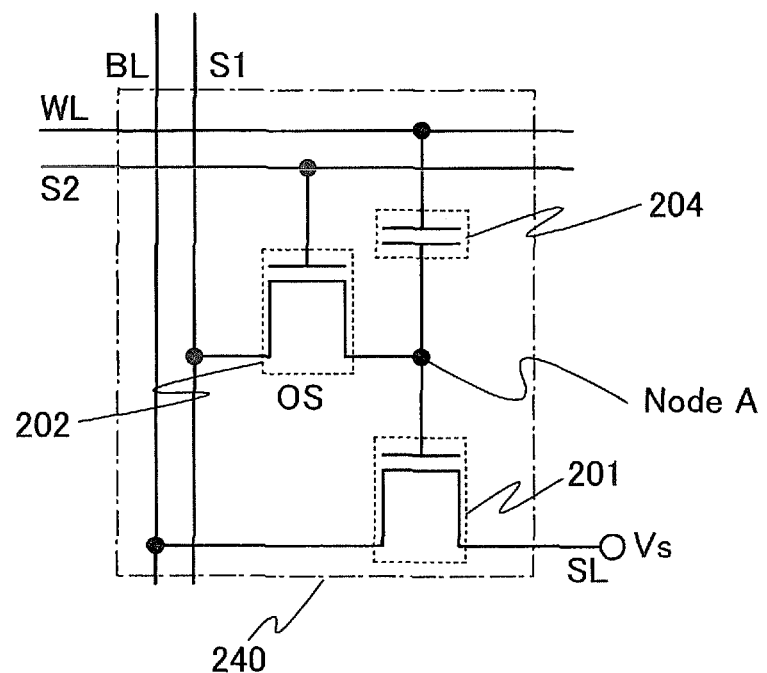
FIG. 31 is a circuit diagram for describing a memory element.

FIG. 31 illustrates an example of a circuit diagram of a memory cell included in the semiconductor device. A memory cell 240 illustrated in FIG. 31 includes a source line SL, a bit line BL, a first signal line S1, a second signal line S2, a word line WL, a transistor 201, a transistor 202, and a capacitor 204. The transistor 201 is formed using a material other than an oxide semiconductor, and the transistor 202 is formed using an oxide semiconductor.

Here, a gate electrode of the transistor 201, one of a source electrode and a drain electrode of the transistor 202, and one of electrodes of the capacitor 204 are electrically connected to one another. In addition, the source line SL and a source electrode of the transistor 201 are electrically connected to each other. The bit line BL and a drain electrode of the transistor 201 are electrically connected to each other. The first signal line S1 and the other of the source electrode and the drain electrode of the transistor 202 are electrically connected to each other. The second signal line S2 and a gate electrode of the transistor 202 are connected to each other. The word line WL and the other of the electrodes of the capacitor 204 are electrically connected to each other.

Next, operation of the memory cell 240 illustrated in FIG. 31 is described. Here, a four-valued memory cell is employed. Four states of the memory cell 240 are data "00b", "01b", "10b", and "11b", and potentials of a node A in the four states are $V_{00}$, $V_{01}$, $V_{10}$, and $V_{11}$ ($V_{00}<V_{01}<V_{10}<V_{11}$), respectively.

When writing is performed to the memory cell 240, the source line SL is set to 0 [V], the word line WL is set to 0 [V], the bit line BL is set to 0 [V], and the second signal line S2 is set to $V_{DD}$. When the data "00b" is written, the first signal line S1 is set to $V_{00}$ [V]. When the data "01b" is written, the first signal line S1 is set to $V_{01}$ [V]. When the data "10b" is written, the first signal line S1 is set to $V_{10}$ [V]. When the data "11b" is written, the first signal line S1 is set to $V_{11}$ [V]. At this time, the transistor 203 becomes in an off state and the transistor 202 becomes in an on state. Note that when writing data is finished, the second signal line S2 is set to 0 [V] so as to turn off the transistor 202, before a potential of the first signal line S1 is changed.

As a result, after the writing of the data "00b", "01b", "10b", or "11b" (the potential of the word line WL is set to 0 [V]), the potential of a node connected to a gate electrode of the transistor 201 (hereinafter, referred to as a node A) is approximately $V_{00}$ [V], $V_{01}$ [V], $V_{10}$ [V], or $V_{11}$ [V], respectively. A charge is accumulated in the node A in accordance with the potential of the first signal line S1, and since off-state current of the transistor 202 is extremely small or substantially 0, the potential of the gate electrode of the transistor 201 is held for a long time.

Next, in the case where reading of the memory cell 240 is performed, the source line SL is set to 0 [V], the second signal line S2 is set to 0 [V], the first signal line S1 is set to 0 [V], and a reading circuit connected to the bit line BL is in an operation state. At this time, the transistor 202 is in an off state.

The word line WL is set to $V_{-WL}$ [V]. The potential of the node A of the memory cell 240 depends on the potential of the word line WL. As the potential of the word line WL increases, the potential of the node A of the memory cell 240 increases. For example, the potential of the word line WL applied to the memory cells in the four different states is changed from a low potential to a high potential, the transistor 201 of the memory cell of the data "11b" is turned on first, and then, the memory cell of the data "10b", the memory cell of the data "01b", and the memory cell of the data "00b" are turned on in this order. In other words, by appropriately selecting the potential of the word line WL, the states of the memory cells (that is, the data included in the memory cells) can be distinguished. By appropriately selecting the potential of the word line WL, the memory cell in which the transistor 201 is in an on state is in a low resistance state, and the memory cell in which the transistor 201 is in an off state is in a high resistance state; therefore, when the resistance state is distinguished by the reading circuit, the data "00b", "01b", "10b", and "11b" can be read out.

Figure 32:
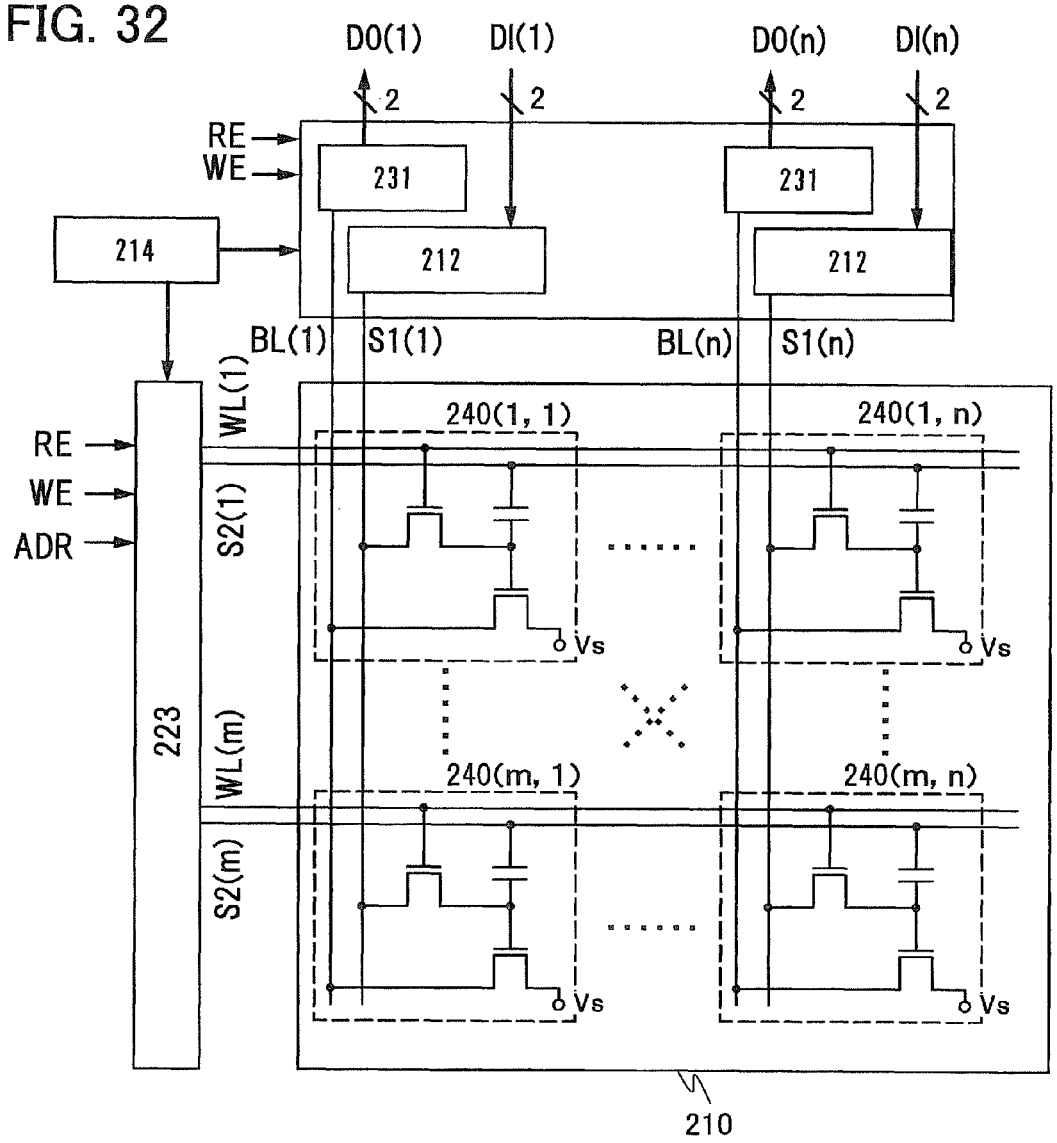
FIG. 32 is a circuit diagram for describing a semiconductor device.

FIG. 32 illustrates a block circuit diagram of another example of a semiconductor device according to one embodiment of the present invention, which includes memory capacity of m×n bit.

The semiconductor device illustrated in FIG. 32 includes an m number of the word lines WL, an m number of the second signal lines S2, an n number of the bit lines BL, an n number of the first signal lines S1, a memory cell array 210 in which the plurality of memory cells 240(1, 1) to 240(m, n) are arranged in a matrix of m cells in vertical (rows) by n cells in horizontal (columns) (both m and n are natural numbers), and peripheral circuits such as reading circuits 231, first signal line driver circuits 212, a driver circuit 223 for the second signal lines and the word lines, and a potential generating circuit 214. A refresh circuit or the like may be provided as another peripheral circuit.

Each of the memory cells, for example, a memory cell 240(i, j) is considered (here, i is an integer greater than or equal to 1 and less than or equal to m and j is an integer greater than or equal to 1 and less than or equal to n). The memory cell 240(i, j) is connected to a bit line BL(j), a first signal line S1(j), a word line WL(i), a second signal line S2(i), and a source wiring SL. A potential Vs (0V for example) is applied to the source wiring SL. In addition, the bit lines BL(1) to BL(n) are connected to the reading circuit 231, the first signal lines S1(1) to S1(n) are connected to the first signal line driver circuits 212, the word lines WL(1) to WL(m) and the second signal lines S2(1) to S2(m) are connected to the driver circuit 223 for the second signal lines S2 and the word lines WL.

Note that the configurations illustrated in FIG. 19 and FIG. 21 can be used for the configurations of the first signal line driver circuit 212 and the potential generating circuit 214, respectively.

Figure 33:
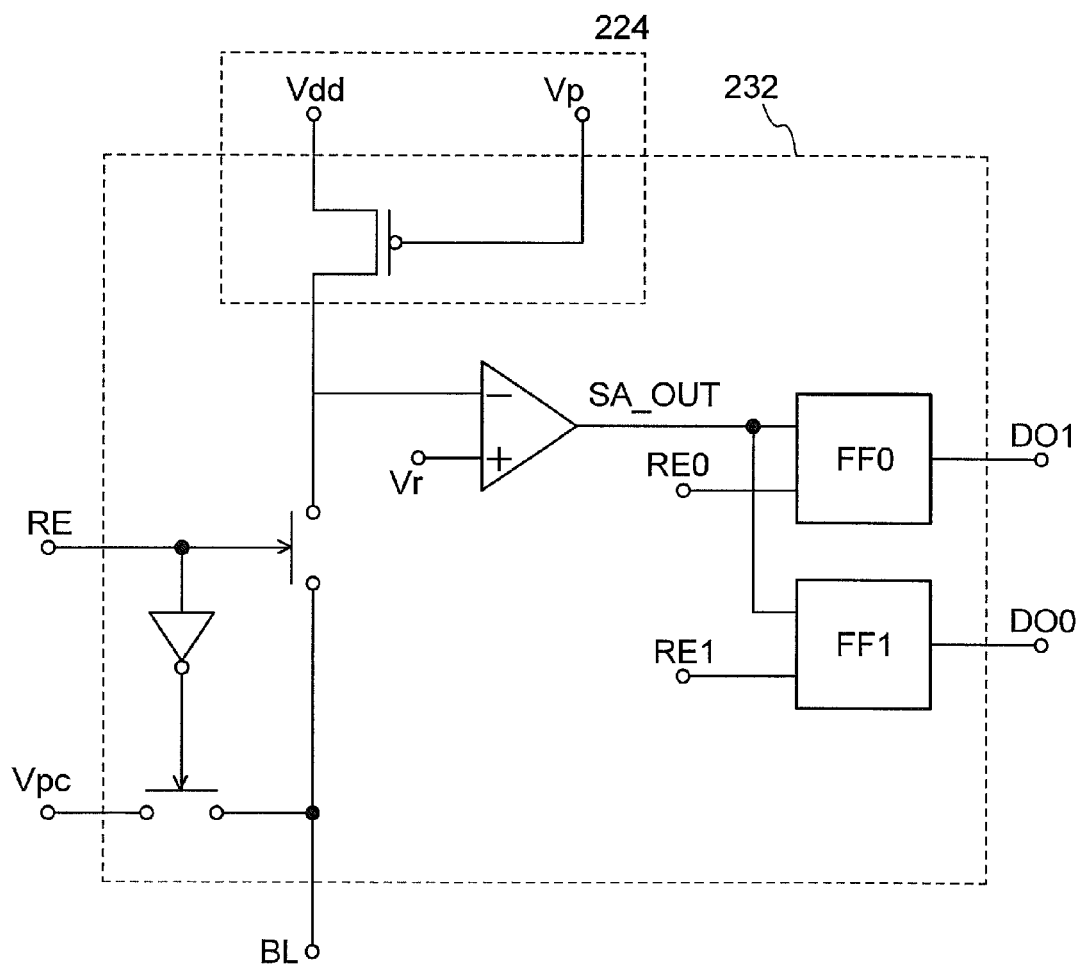
FIG. 33 is a circuit diagram for describing a reading circuit.

FIG. 33 illustrates an example of the reading circuit. The reading circuit includes a sense amplifier circuit, flip-flop circuits, a bias circuit 224, and the like. The bias circuit 224 is connected to the bit line BL through a switch. Further, the bias circuit 224 is connected to an input terminal of the sense amplifier circuit. A reference potential $V_r$ is input to the other input terminal of the sense amplifier circuit. An output terminal of the sense amplifier circuit is connected to input terminals of flip-flop circuits FF0 and FF1. Note that the switch is controlled by a read enable signal (an RE signal). The reading circuit can read data out by reading out the voltage output by a specified memory cell to the bit line BL to which it is connected. The potential of the bit line BL is function of the conductance of the memory cell. Note that reading of the conductance of the memory cell indicates reading of an on or off state of the transistor 201 included in the memory cell.

The reading circuit illustrated in FIG. 33 includes the sense amplifier circuit and performs comparison twice in order to distinguish the four different states. The two comparisons are controlled by signals RE0 and RE1. The flip-flop circuits FF0 and FF1 are controlled by the signals RE0 and RE1, respectively, and store the value of an output signal of the sense amplifier circuit. An output DO[1] of the flip-flop circuit FF0 and an output DO[0] of the flip-flop circuit FF1 are output from the reading circuit.

Note that in the reading circuit illustrated, when the RE signal is de-asserted, the bit line BL is connected to the wiring $V_{pc}$ and pre-charge is performed. When the RE signal is asserted, electrical continuity between the bit line BL and the bias circuit 224 is established. Note that pre-charge is not necessarily performed.

Figure 34:
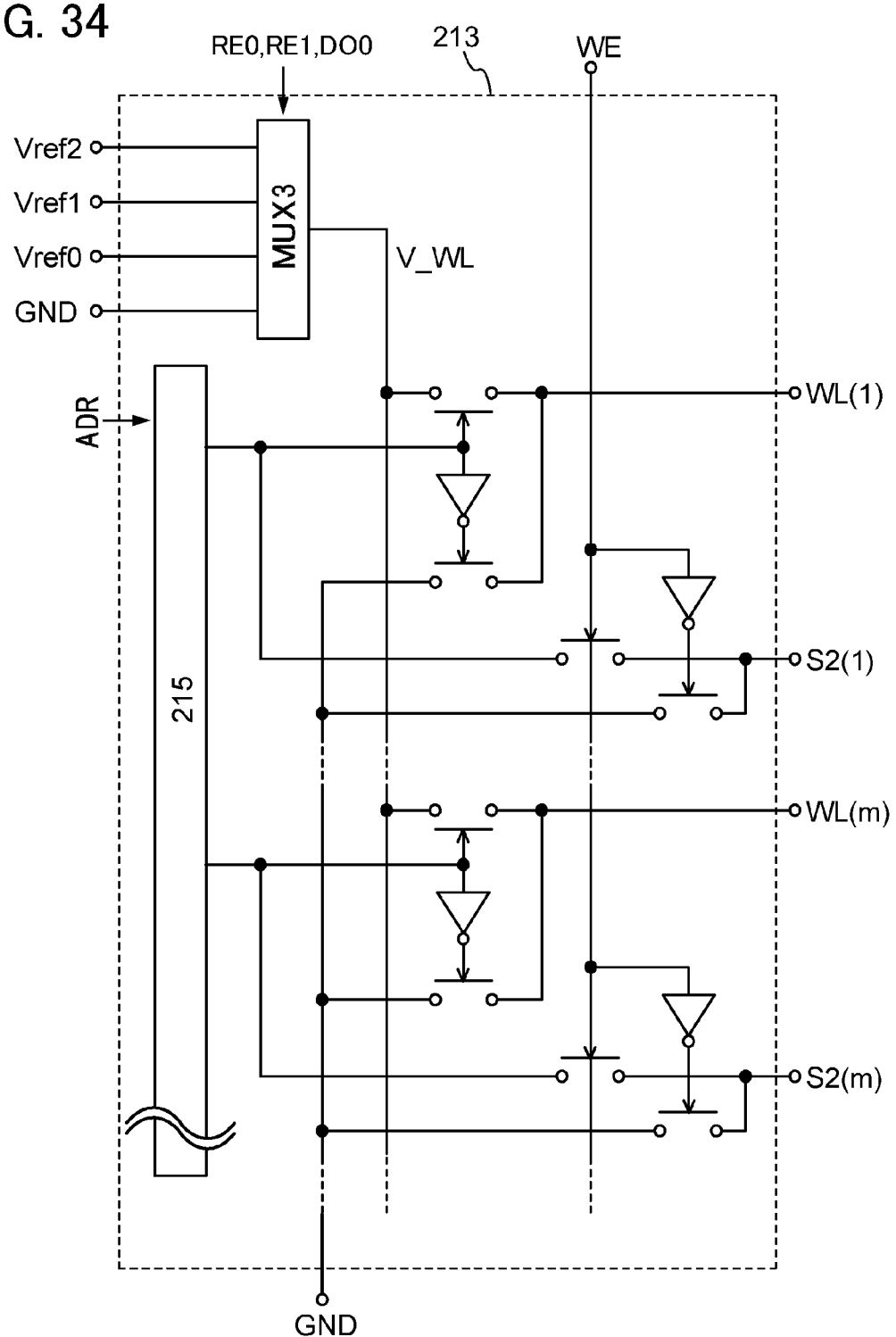
FIG. 34 is a circuit diagram for describing a driver circuit.

FIG. 34 illustrates the driver circuit 223 for the second signal lines S2 and the word lines WL, as another example.

In the driver circuit 223 for the second signal lines and the word lines illustrated in FIG. 34, when an address signal ADR is input, rows specified by the address (a selected row) are asserted, and the other rows (non-selected rows) are de-asserted. The second signal line S2 is connected to a decoder output when a WE signal is asserted, and connected to GND when the WE signal is de-asserted. The word line WL in the selected row is connected to the output $V_{\_WL}$ of a multiplexer (MUX3) and the word line WL in the non-selected row is connected to GND. The multiplexer (MUX3) selects any of the three values of reference potentials $V_{ref0}$, $V_{ref1}$, and $V_{ref2}$, and GND in response to the values of the signals RE0, RE1, and DO0. The behavior of the multiplexer (MUX3) is shown in Table 4.

TABLE 4

| RE0 | RE1 | DO[1] | VwL |
|---|---|---|---|
| 0 | 0 | * | Corresponds to GND |
| 1 | 0 | * | Corresponds to Vref1 |
| 0 | 1 | 0 | Corresponds to Vref0 |
| 0 | 1 | 1 | Corresponds to Vref2 |

The three values of reference potentials $V_{ref0}$, $V_{ref1}$, and $V_{ref2}$ ($V_{ref0} < V_{ref1} < V_{ref2}$) are described. In the case where $V_{ref0}$ is selected as the potential of the word line WL, a potential with which the transistor 201 of the memory cell of the data "00b" is turned off and the transistor 201 of the memory cell of the data "01b" is turned on is selected as $V_{ref0}$. In addition, in the case where $V_{ref1}$ is selected as the potential of the word line WL, a potential with which the transistor 201 of the memory cell of the data "01b" is turned off and the transistor 201 of the memory cell of the data "10b" is turned on is selected as $V_{ref1}$. In addition, in the case where $V_{ref2}$ is selected as the potential of the word line WL, a potential with which the transistor 201 of the memory cell of the data "10b" is turned off and the transistor 201 of the memory cell of the data "11b" is turned on is selected as $V_{ref2}$.

In the reading circuit, reading is performed by the two comparisons. A first comparison is performed using $V_{ref1}$. A second comparison is performed using $V_{ref2}$ when the value of the flip-flop FF0 is "0" which results from comparison with the use of $V_{ref1}$, or using $V_{ref0}$ when the value of the flip-flop FF0 is "1" which results from comparison with the use of $V_{ref1}$. In the above manner, the four states can be read out by the two comparisons.

Figure 35:
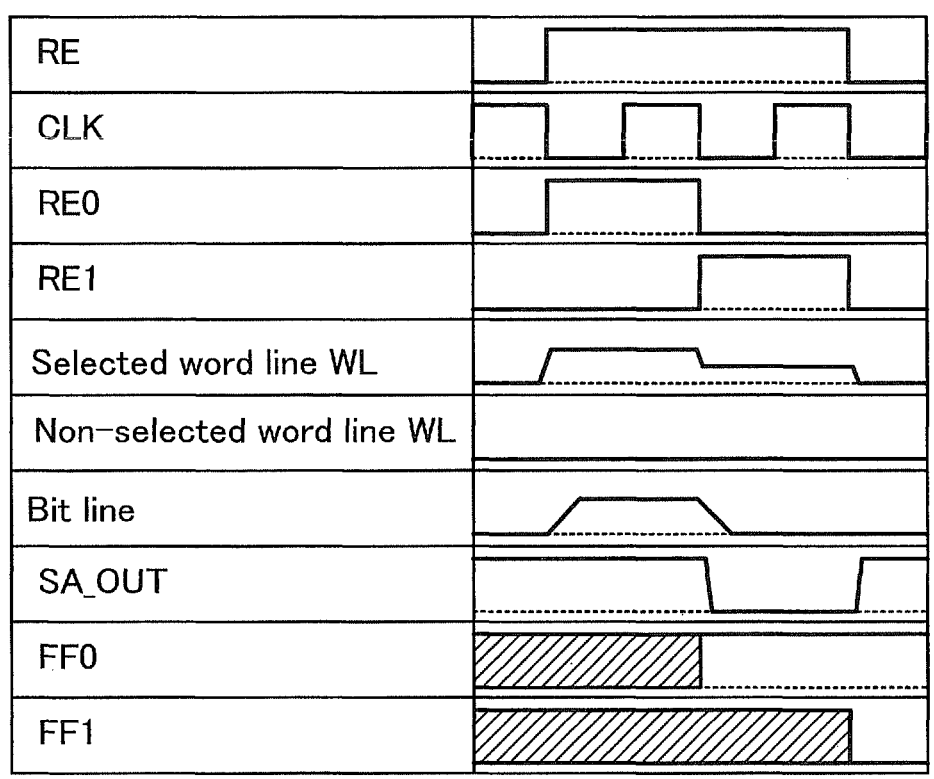
FIG. 35 is a timing chart for explaining an operation.

A timing chart of writing operation is the same as FIG. 25A. An example of a timing chart of reading operation is shown in FIG. 35. FIG. 35 shows a timing chart in the case where the data "10b" is read out from the memory cell. $V_{ref1}$ and $V_{ref2}$ are input to the selected respective word lines WL, and the comparison result in the sense amplifier circuit is stored in the flip-flop circuits FF0 and FF1 in respective terms in which the signals RE0 and RE1 are asserted. In the case of the data of the memory cell is "10b", the values of the flip-flop circuits FF0 and FF1 are "1" and "0". Note that the first signal line S1 and the second signal line S2 have 0 [V].

Figure 36:
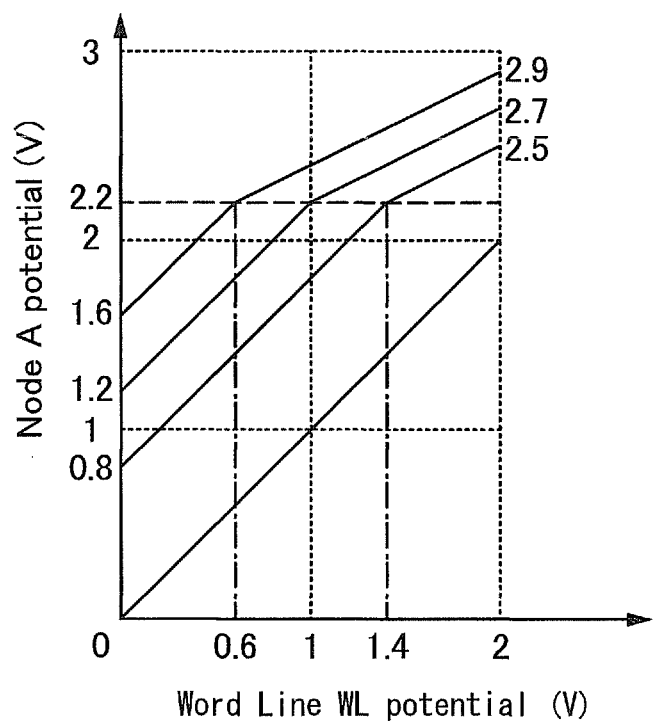
FIG. 36 is a graph illustrating a relation between a potential of a node A and a potential of a word line.

Examples of specific operation potentials (voltages) are described. For example, the threshold voltage $V_{th}$ of the transistor 201 is 2.2 V. The potential of the node A depends on capacitance C1 between the word line WL and the node A and gate capacitance C2 of the transistor 202, and here, for example, $C1/C2 \gg 1$ when the transistor 202 is in an off state, and $C1/C2=1$ when the transistor 202 is in an on state. FIG. 36 shows a relationship between the potential of the node A and the potential of the word line WL in the case where the source line SL has 0 [V]. From FIG. 36, it is found that the reference potentials $V_{ref0}$, $V_{ref1}$, and $V_{ref2}$ are preferably 0.6 V, 1.0 V, and 1.4 V, respectively in the case where when writing is performed, the potential of the node A of the data "00b" is 0V, that of the data "01b" is 0.8 V, that of the data "10b" is 1.2 V, and that of the data "11b" is 1.6 V.

Note that the potential of the node A of the transistor 201 after the writing (the potential of the word line WL is 0 [V]) is preferably lower than or equal to the threshold voltage of the transistor 201.

Although, the first signal line S1 is arranged in the bit line BL direction (the column direction) and the second signal line S2 is arranged in the word line WL direction (the row direction) in this embodiment, one embodiment of the present invention is not limited thereto. For example, the first signal line S1 may be arranged in the word line WL direction (the row direction) and the second signal line S2 may be arranged in the bit line BL direction (the column direction). In such a case, the driver circuit to which the first signal line S1 is connected and the driver circuit to which the second signal line S2 is connected may be arranged as appropriate.

In this embodiment, operation of four-valued memory cells, i.e., writing any of four different states to one memory cell or reading any of four different states from one memory cell is described. By appropriately changing the circuit configuration, operation of n-valued memory cells, i.e., writing any of n different states (n is an integer greater than or equal to 2) to one memory cell or reading any of n different states from one memory cell, can be performed.

For example, in eight-valued memory cells, storage capacity becomes three times as large as that of two valued memory cells. When writing data, eight values of potentials are set up to decide a potential of a node A, each value corresponding to one of eight states. When reading data, seven reference potentials enabling to distinguish the eight states are set up. One sense amplifier is provided and comparison is performed seven times, so that data can be read. Further, the number of comparison times may be reduced to three times by feeding back the result of comparison. In a reading method for driving the source line SL, data can be read in one comparison by providing seven sense amplifiers. Furthermore, a plurality of sense amplifiers can be provided and comparison can be performed plural times.

Generally, in $2^k$-valued memory cells (k is an integer greater than or equal to 1), memory capacity is k times as large as that of two-valued memory cells. When writing data, $2^k$ values of writing potentials to decide a potential of a node A are set up, each value corresponding to one of $2^k$ states. When reading data, $2^k-1$ values of reference potentials enabling to distinguish $2^k$ states may be set up. One sense amplifier is provided and comparison is performed $2^k-1$ times, so that data can be read. Further, the number of comparison times may be reduced to k times by feeding back the result of comparison. In a reading method for driving the source line SL, data can be read in one comparison by providing a $2^k-1$ number of sense amplifiers. Furthermore, a plurality of sense amplifiers can be provided and comparison can be performed plural times.

The semiconductor device according to this embodiment can store information for a relatively long time because of low off-state current characteristics of the transistor 202. That is, refresh operation which is necessary in DRAM and the like is not needed, so that power consumption can be reduced. In addition, the semiconductor device of this embodiment can be used as a substantial nonvolatile memory device.

Since writing information and the like are performed by switching operation of the transistor 202, high voltage is not needed and there is no problem of deterioration of elements. Further, high-speed operation can be easily realized because writing information and erasing information are performed by turning transistors on or off. Furthermore, information can be directly rewritten by controlling potentials input to transistors. Accordingly, erasing operation which is necessary in flash memory and the like is not needed, and decrease in operation speed due to erasing operation can be prevented.

Further, the transistor formed using a material other than an oxide semiconductor can be operated at sufficient high speed; therefore, by using the transistor, stored contents can be read out at high speed.

The semiconductor device according to this embodiment is a multivalued semiconductor device, so that storage capacity per area can be increased. Therefore, the size of the semiconductor device can be reduced and the semiconductor device can be highly integrated. Additionally, potentials of node which takes a floating state when writing operation is performed can be directly controlled; thus, threshold voltages of the semiconductor device can be easily controlled with high accuracy which is required for a multivalued memory. Therefore, verification of states after writing data which is necessary to a multivalued-type memory can be omitted, and in such a case, time required for writing data can be shortened.

Embodiment 5

In this embodiment, examples of an electronic appliance in which the semiconductor device obtained according to any of the above embodiments is mounted are described with reference to FIGS. 37A to 37F. The semiconductor device obtained according to any of the above embodiments can store information even without supply of power. Degradation due to writing and erasing is not caused. Moreover, operation speed thereof is high. Thus, with the use of the semiconductor device, an electronic appliance having a new structure can be provided. Note that the semiconductor device according to any of the above embodiments is integrated and mounted on a circuit board or the like to be mounted on an electronic appliance.

Figure 37A:
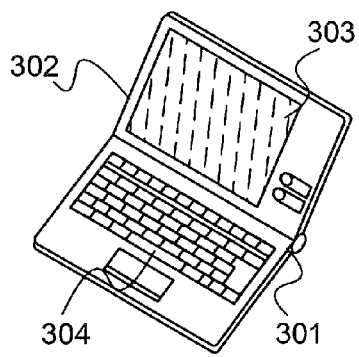
FIGS. 37A to 37F are diagrams each describing an electronic appliance.

FIG. 37A illustrates a laptop personal computer which includes the semiconductor device according to any of the above embodiments and includes a main body 301, a housing 302, a display portion 303, a keyboard 304, and the like. When the semiconductor device according to one embodiment of the present invention is applied to the laptop personal computer, information can be stored even without supply of power. In addition, degradation due to writing and erasing is not caused. In addition, operation speed thereof is high. Thus, it is preferable that the semiconductor device according to one embodiment of the present invention be applied to the laptop personal computer.

Figure 37B:
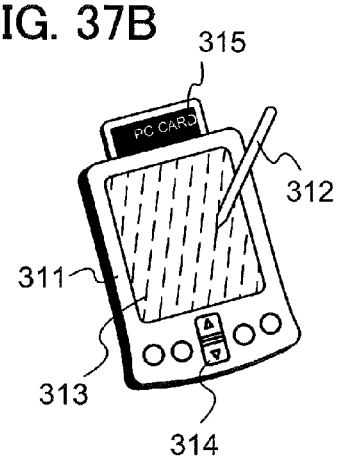

FIG. 37B illustrates a portable information terminal (PDA) which includes the semiconductor device according to any of the above embodiments and is provided with a main body 311 including a display portion 313, an external interface 315, an operation button 314, and the like. In addition, a stylus 312 is included as an accessory for operation. When the semiconductor device according to one embodiment of the present invention is applied to the PDA, information can be stored even without supply of power. In addition, degradation due to writing and erasing is not caused. In addition, operation speed thereof is high. Thus, it is preferable that the semiconductor device according to one embodiment of the present invention be applied to the PDA.

Figure 37C:
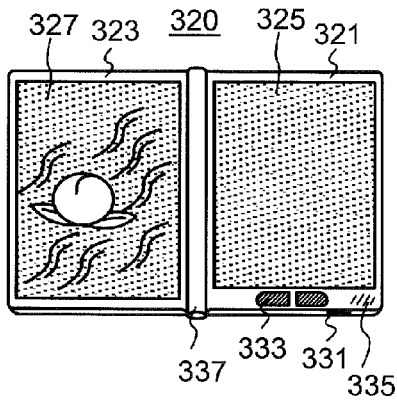

FIG. 37C illustrates an e-book reader 320 as an example of electronic paper including the semiconductor device according to any of the above embodiments. The e-book reader 320 includes two housings, a housing 321 and a housing 323. The housing 321 and the housing 323 are combined with a hinge 337 so that the e-book reader 320 can be opened and closed with the hinge 337 as an axis. With such a structure, the e-book reader 320 can be used like a paper book. When the semiconductor device according to one embodiment of the present invention is applied to the electronic paper, information can be stored even without supply of power. In addition, degradation due to writing and erasing is not caused. In addition, operation speed thereof is high. Thus, it is preferable that the semiconductor device according to one embodiment of the present invention be applied to the electronic paper.

A display portion 325 is incorporated in the housing 321 and a display portion 327 is incorporated in the housing 323. The display portion 325 and the display portion 327 may display one image, or may display different images. When the display portions 325 and 327 display different images, for example, a display portion on the right side (the display portion 325 in FIG. 37C) can display text and a display portion on the left side (the display portion 327 in FIG. 37C) can display graphics.

FIG. 37C illustrates an example in which the housing 321 is provided with an operation portion and the like. For example, the housing 321 is provided with a power button 331, operation keys 333, a speaker 335, and the like. Pages can be turned with the operation keys 333. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the e-book reader 320 may have a function of an electronic dictionary.

The e-book reader 320 may be configured to transmit and receive information wirelessly. Through wireless communication, desired book data or the like can be purchased and downloaded from an e-book server.

Note that the electronic paper can be applied to an electronic appliance in any field which can display information. For example, the electronic paper can be used for posters, advertisements in vehicles such as trains, display in a variety of cards such as credit cards, and the like in addition to e-book readers.

Figure 37D:
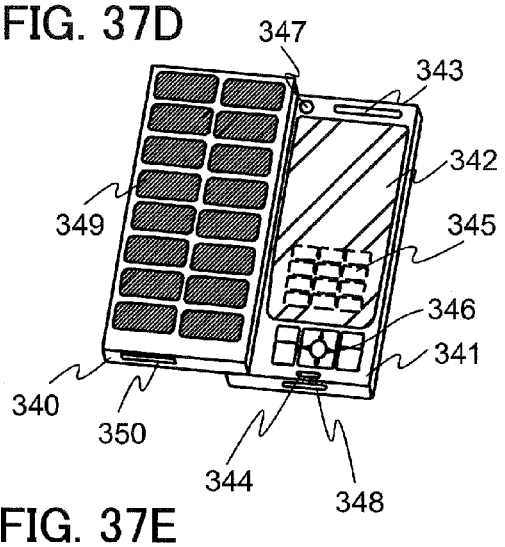

FIG. 37D illustrates a mobile phone including the semiconductor device according to any of the above embodiments. The mobile phone includes two housings, the housing 340 and the housing 341. The housing 341 includes a display panel 342, a speaker 343, a microphone 344, a pointing device 346, a camera lens 347, an external connection terminal 348, and the like. The housing 341 includes a solar cell 349 for charging the mobile phone, an external memory slot 350, and the like. In addition, an antenna is incorporated in the housing 341. When the semiconductor device according to one embodiment of the present invention is applied to the mobile phone, information can be stored even without supply of power. In addition, degradation due to writing and erasing is not caused. In addition, operation speed thereof is high. Thus, it is preferable that the semiconductor device according to one embodiment of the present invention be applied to the mobile phone.

The display panel 342 is provided with a touch panel function. A plurality of operation keys 345 which is displayed as images is illustrated by dashed lines in FIG. 37D. Note that the mobile phone includes a boosting circuit for raising a voltage output from the solar cell 349 to a voltage which is necessary for each circuit. Further, in addition to the above structure, a structure in which a noncontact IC chip, a small recording device, or the like is incorporated may be employed.

A display direction of the display panel 342 is appropriately changed in accordance with the usage mode. Further, the camera lens 347 is provided on the same surface as the display panel 342; thus, it can be used as a video phone. The speaker 343 and the microphone 344 can be used for videophone, recording, playback, and the like without being limited to verbal communication. Moreover, the housings 340 and 341 in a state where they are developed as illustrated in FIG. 37D can be slid so that one is lapped over the other; therefore, the size of the mobile phone can be reduced, which makes the mobile phone suitable for being carried.

The external connection terminal 348 can be connected to various kinds of cables such as an AC adapter or a USB cable, which enables charging and data communication. Moreover, by inserting a recording medium into the external memory slot 350, the mobile phone can deal with storing and moving a large capacity of data. Further, in addition to the above functions, an infrared communication function, a television reception function, and the like may be provided.

Figure 37E:
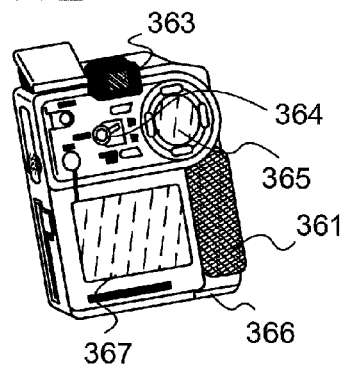

FIG. 37E illustrates a digital camera including the semiconductor device according to any of the above embodiments. The digital camera includes a main body 361, a display portion (A) 367, an eyepiece portion 363, an operation switch 364, a display portion (B) 365, a battery 366, and the like. When the semiconductor device according to one embodiment of the present invention is applied to the digital camera, information can be stored even without supply of power. In addition, degradation due to writing and erasing is not caused. In addition, operation speed thereof is high. Thus, it is preferable that the semiconductor device according to one embodiment of the present invention be applied to the digital camera.

Figure 37F:
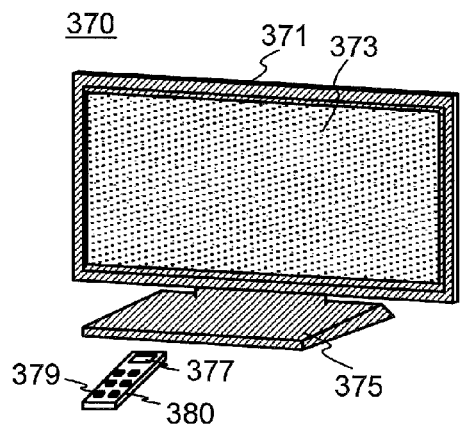

FIG. 37F illustrates a television set including the semiconductor device according to any of the above embodiments. In the television set 370, a display portion 373 is incorporated in a housing 371. The display portion 373 can display an image. Here, the housing 371 is supported by a stand 375.

The television set 370 can be operated by an operation switch of the housing 371 or a separate remote controller 380. Channels and volume can be controlled by an operation key 379 of the remote controller 380 so that an image displayed on the display portion 373 can be controlled. Furthermore, the remote controller 380 may be provided with a display portion 377 for displaying information output from the remote controller 380. When the semiconductor device according to one embodiment of the present invention is applied to the television set, information can be stored even without supply of power. In addition, degradation due to writing and erasing is not caused. In addition, operation speed thereof is high. Thus, it is preferable that the semiconductor device according to one embodiment of the present invention be applied to the television set.

Note that the television set 370 is preferably provided with a receiver, a modem, and the like. With the receiver, a general television broadcast can be received. Furthermore, when the television set 370 is connected to a communication network by wired or wireless connection through the modem, one-way (from a transmitter to a receiver) or two-way (between a transmitter and a receiver, between receivers, or the like) information communication can be performed.

The methods and structures described in this embodiment can be combined as appropriate with any of the methods and structures described in the other embodiments.

This application is based on Japanese Patent Application serial no. 2009-264623 filed with Japan Patent Office on Nov. 20, 2009, the entire contents of which are hereby incorporated by reference.

The invention claimed is:

1. A semiconductor device comprising:
   a substrate;
   first to fourth insulating layers stacked in this order over the substrate; and
   a first transistor, the first transistor comprising:
      a first channel formation region including an oxide semiconductor layer between the second and the third insulating layers;
      a first conductive layer over the third insulating layer and overlapping with the first channel formation region; and
      third and fourth conductive layers on and in direct contact with the oxide semiconductor layer and below the third insulating layer;
   wherein the first and the fourth insulating layers each comprise aluminum and oxygen; and
   wherein the second and the third insulating layers each comprise oxygen.

2. The semiconductor device according to claim 1,
   wherein the second and the third insulating layers are in direct contact with the oxide semiconductor layer.

3. The semiconductor device according to claim 1,
   wherein the fourth insulating layer is in direct contact with the first conductive layer.

4. The semiconductor device according to claim 1,
   wherein the fourth insulating layer is on and in direct contact with a top surface of the first conductive layer.

5. The semiconductor device according to claim 1,
   wherein the substrate is a semiconductor substrate.

6. The semiconductor device according to claim 1,
   wherein there is direct contact between at least the first and the second insulating layers, between the second and the third insulating layers, or between the third and the fourth insulating layers.

7. The semiconductor device according to claim 1, wherein the oxide semiconductor layer is formed from an In—Ga—Zn—O-based oxide semiconductor material.

8. A memory element comprising the semiconductor device according to claim 1.

9. An electronic appliance comprising the semiconductor device according to claim 1.

10. A semiconductor device comprising:
    a substrate;
    a second transistor comprising:
       a second channel formation region including a non-oxide semiconductor layer;
       a second conductive layer overlapping with the second channel formation region; and
       a fifth insulating layer between the non-oxide semiconductor layer and the second conductive layer;
    first to fourth insulating layers stacked in this order over the second channel formation region and over the second conductive layer; and
    a first transistor, the first transistor comprising:
       a first channel formation region including an oxide semiconductor layer between the second and the third insulating layers;
       a first conductive layer over the third insulating layer and overlapping with the first channel formation region; and
       third and fourth conductive layers on and in direct contact with the oxide semiconductor layer and below the third insulating layer;
    wherein the first and the fourth insulating layers each comprise aluminum and oxygen; and
    wherein the second and the third insulating layers each comprise oxygen and are in direct contact with the oxide semiconductor layer.

11. The semiconductor device according to claim 10,
    wherein the third insulating layer is in direct contact with the first conductive layer.

12. The semiconductor device according to claim 10,
    wherein the fourth insulating layer is in direct contact with the first conductive layer.

13. The semiconductor device according to claim 10,
    wherein the fourth insulating layer is on and in direct contact with a top surface of the first conductive layer.

14. The semiconductor device according to claim 10,
    wherein the oxide semiconductor layer is electrically connected to the second conductive layer via one of the third and the fourth conductive layers.

15. The semiconductor device according to claim 10, the first transistor further comprising:
    a fifth conductive layer over the fourth insulating layer,
    wherein the oxide semiconductor layer is electrically connected to the second conductive layer via the fifth conductive layer and one of the third and the fourth conductive layers.

16. The semiconductor device according to claim 10,
    wherein the substrate is a semiconductor substrate, and
    wherein the non-oxide semiconductor layer is comprised in the semiconductor substrate.

17. The semiconductor device according to claim 10,
    wherein there is direct contact between at least the first and the second insulating layers, between the second and the third insulating layers, or between the third and the fourth insulating layers.

18. The semiconductor device according to claim 10, wherein the oxide semiconductor layer is formed from an In—Ga—Zn—O-based oxide semiconductor material.

19. A memory element comprising the semiconductor device according to claim 10.

20. An electronic appliance comprising the semiconductor device according to claim 10.

21. A semiconductor device comprising:
    a substrate;
    a second transistor comprising:
       a second channel formation region including a non-oxide semiconductor layer;
       a second conductive layer overlapping with the second channel formation region; and
       a fifth insulating layer between the non-oxide semiconductor layer and the second conductive layer;

first to fourth insulating layers stacked in this order over the second channel formation region and over the second conductive layer; and a first transistor, the first transistor comprising:
- a first channel formation region including an oxide semiconductor layer between the second and the third insulating layers;
- a first conductive layer over the third insulating layer and overlapping with the first channel formation region; and
- third and fourth conductive layers on and in direct contact with the oxide semiconductor layer and below the third insulating layer;

wherein the first and the fourth insulating layers each comprise aluminum and oxygen; and wherein the second and the third insulating layers each comprise silicon and oxygen.

22. The semiconductor device according to claim 21, wherein the second and the third insulating layers are in direct contact with the oxide semiconductor layer.

23. The semiconductor device according to claim 21, wherein the fourth insulating layer is in direct contact with the first conductive layer.

24. The semiconductor device according to claim 21, wherein the fourth insulating layer is on and in direct contact with a top surface of the first conductive layer.

25. The semiconductor device according to claim 21, wherein the oxide semiconductor layer is electrically connected to the second conductive layer via one of the third and the fourth conductive layers.

26. The semiconductor device according to claim 21, the first transistor further comprising:
- a fifth conductive layer over the fourth insulating layer,
wherein the oxide semiconductor layer is electrically connected to the second conductive layer via the fifth conductive layer and one of the third and the fourth conductive layers.

27. The semiconductor device according to claim 21, wherein the substrate is a semiconductor substrate, and wherein the non-oxide semiconductor layer is comprised in the semiconductor substrate.

28. The semiconductor device according to claim 21, wherein there is direct contact between at least the first and the second insulating layers, between the second and the third insulating layers, or between the third and the fourth insulating layers.

29. The semiconductor device according to claim 21, wherein the oxide semiconductor layer is formed from an In—Ga—Zn—O-based oxide semiconductor material.

30. A memory element comprising the semiconductor device according to claim 21.

31. An electronic appliance comprising the semiconductor device according to claim 21.

* * * * *